(12) United States Patent
Yamazaki et al.

(10) Patent No.: US 6,906,344 B2
(45) Date of Patent: Jun. 14, 2005

(54) THIN FILM TRANSISTOR WITH PLURAL CHANNELS AND CORRESPONDING PLURAL OVERLAPPING ELECTRODES

(75) Inventors: Shunpei Yamazaki, Kanagawa (JP); Mai Osada, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 127 days.

(21) Appl. No.: 10/152,996

(22) Filed: May 23, 2002

(65) Prior Publication Data

US 2003/0015703 A1 Jan. 23, 2003

(30) Foreign Application Priority Data

May 24, 2001 (JP) ........................................ 2001-156178

(51) Int. Cl.[7] .......................................... H01L 29/786
(52) U.S. Cl. ..................... 257/66; 257/72; 257/E29.275
(58) Field of Search .......................... 257/66, 72, 365, 257/366, E29.275

(56) References Cited

U.S. PATENT DOCUMENTS

| | | | | |
|---|---|---|---|---|
| 5,580,802 A | * | 12/1996 | Mayer et al. | 438/157 |
| 5,834,797 A | * | 11/1998 | Yamanaka | 257/57 |
| 5,955,765 A | * | 9/1999 | Yamazaki et al. | 257/365 |
| 6,034,748 A | * | 3/2000 | Furuta | 349/43 |
| 6,252,248 B1 | | 6/2001 | Sano et al. | |
| 6,327,006 B1 | | 12/2001 | Sato et al. | |
| 6,504,593 B1 | * | 1/2003 | Noritake et al. | 349/139 |
| 6,534,788 B1 | * | 3/2003 | Yeo et al. | 257/72 |

FOREIGN PATENT DOCUMENTS

| | | | | |
|---|---|---|---|---|
| EP | 1081676 A1 | * | 3/2001 | G09G/3/36 |
| JP | 63-208896 A | | 8/1988 | |
| JP | 08-078329 A | | 3/1996 | |
| JP | 2666293 B2 | | 6/1997 | |
| JP | 2666293 B2 | | 10/1997 | |
| JP | 2737780 B2 | | 1/1998 | |
| JP | 2737780 B2 | | 4/1998 | |
| JP | 10-135468 A | | 5/1998 | |
| JP | 10-135469 A | | 5/1998 | |
| JP | 11-354802 A | | 12/1999 | |
| JP | 3141860 B2 | | 12/2000 | |
| JP | 3141860 B2 | | 3/2001 | |

* cited by examiner

Primary Examiner—Stephen W. Smoot
(74) Attorney, Agent, or Firm—Nixon Peabody LLP; Jeffrey L. Costellia

(57) ABSTRACT

An object of the present invention is to provide a technique for improving characteristics of a TFT and realizing the structure of the TFT optimal for driving conditions of a pixel section and a driving circuit, using a smaller number of photo masks. A semiconductor device has a semiconductor film, a first electrode, and a first insulating film sandwiched between the semiconductor film and the first electrode, and further has a second electrode, and a second insulating film sandwiched between the semiconductor film and the second electrode. The first electrode and the second electrode overlap with each other across a channel-formed region which the semiconductor film has. A constant voltage is applied to the first electrode at any time.

52 Claims, 31 Drawing Sheets

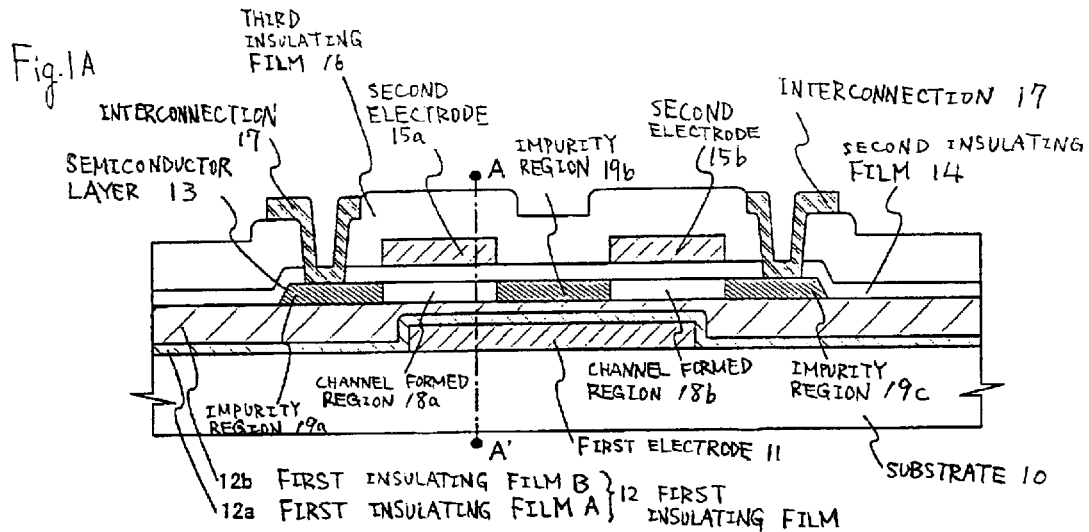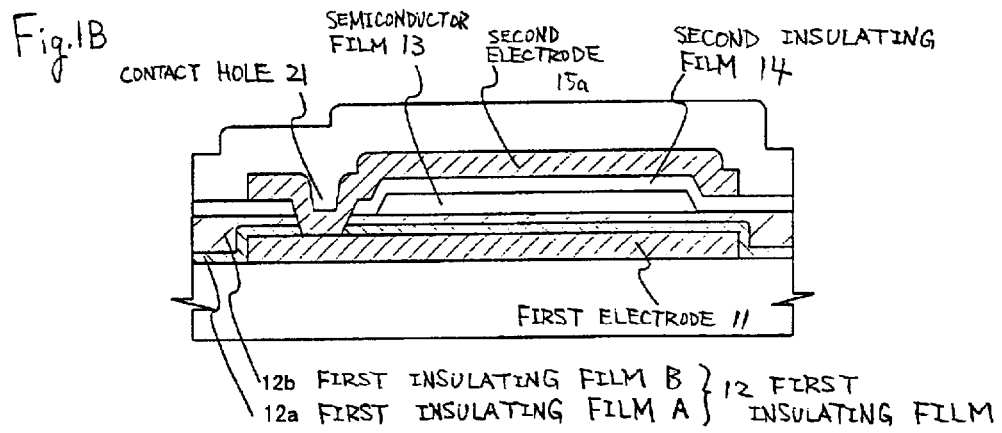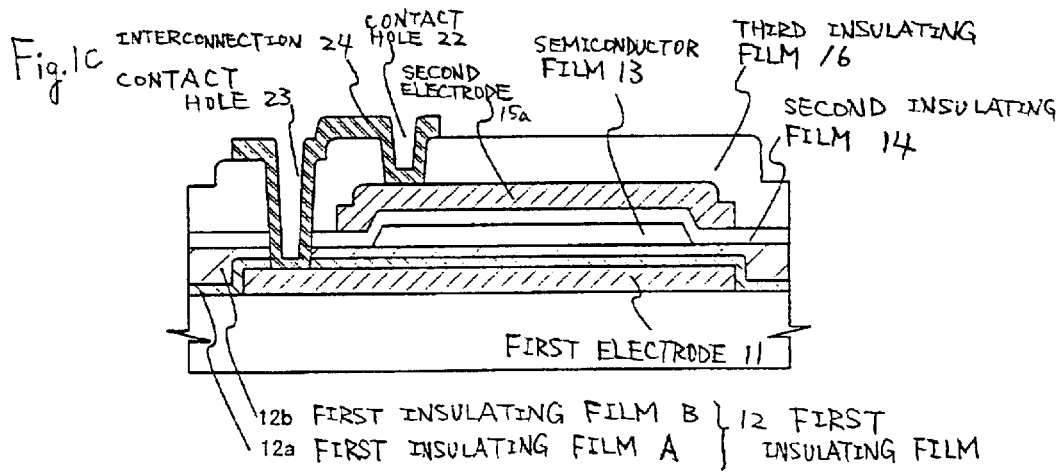

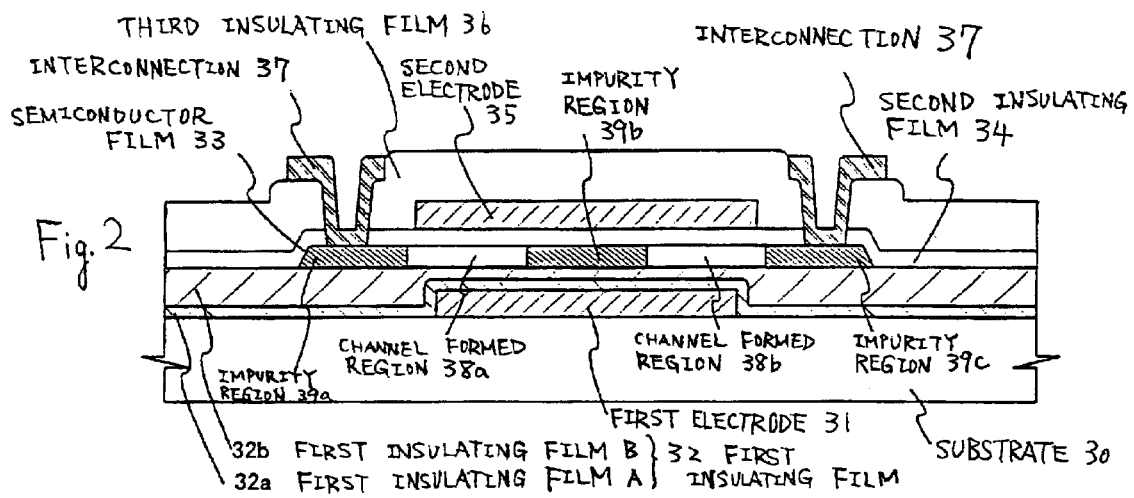

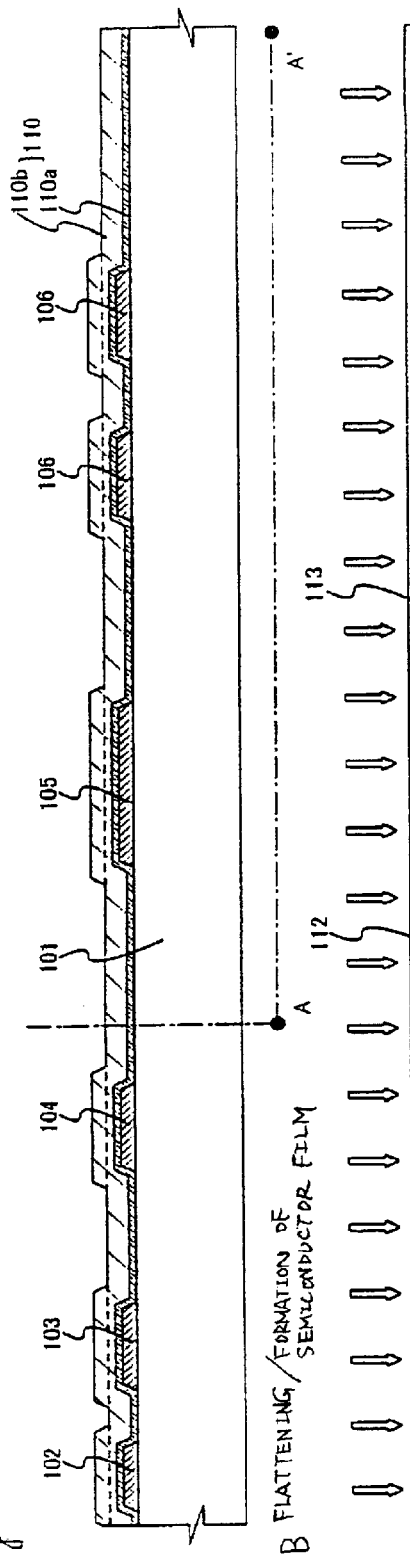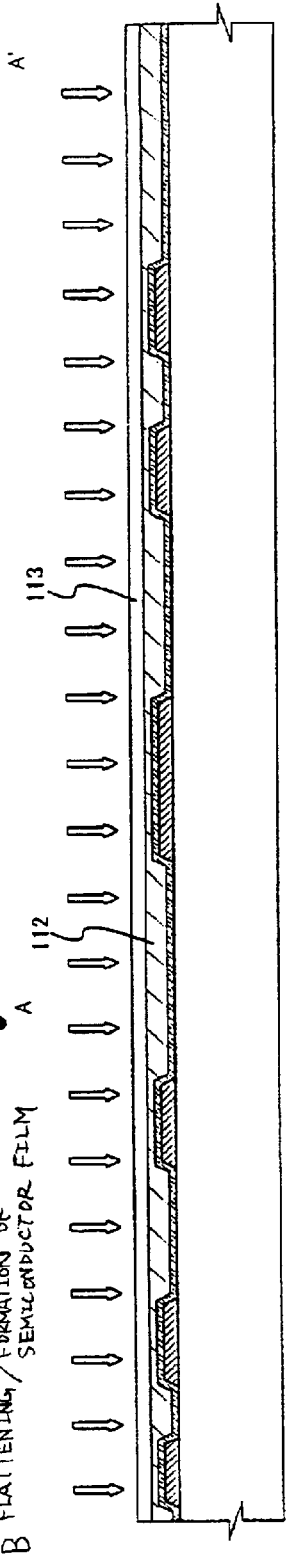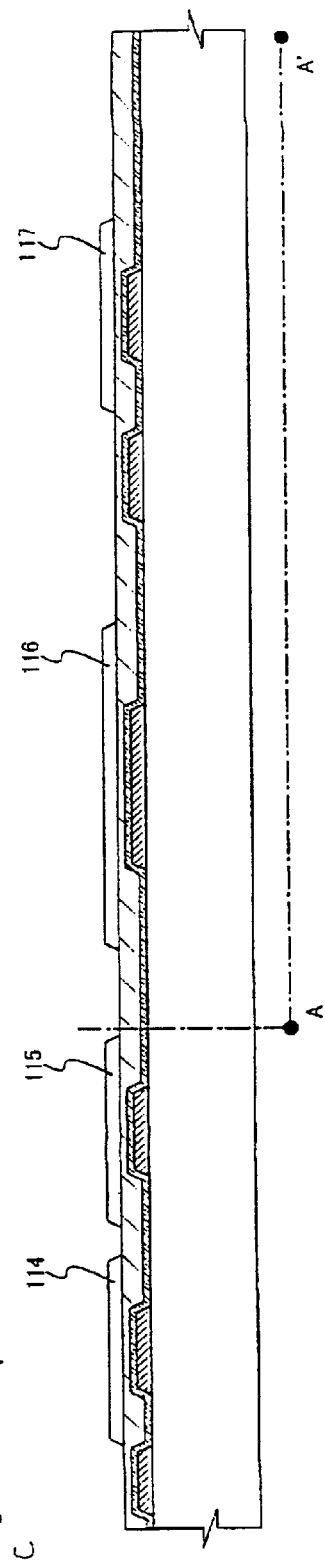

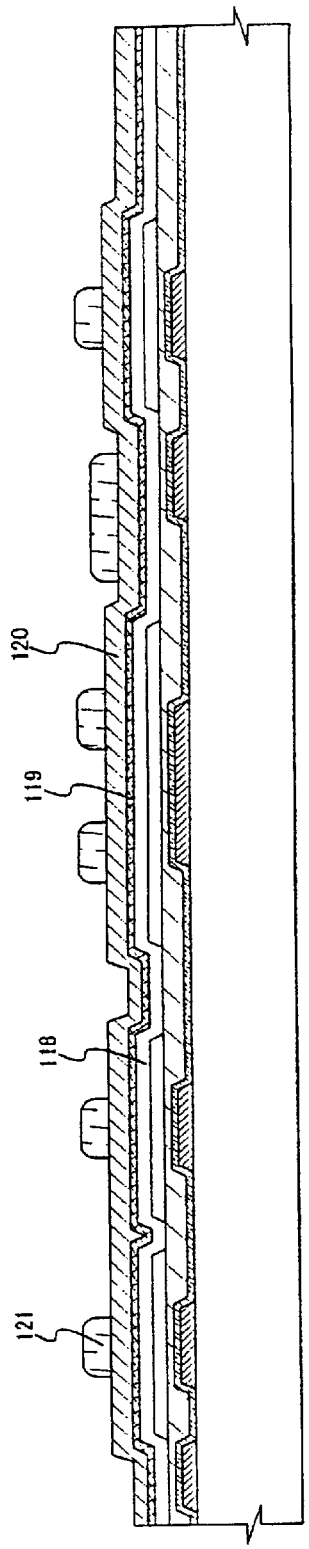
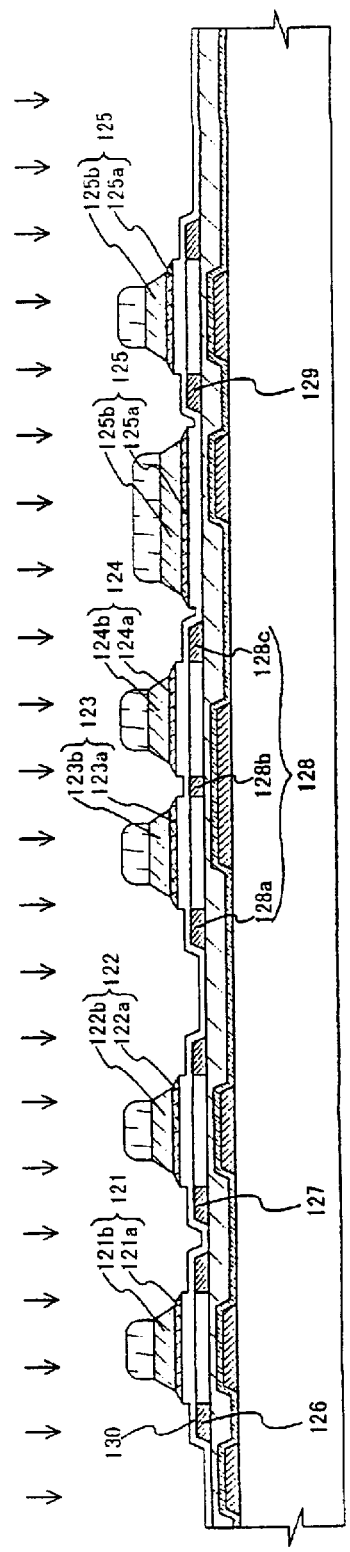
Fig. 4A FORMATION OF GATE INSULATING FILM / CONDUCTIVE FILM / SECOND WIRING PATTERN
Fig. 4B FIRST ETCHING TREATMENT / FIRST DOPING TREATMENT

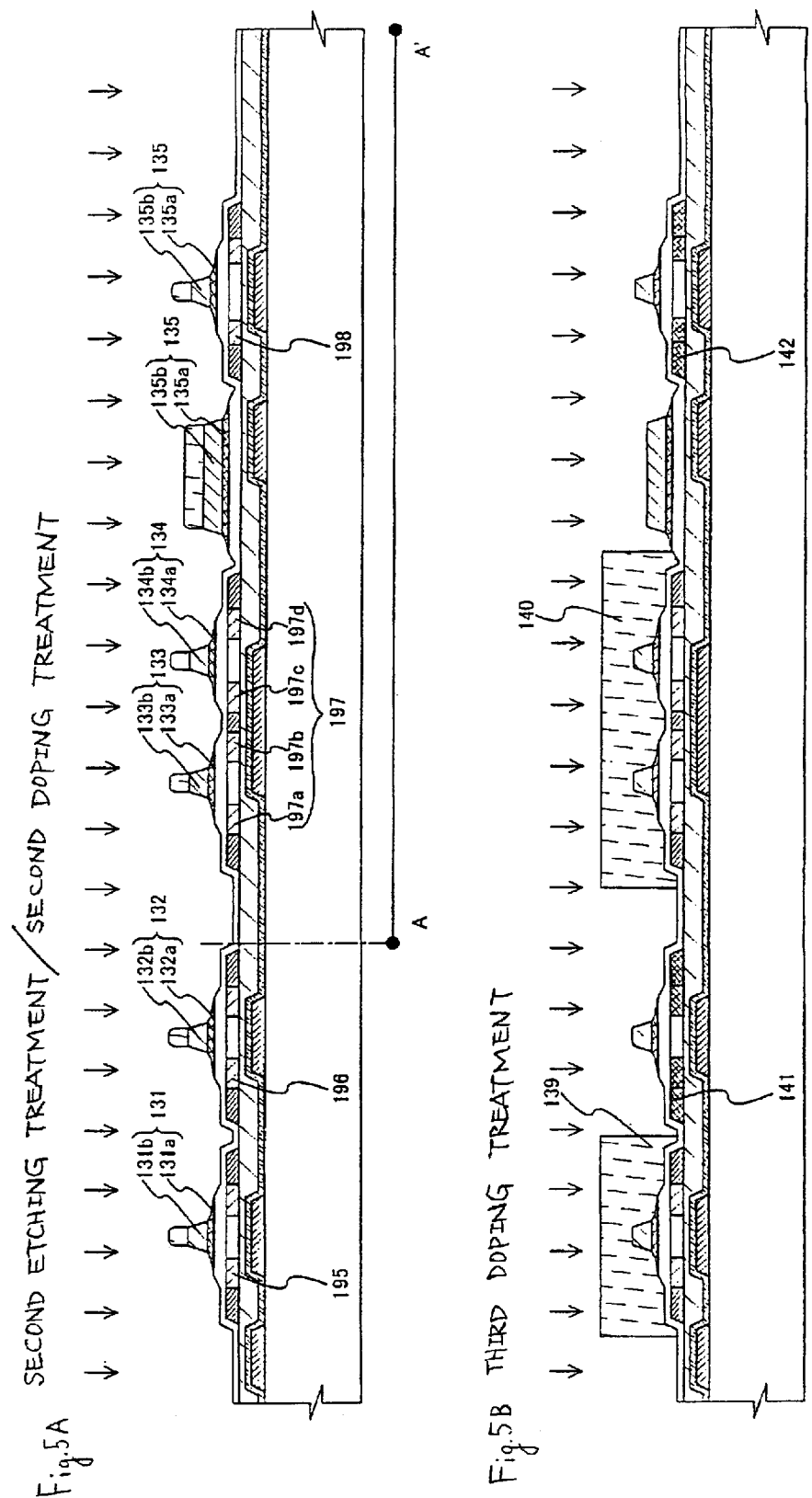

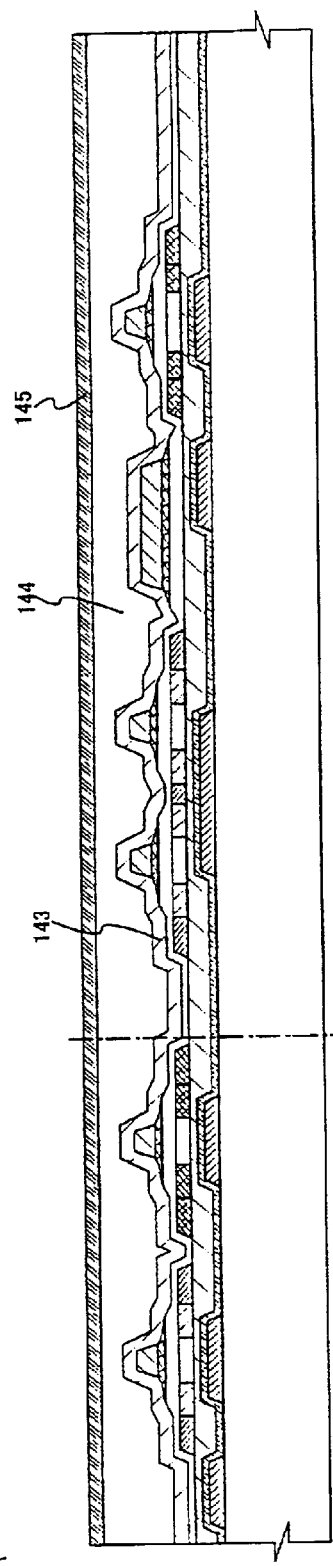
Fig. 6A FORMATION OF INTERLAYER INSULATING FILM / FORMATION OF TRANSPARENT CONDUCTIVE FILM
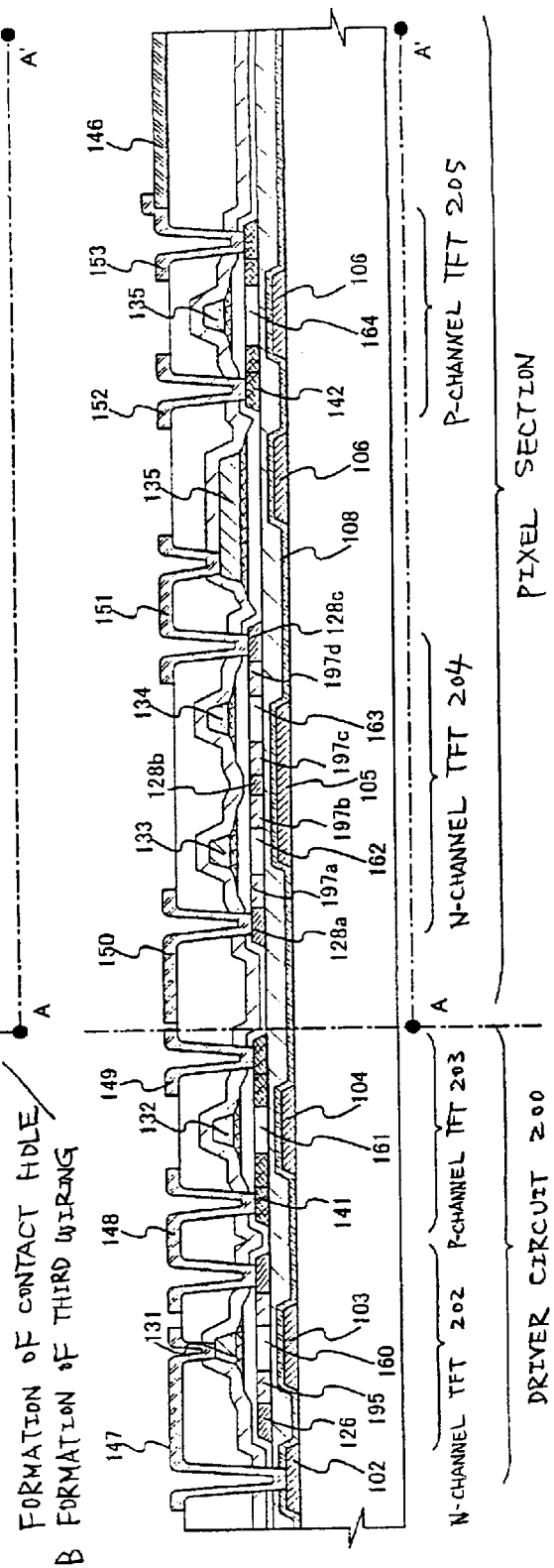
Fig. 6B FORMATION OF CONTACT HOLE / FORMATION OF THIRD WIRING

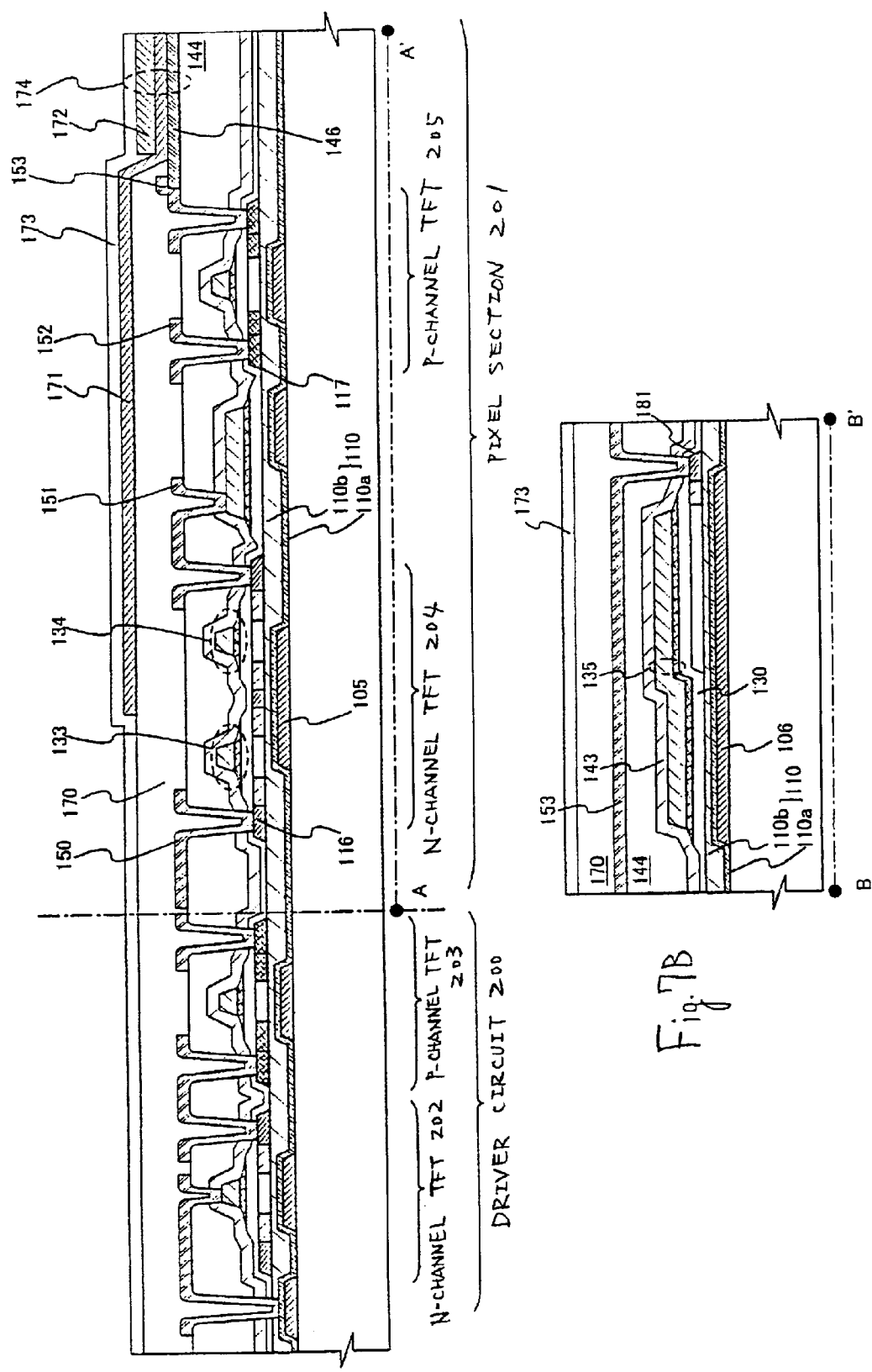

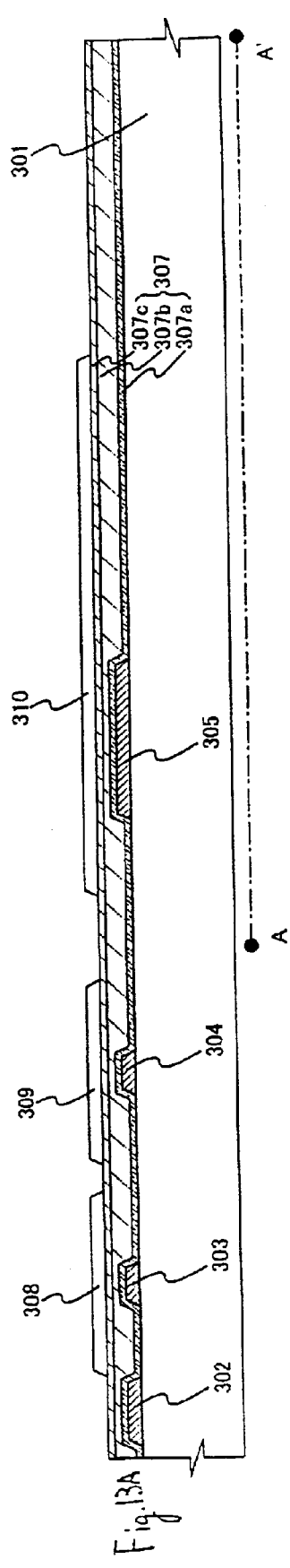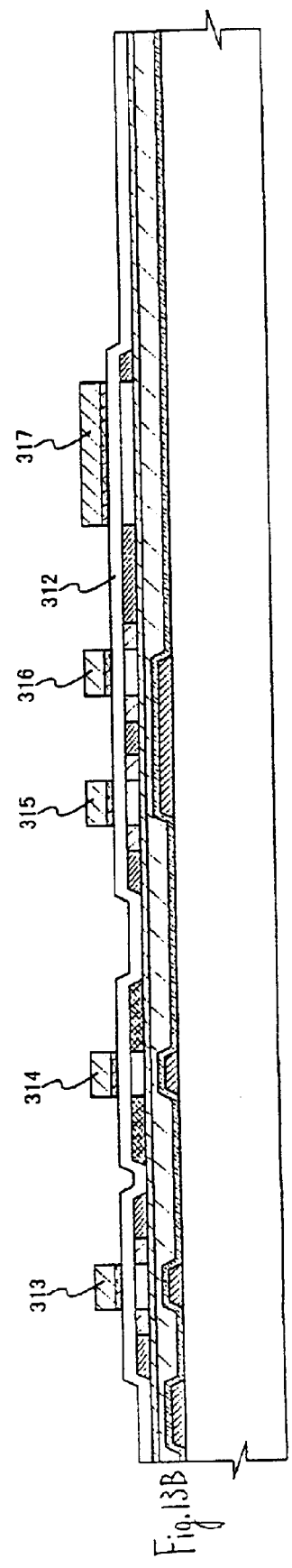
Fig.13A
Fig.13B

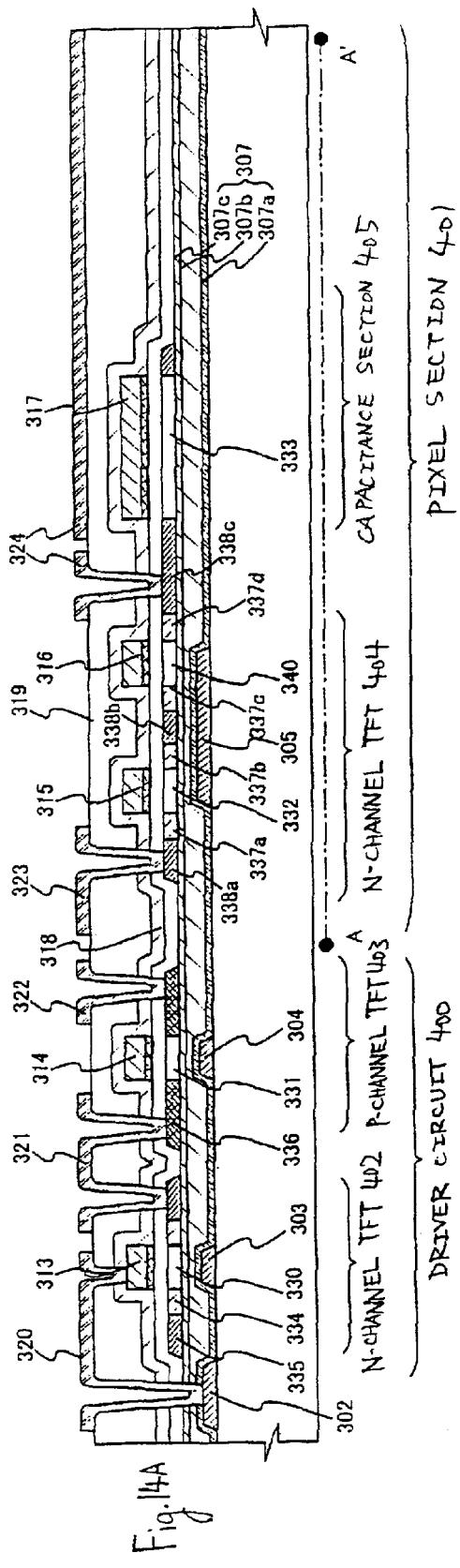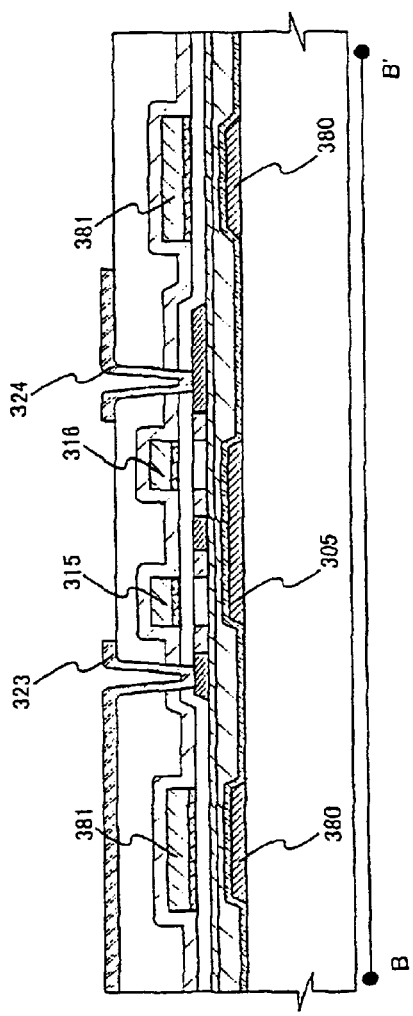
Fig. 14A
Fig. 14B

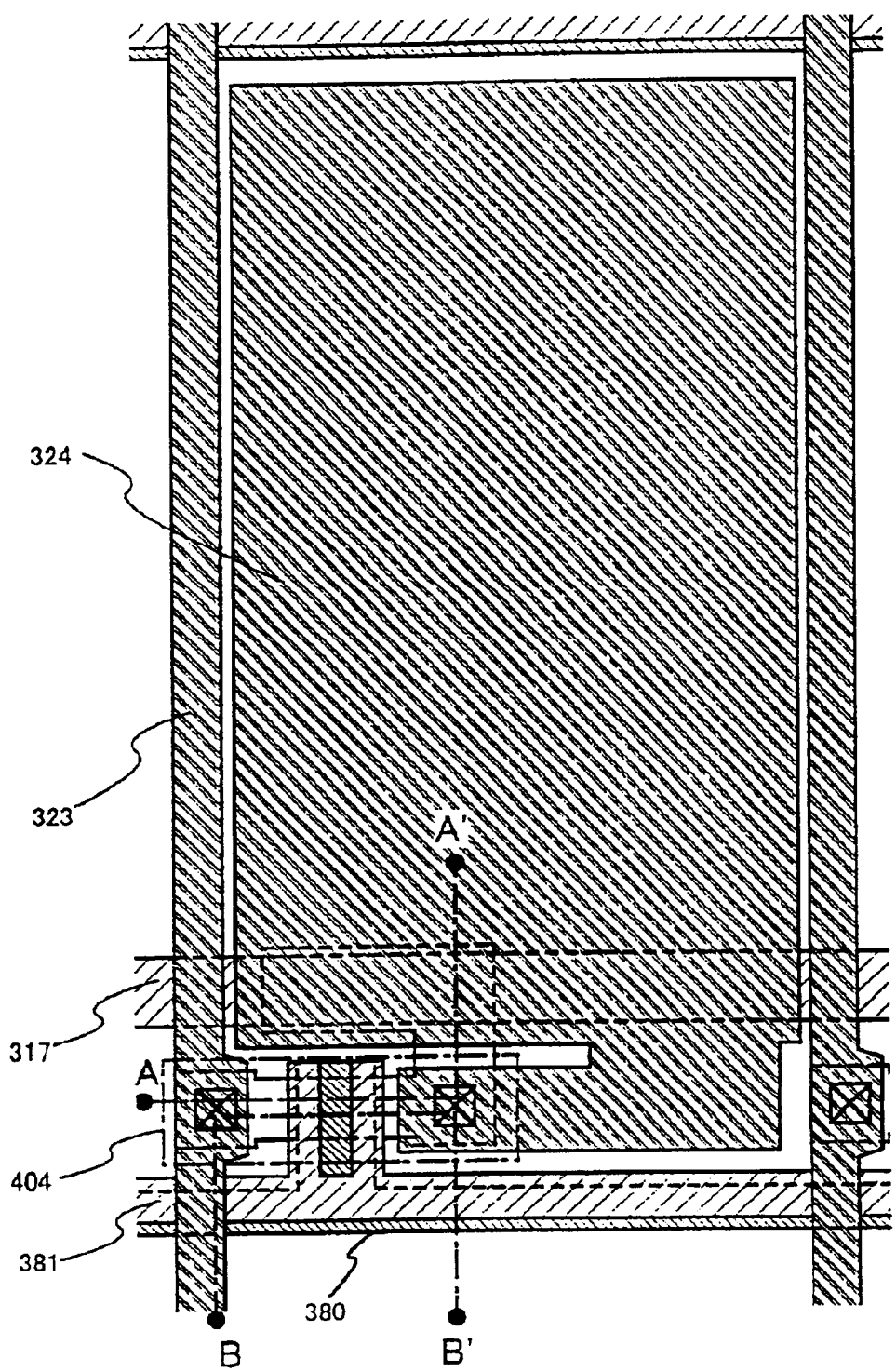

Fig. 18A FORMATION OF FIRST SEMICONDUCTOR FILM
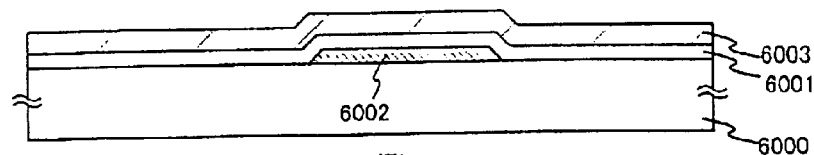
Fig. 18B ADDITION OF METAL ELEMENT
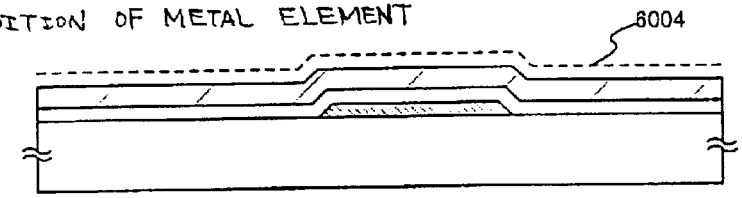
Fig. 18C HEAT TREATMENT
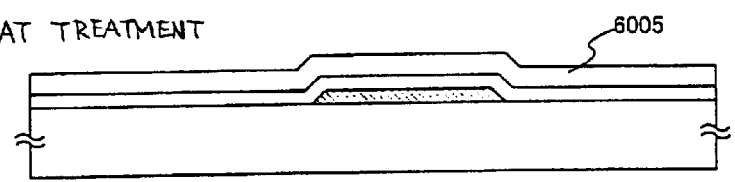
Fig. 18D IRRADIATION OF LASER LIGHT (IN ATMOSPHERE OR IN OXYGEN ATMOSPHERE)
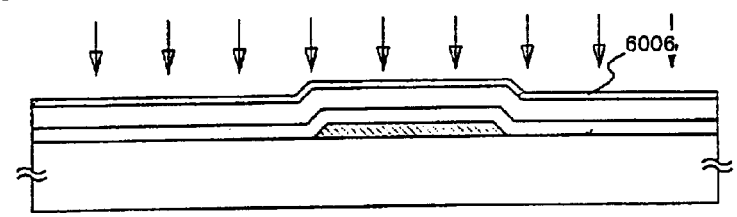
Fig. 18E FORMATION OF BARRIER LAYER AND SECOND SEMICONDUCTOR FILM CONTAINING RARE GAS ELEMENT
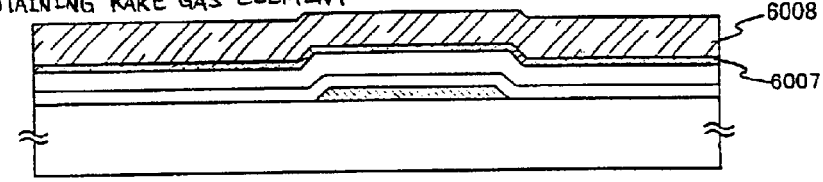
Fig. 18F GETTERING
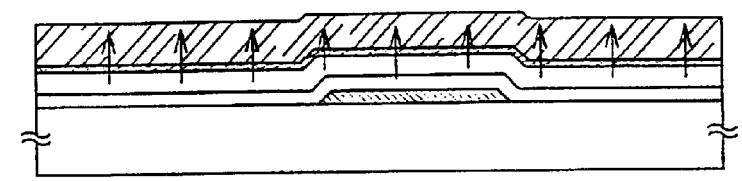
Fig. 18G IRRADIATION OF LASER LIGHT (IN NITROGEN ATMOSPHERE OR IN VACUUM)
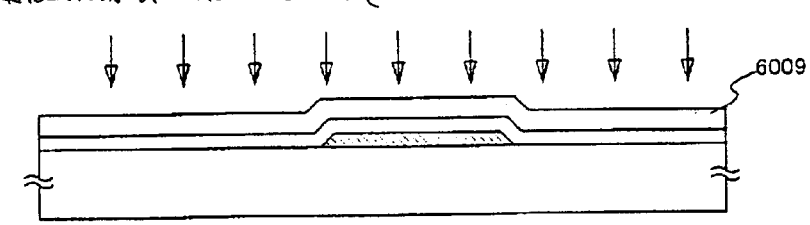

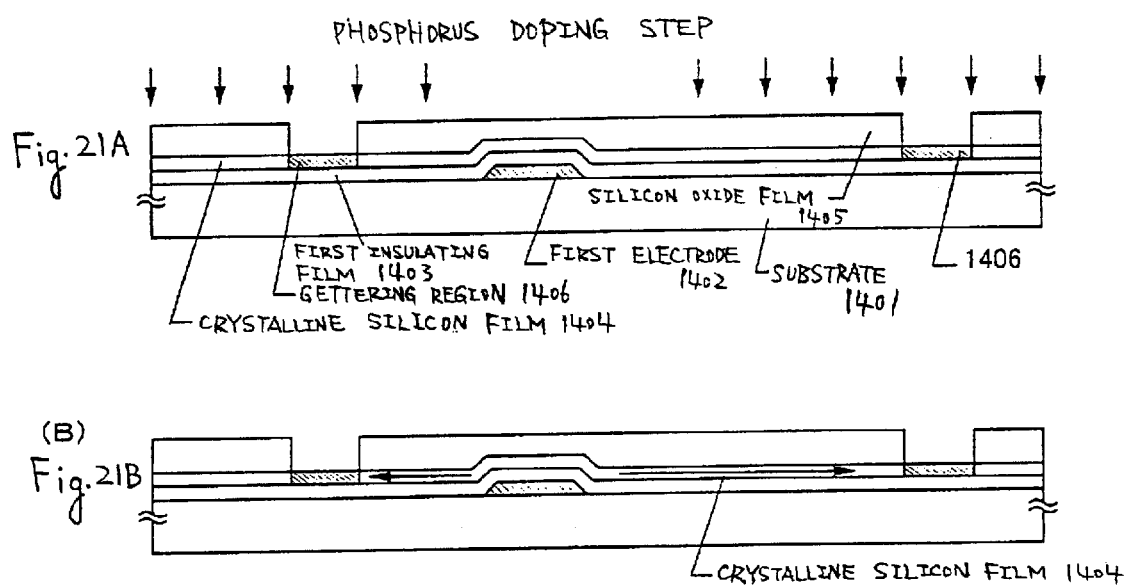

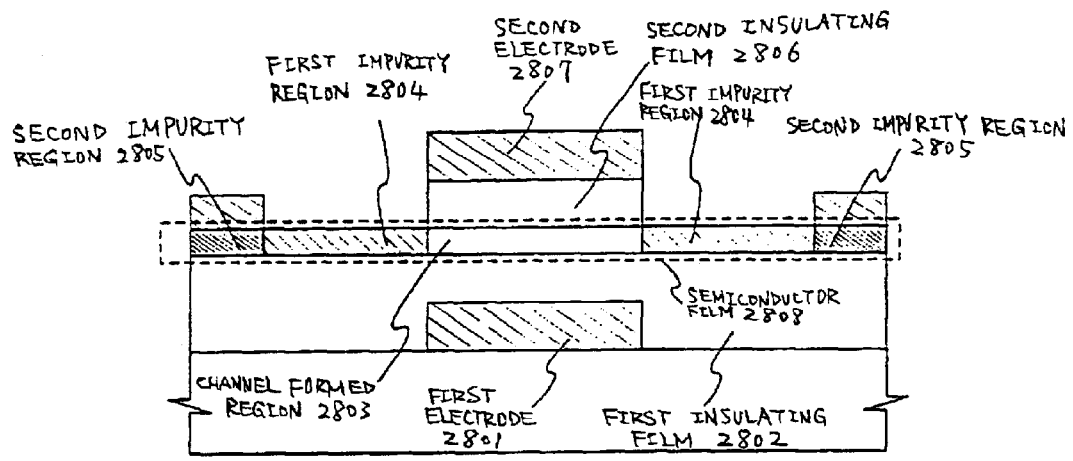
Fig. 26A SIMULATION MODEL
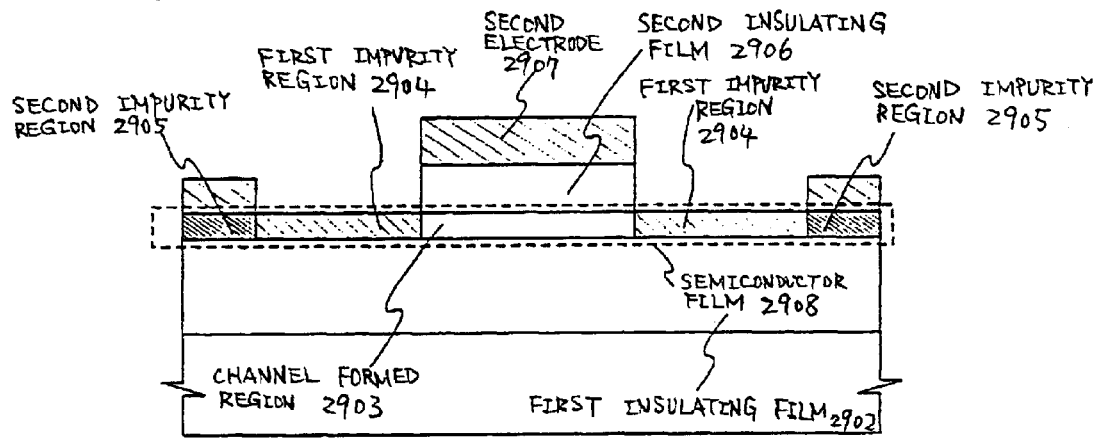
Fig. 26B SIMULATION MODEL

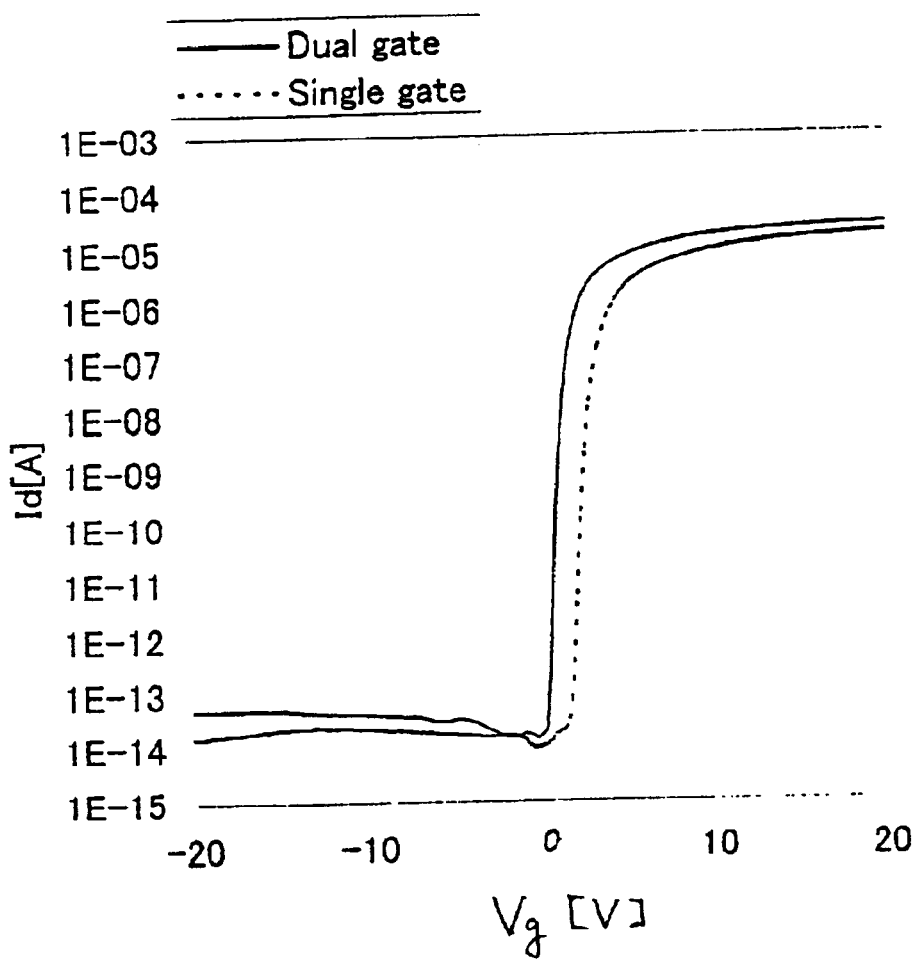

FORMATION OF FIRST SEMICONDUCTOR FILM

IRRADIATION OF LASER LIGHT (IN ATMOSPHERE OR IN OXYGEN ATMOSPHERE)

IRRADIATION OF LASER LIGHT (IN NITROGEN ATMOSPHERE OR IN VACUUM)

THIN FILM TRANSISTOR WITH PLURAL CHANNELS AND CORRESPONDING PLURAL OVERLAPPING ELECTRODES

BACKGROUND OF THE INVENTION

1. Field of the Invention

The present invention relates to a semiconductor device using a thin film transistor (hereinafter referred to as a TFT) wherein a semiconductor film formed on a substrate and having a crystal structure is used; and a process for manufacturing the same. The semiconductor device in the present specification means any device which functions by the use of a semiconductor characteristic, and the category of the semiconductor device manufactured by the present invention includes a display device, a typical example of which is a liquid crystal display device having therein TFTs, and a semiconductor integrated circuit (such as a microprocessor, a signal processing circuit, or a high frequency circuit).

2. Description of Related Art

In various semiconductor devices having therein semiconductor elements, such as a television, a personal computer or a portable telephone, a display for displaying characters or images is an essential means from which people recognize information. Particularly in recent years, a planar display (flat panel display), a typical example of which is a liquid crystal display device using the electro-optic property of liquid crystal, has been actively used.

As one form of the flat panel display, there is known an active matrix driving system wherein a TFT is fitted to each pixel and a picture is displayed by writing data signals successively. TFTs are essential elements for realizing the active matrix driving system.

In almost all cases, TFTs are manufactured using amorphous silicon. However, TFTs have low electric field effect mobility and cannot operate by frequencies necessary for processing picture signals. Therefore, TFTs are used only as switching elements fitted to respective pixels. A data line driving circuit for outputting picture signals to data lines or a scanning line driving circuit for outputting scanning signals to scanning lines is processed by an outside IC(IC driver) mounted by TAB (tape automated bonding) or COG (chip on glass).

However, as the density of pixels becomes larger, the pitch of the pixels becomes narrower; therefore, it is considered that the system in which a driver IC is mounted has a limit. For example, in the case that UXGA (pixel number: 1200×1600) is supposed, 6000 connecting terminals are required in an RGB coloring system at the simplest estimate. An increase in the number of the connecting terminals causes an increase in the probability that contact faults are generated. Moreover, the peripheral area (frame area) of its pixel section increases. As a result, it is unsuccessful that a semiconductor device using this as a display is made small-sized, and the design of the appearance thereof is damaged. In light of such background, a display device integrated with a driving circuit is clearly demanded. By integrating a pixel section with scanning line and data line driving circuits on a single substrate, the number of connecting terminals decreases drastically and the area of the frame area can also be made small.

As a means for realizing the above, suggested is a method of making TFTs of a polycrystalline silicon film. The field effect mobility of TFTs made of polycrystalline silicon film is higher than that of TFTs made of an amorphous silicon film, so that the TFTs can be operated by frequencies necessary to process picture signals. Therefore, using TFTs made of polycrystalline silicon film can be realized that the display device integrated with a driving circuit in which a pixel portion is integrated with scanning line and data line on the same substrate.

TFTs functioning as switching elements located in the pixel section are desired to have, as their characteristic, a small off-state current ($I_{off}$). However, in the case that the TFTs are formed using polycrystal silicon, the TFTs have a problem that their off-state current becomes high because of defects formed in crystal boundaries.

TFTs are manufactured by using photo masks to etch a semiconductor film, an insulating film and/or a conductor film into a given shape while depositing these films into a lamination. However, if the structure of the TFTs is made optimal to obtain desired characteristics of the switching elements in the pixel section, the number of the photo masks increases so that the manufacturing process of the TFTs becomes complicated. As a result, the number of the steps in the process increases inevitably.

SUMMARY OF THE INVENTION

In light of the above-mentioned problems, an object of the present invention is to provide a technique for realizing a TFT having a structure optimal for a switching element in a pixel section, using a smaller number of photo masks.

A thin film transistor according to a first structure which the semiconductor device of the present invention has comprises a first electrode, a first insulating film contacting the first electrode, a semiconductor film contacting the first insulating film, a second insulating film contacting the semiconductor film, and plural electrically-connected second electrodes contacting the second insulating film. The first electrode overlaps with the second electrodes.

The semiconductor film comprises plural channel-formed regions and plural impurity regions contacting the respective channel-formed regions.

The first electrode overlaps with all the impurity regions except the impurity regions functioning as source and drain regions and with the channel-formed regions. Each of the second electrodes overlaps with each of the channel-formed regions which the semiconductor film has.

In this way, the first electrode does not overlap with the impurity regions functioning as the source and drain regions, whereby the off-state current of the TFT can be suppressed. Furthermore, the first electrode overlaps with all the impurity regions except the impurity regions functioning as the source and drain regions, whereby the off-state current can be suppressed.

Moreover, the semiconductor film has the so-called multi-gate structure, wherein plural channel-formed regions are formed, whereby the off-state current can be more suppressed.

The first electrode may be electrically connected to the plural second electrodes or separated from the second electrodes. In the case that the first electrode is electrically connected to the second electrodes, a depletion layer spreads quickly in substantially the same way as in the case that the film thickness of the semiconductor film is made small. Therefore, the S value can be made small and the electric-field effect mobility can be improved. The on-state current of this case can be made larger than that of the case using only one electrode. By using the TFT having this structure in a driving circuit, driving voltage can be lowered. Since the on-state current can be made large, the size (particularly, the channel width) of the TFT can be made small. For this reason, the integration degree of such TFTs can be improved. When two electrodes overlapping with each other across a semiconductor layer are electrically connected to each other in a TFT wherein only one channel-formed region is laid out, the same advantageous effect can be obtained. Besides, interface scattering can be suppressed and mutual conductance (gm) can be increased.

When the voltage of the first electrode is kept constant in the case that the first electrode is electrically separated from the second electrodes, the off-state current can be controlled into a smaller value as this constant voltage is made nearer to the threshold voltage. When in a TFT wherein only one channel-formed region is laid out a constant voltage is applied to one of two electrodes overlapping with each other across a semiconductor layer, the same advantageous effect can be obtained.

As a TFT structure for decreasing an off-current value, a lightly doped drain (LDD) structure is known. This structure is a structure wherein an LDD region, in which an impurity element is added at a low concentration, is arranged between a channel-formed region and an impurity region functioning as a source or drain region.

By fitting an LDD to the TFT having the first structure of the present invention, the off-state current can be more suppressed. In this case, however, it is important that the first electrode does not overlap with the LDD. In this way, the off-state current can be suppressed.

A thin film transistor according to a second structure which the semiconductor device of the present invention comprises a first electrode, a first insulating film contacting the first electrode, a semiconductor film contacting the first insulating film, a second insulating film contacting the semiconductor film, and a second electrode contacting the second insulating film. The first electrode overlaps with the second electrode.

The semiconductor film comprises plural channel-formed regions and plural impurity regions contacting the respective channel-formed regions.

The first electrode overlaps with all the impurity regions except the impurity regions functioning as source and drain regions. The second electrode overlaps with the plural channel-formed regions which the semiconductor film has.

In this way, the first electrode does not overlap with the impurity regions functioning as the source and drain regions, whereby the off-state current of the TFT can be suppressed. Furthermore, the first electrode overlaps with all the impurity regions except the impurity regions functioning as the source and drain regions, whereby the off-state current can be suppressed.

Instead of the first electrode, the second electrode may be overlapped with all the impurity regions except the impurity regions functioning as the source and drain regions. The first electrode and the second electrode may be overlapped with all the impurities except the impurity regions functioning as the source and drain regions, whereby the off-state can be more suppressed.

The semiconductor film has plural channel-formed regions, whereby the off-state current can be more suppressed.

The first electrode may be electrically connected to the second electrode or separated from the second electrode. In the case that the first electrode is electrically connected to the second electrode, a depletion layer spreads quickly in substantially the same way as in the case that the film thickness of the semiconductor film is made small. Therefore, the S value can be made small and the electric field effect mobility can be improved. Thus, the on-state current of this case can be made larger than that of the case using only one electrode. By using the TFT having this structure in a driving circuit, driving voltage can be lowered. Since the on-state current can be made large, the size (particularly, the channel width) of the TFT can be made small. For this reason, the integration degree of such TFTs can be improved.

When the voltage of the first electrode is kept constant in the case that the first electrode is electrically separated from the second electrode, the off-state current can be controlled into a smaller value as this constant voltage is made nearer to the threshold voltage.

By fitting an LDD to the TFT having the second structure of the present invention, the off-state current can be more suppressed. In this case, however, it is important that the first electrode does not overlap with the LDD. In this way, the off-state current can be suppressed.

In the present invention, a decrease in the off-state current is regarded as more important than an increase in the on-state current. For example, it is preferable to use the TFT of the present invention as a switching element in a pixel section in a semiconductor device.

BRIEF DESCRIPTION OF THE DRAWINGS

FIGS. 1A to 1C are sectional views for explaining a TFT having a first structure of the present invention.

FIG. 2 is a sectional view for explaining a TFT having a second structure of the present invention.

FIGS. 3A to 3C are sectional views for explaining the steps of manufacturing a driving circuit and a pixel section in a luminescent device.

FIGS. 4A and 4B are sectional views for explaining the steps of manufacturing the driving circuit and the pixel section in the luminescent device.

FIGS. 5A and 5B are sectional views for explaining the steps of manufacturing the driving circuit and the pixel section in the luminescent device.

FIGS. 6A and 6B are sectional views for explaining the steps of manufacturing the driving circuit and the pixel section in the luminescent device.

FIGS. 7A and 7B are sectional views for explaining the steps of manufacturing the driving circuit and the pixel section in the luminescent device.

FIGS. 13A and 13B are sectional views for explaining the steps of manufacturing a driving circuit and a pixel section in a liquid crystal display device FIGS. 14A and 14B are sectional view for explaining the steps of manufacturing the driving circuit and the pixel section in the liquid crystal display device.

FIG. 17 is a top view for explaining the structure of the pixel section in the liquid crystal display device.

FIGS. 18A to 18G are views showing the steps of the crystallization of a semiconductor layer.

FIGS. 21A and 21B are views showing the steps of the crystallization of a semiconductor layer.

FIGS. 26A and 26B are views of the structure of a TFT used in a simulation.

FIG. 27 is a graph showing characteristics of the TFT obtained in the simulation.

DESCRIPTION OF THE PREFERRED EMBODIMENTS

Figure 8A:
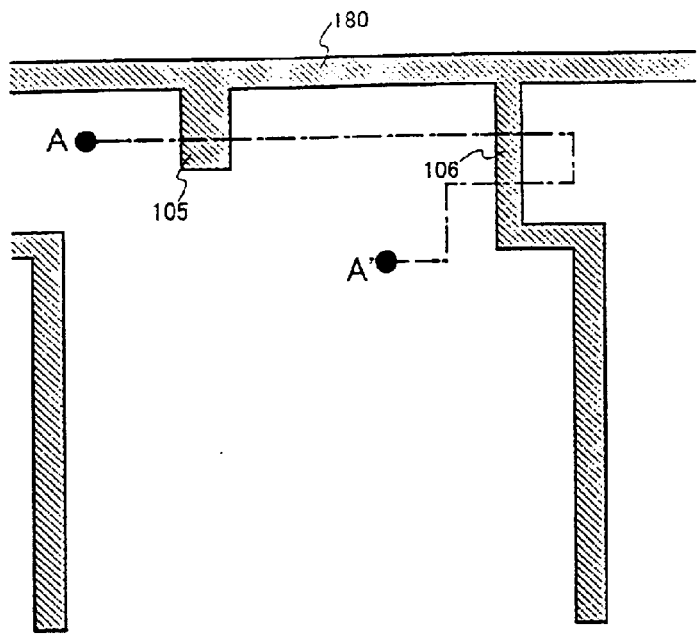
FIGS. 8A and 8B are top views for explaining the steps of manufacturing the pixel section in the luminescent device.

Referring to FIG. 1, a first structure of the present invention will be described. In FIG. 1A, a first electrode 11 is formed on a substrate 10 having an insulating surface. The first electrode 11 may be made of a material having electrical conductivity. Typical examples thereof are alloys or compounds containing one or more selected from aluminum (Al), tungsten (W), molybdenum (Mo), tantalum (Ta) and titanium (Ti). As the first electrode, a lamination wherein plural conductive films are deposited may be used. The first electrode 11 has a thickness of 150 to 400 nm.

A first insulating film 12 is formed to cover the first electrode 11. In the present embodiment, a lamination wherein two insulating films (a first insulating film A 12a, and a first insulating film B 12b) are deposited is used as the first insulating film 12. In FIG. 1, a silicon oxynitride film or a silicon nitride film is formed as the first insulating film A 12a to have a thickness of 10 to 50 nm. A silicon oxynitride film or a silicon oxide film is formed as the second insulating film B 12b to have a thickness of 0.5 to 1 $\mu$m. In the case of using the silicon oxynitride film, this film is a film produced from mixed gas of $SiH_4$, $NH_3$ and $N_2O$ by plasma CVD and containing 20 to 40% by atom of nitrogen. The use of the nitrogen-containing insulating film such as the silicon oxynitride film or the silicon nitride film makes it possible to prevent the diffusion of impurities such as alkali metals from the substrate 10.

The surface of the first insulating film 12 may have irregularities based on the previously-formed first electrode 11. The irregularities are preferably made flat by polishing the surface. The method of making the surface flat may be chemical mechanical polishing (hereinafter referred to as CMP). A polishing agent (slurry) for the CMP of the first insulating film 12 may be, for example, a slurry wherein fumed silica particles obtained by decomposing silicon chloride gas thermally are dispersed in a solution of KOH in water. By the CMP, the first insulating film is removed by about 0.1 to 0.5 $\mu$m to make the surface flat. The surface of the first insulating film may be polished or may not be polished. In the flattened first insulating film, the elevation difference of the irregularities on the surface thereof is preferably 5 nm or less, and more preferably 1 nm or less. The improvement in the flatness makes it possible to make the first insulating film, which is used as a gate insulating film to be formed afterwards, thin. Thus, the mobility of a TFT to be manufactured can be improved. The improvement in the flatness also makes it possible to reduce the off-state current of the TFT.

After the surface of the first insulating film 12 is polished by the CMP, the flattened surface of the first insulating film 12 may be etched. The etching makes it possible to remove refuse generated at the time of the CMP, causing an improvement in yield in subsequent steps.

A semiconductor film 13 is formed on the first insulating film 12 whose surface is flattened. The semiconductor film 13 has channel-formed regions 18a and 18b, and impurity regions 19a, 19b and 19c between which the channel-formed regions 18a and 18b are sandwiched. A second insulating film 14 is formed on the semiconductor film 13. Furthermore, second electrodes 15a and 15b are formed, across the second insulating film 14, on the semiconductor film 13. The second electrodes 15a and 15b are electrically connected to each other.

The first electrode 11 overlaps with the second electrodes 15a and 15b across the channel-formed regions 18a and 18b, respectively.

Besides, a third insulating film 16 and an interconnection 17 are formed if necessary.

The first electrode 11 may be electrically connected to the second electrodes 15a and 15b, and a constant voltage may be applied to either one of the electrodes.

FIG. 1B illustrates a cross section taken on line A–A' of FIG. 1A on condition that the first electrode 11 and the second electrode 15a are directly connected to each other.

As illustrated in FIG. 1B, the first electrode 11 and the second electrode 15a are connected to each other, through a contact hole 21 made in the first insulating film 12 and the second insulating film 14, outside the semiconductor film 13.

FIG. 1C illustrates a cross section taken on line A–A' of FIG. 1A on condition that the first electrode 11 and the second electrode 15a are connected to each other by means of an interconnection 24 made of the same conductive film which makes the interconnection 17.

As illustrated in FIG. 1C, the first electrode 11 and the interconnection 24 are connected to each other through a contact hole 23 made in the first insulating film 12, the second insulating film 14 and the third insulating film 16. The second electrode 15a and the interconnection 24 are connected to each other through a contact hole 22 made in the third insulating film 16.

The manner of connecting the first electrode 11 electrically to the second electrode 15a is not limited to the manner shown in FIG. 1B or FIG. 1C.

The film thickness removed by the CMP is decided under consideration of the thickness of the first insulating film 12, the dielectric constant thereof, and the thickness of the second insulating film 14. The film remaining herein functions substantially as a gate insulating film. Accordingly, in the case that the first insulating film is made by depositing plural insulating films into a lamination, only its topmost insulating film above the first electrode 11 may be polished. The first insulating film may be polished in such a manner that its lower insulating film is naked.

For example, in the case that the first insulating film A 12a and the first insulating film B 12b are composed of silicon oxynitride films and have a dielectric constant of 7.5 and the second insulating film 14 is made of a silicon oxide film, the dielectric constant of the second insulating film 14 is 3.9. A difference between the two is generated. In this case, finish dimensions after the CMP are preferably set as follows: the film thickness of the first insulating film 12: 150 nm, and that of the second insulating film 14: 110 nm.

The first electrode 11 overlaps with the impurity region 19b, (which is a region other than the impurity regions 19a and 19c functioning as a source region and a drain region, respectively among the impurity regions 19a, 19b and 19c), and channel-formed regions 18a and 18b. The second electrodes 15a and 15b overlap with the channel-formed regions 18a and 18b which the semiconductor film 13 has.

In this way, the first electrode 11 neither overlaps with the impurity regions 19a nor 19c functioning the source region and the drain region, respectively, whereby the off-state current of the TFT can be suppressed. Moreover, the impurity region 19b other than the impurity regions functioning as the source region and as the drain region overlaps with the first electrode 11, whereby the off-state current can be suppressed.

Furthermore, the semiconductor film has the plural channel-formed regions, i.e., the so-called multi-gate structure, whereby the off-state current can be more suppressed.

By fitting an LDD to the TFT shown in FIG. 1, the off-state current can be more suppressed. In this case, it is important that the first electrode does not overlap with the LDD. In this way, the off-state current can be suppressed.

The first electrode may be electrically connected to the plural second electrodes or separated from the second electrodes.

When the voltage of the first electrode is kept constant in the case that the first electrode is electrically separated from the second electrodes, the off-state current can be controlled into a smaller value as this constant voltage is made nearer to the threshold voltage. In this case, a scattering in the threshold voltage can be made smaller than in the case that the electrodes are arranged only on one side of the semiconductor film.

In the case that the first electrode is electrically connected to the second electrodes, a depletion layer spreads quickly in substantially the same way as in the case that the film thickness of the semiconductor film is made small. Therefore, the S value can be made small and the electric field effect mobility can be improved. In order to make the sub-threshold coefficient small, it is necessary to make the film thickness of the semiconductor film small. In the case that a semiconductor film obtained by crystallizing an amorphous semiconductor film is used as used in TFTs, the crystallinity thereof gets worse as the amorphous semiconductor film becomes thinner. Thus, advantageous effects resulting from making the film thickness small cannot be obtained. However, by connecting the first electrode and the second electrodes electrically and overlapping the two kinds of electrodes vertically across the semiconductor film as shown in FIG. 1, depletion advances quickly with the application of voltage in substantially the same way as in the case that the thickness of the semiconductor film is made small. Thus, the electric field effect mobility and the sub-threshold coefficient can be made small, and the on-state current can be made large.

In the case that the first electrode 11 and the second electrodes 15 are electrically connected, the electric field effect mobility and the sub-threshold coefficient can be made smaller and the on-state current can be made larger as the dielectric constant of the first insulating film 12 is closer to that of the second insulating film 14.

As the film thickness of the first insulating film 12 in the area where the first electrode 11 overlaps with the channel-formed regions 18a and 18b is closer to that of the second insulating film 14 in the area where the second electrodes 15a and 15b overlap with the channel-formed regions 18a and 18b, the electric field effect mobility and the sub-threshold coefficient can be made smaller and the on-state current can be made larger when each of the above-mentioned two film thicknesses is uniform. When the film thickness of the first insulating film in the area where it overlaps with the first electrode 11 is represented by d1 and the film thickness of the second insulating film in the area where it overlaps with the second electrodes 15 is represented by d2, it is desirable that d1 and d2 satisfy the following: $|d1-d2|/d1 \leq 0.1$ and $|d1-d2|/d2 \leq 0.1$. It is more desirable that d1 and d2 satisfy the following: $|d1-d2|/d1 \leq 0.05$ and $|d1-d2|/d2 \leq 0.05$.

It is most preferable that in the state that the first electrode 11 is not electrically connected to the second electrodes 15a and 15b, the threshold value of the thin film transistor when ground voltage is applied to the first electrode 11 is made substantially equal to the threshold value of the thin film transistor when ground voltage is applied to the second electrodes 15 and further the first electrode 11 is electrically connected to the second electrodes 15. In this way, the electric field effect mobility and the sub-threshold coefficient can be made smaller and the on-state current can be made larger.

By such a structure, channels (dual channels) can be formed above and below the semiconductor film so that the characteristics of the TFT can be improved.

Referring to FIG. 2, a second structure of the present invention will be described. In FIG. 2, a first electrode 31 is formed on a substrate 30 having an insulating surface. It is advisable that the first electrode 31 is made of an electrical conductive material in the same way as in the first structure. The first electrode 31 has a thickness of 150 to 400 nm.

A first insulating film 32 is formed to cover the first electrode 31. In the present embodiment, a lamination wherein two insulating films (a first insulating film A 32a, and a first insulating film B 32b) are deposited is used as the first insulating film 32. In FIG. 2, a silicon oxynitride film or a silicon nitride film is formed as the first insulating film A 32a to have a thickness of 10 to 50 nm. A silicon oxynitride film or a silicon oxide film is formed as the second insulating film B 32b to have a thickness of 0.5 to 1 μm. In the case of using the silicon oxynitride film, this film is a film produced from mixed gas of $SiH_4$, $NH_3$ and $N_2O$ by plasma CVD and containing 20 to 40% by atom of nitrogen. The use of the nitrogen-containing insulating film such as the silicon oxynitride film or the silicon nitride film makes it possible to prevent the diffusion of impurities such as alkali metals from the substrate 30.

The surface of the first insulating film 32 may have irregularities based on the previously-formed first electrode 31. The irregularities are preferably made flat by polishing the surface. The method of making the surface flat may be CMP. The CMP may be performed in the same way as in the first structure. By the CMP, the first insulating film is removed by about 0.1 to 0.5 μm to make the surface flat.

A semiconductor film 33 is formed on the first insulating film 33 whose surface is flattened. The semiconductor film 33 has channel-formed regions 38a and 38b, and impurity regions 39a, 39b and 39c between which the channel-formed regions 38a and 38b are sandwiched. A second insulating film 34 is formed on the semiconductor film 33. Furthermore, a second electrode 35 is formed, across the second insulating film 34, on the semiconductor film 33.

The first electrode 31 overlaps with the second electrode 35 across the channel-formed regions 38a and 38b.

Besides, a third insulating film 36 and an interconnection 37 are formed if necessary.

The first electrode 31 may be electrically connected to the second electrode 35, and a constant voltage may be applied to either one of the electrodes. The connection of the first electrode 31 and the second electrode 35 to each other maybe directly or electrically performed in the same way as in the first structure.

The first electrode 31 or the second electrode 35 overlaps with the impurity region 39b, (which is a region other than the impurity regions 39a and 39c functioning as a source region and a drain region, respectively among the impurity regions 39a, 39b and 39c), and channel-formed regions 38a and 38b.

In this way, the first electrode 31 or the second electrode 35 neither overlaps with the impurity regions 39a nor 39c functioning the source region and the drain region, respectively, whereby the off-state current of a TFT to be manufactured can be suppressed. Moreover, the impurity region 39b other than the impurity regions functioning as the source region and the drain region overlaps with the first electrode 31 or the second electrode 35, whereby the off-state current can be suppressed.

Furthermore, the semiconductor film has the plural channel-formed regions, whereby the off-state current can be more suppressed.

By fitting an LDD to the TFT shown in FIG. 2, the off-state current can be more suppressed. In this case, it is important that the first electrode does not overlap with the LDD. In this way, the off-state current can be suppressed.

The first electrode and the second electrode may be electrically connected to each other or separated from each other.

When the voltage of the first electrode is kept constant in the case that the first electrode and the second electrode are electrically separated from each other, the off-state current can be controlled into a smaller value as this constant voltage is made nearer to the threshold voltage. In this case, a scattering in the threshold voltage can be made smaller than in the case that the electrodes are arranged only on one side of the semiconductor film.

In the case that the first electrode and the second electrode are electrically connected to each other, a depletion layer spreads quickly in substantially the and same way as in the case that the film thickness of the semiconductor film is made small. Therefore, the S value can be made small and the electric field effect mobility can be improved. In order to make the sub-threshold coefficient small, it is necessary to make the film thickness of the semiconductor film small. In the case that a semiconductor film obtained by crystallizing an amorphous semiconductor film is used as used in TFTs, the crystallinity thereof gets worse as the amorphous semiconductor film becomes thinner. Thus, advantageous effects resulting from making the film thickness small cannot be obtained. However, by connecting the first electrode and the second electrode electrically and overlapping the two electrodes vertically across the semiconductor film as shown in FIG. 2, depletion advances quickly with the application of voltage in substantially the same way as in the case that the thickness of the semiconductor film is made small. Thus, the electric field effect mobility and the sub-threshold coefficient can be made small, and the on-state current can be made large.

In the case that the first electrode 31 and the second electrode 35 are electrically connected to each other, the electric field effect mobility and the sub-threshold coefficient can be made smaller and the on-state current can be made larger as the dielectric constant of the first insulating film 32 is closer to that of the second insulating film 34.

As the film thickness of the first insulating film 32 in the area where the first electrode 31 overlaps with the channel-formed regions 38a and 38b is closer to that of the second insulating film 34 in the area where the second electrode 35 overlaps with the channel-formed regions 38a and 38b, the electric field effect mobility and the sub-threshold coefficient can be made smaller and the on-state current can be made larger when each of the above-mentioned two film thicknesses is uniform. When the film thickness of the first insulating film 32 in the area where it overlaps with the first electrode 31 is represented by d1 and the film thickness of the second insulating film 34 in the area where it overlaps with the second electrode 35 is represented by d2, it is desirable that d1 and d2 satisfy the following: $|d1-d2|/d1 \leq 0.1$ and $|d1-d2|/d2 \leq 0.1$. It is more desirable that d1 and d2 satisfy the following: $|d1-d2|/d1 \leq 0.05$ and $|d1-d2|/d2 \leq 0.05$.

It is most preferable that in the state that the first electrode 31 is not electrically connected to the second electrode 35, the threshold value of the thin film transistor when ground voltage is applied to the first electrode 31 is made substantially equal to the threshold value of the thin film transistor when ground voltage is applied to the second electrode 35 and further the first electrode 31 is electrically connected to the second electrode 35. In this way, the electric field effect mobility and the sub-threshold coefficient can be made smaller and the on-state current can be made larger.

By such a structure, channels (dual channels) can be formed above and below the semiconductor film so that the characteristics of the TFT can be improved.

At the same time when the first electrode 11 is formed, interconnections for transmitting various signals or electric power can be formed. If flattening treatment based on CMP is performed, no effect is produced on the semiconductor film etc. to be formed thereon. Moreover, the density of interconnections can be made higher by multilayer interconnection. Specific examples where the present TFT is applied to an active matrix driving type display device will be described hereinafter.

EXAMPLE 1

Manufacturing steps of manufacturing a semiconductor device according to the present invention will be described.

In this example, a method of simultaneously manufacturing a pixel section and TFT's (n-channel type TFT's and p-channel type TFT's) for a driving circuit provided near the pixel section, on the same substrate will be described in detail. In this example, an example in which the first structure TFT is formed as a switching element and common voltage is applied to the one-side electrodes.

In this example, an example in which other TFT of the pixel section and TFT formed on a driving circuit have a first electrode and a second electrode, sandwiching a semiconductor layer therebetween, is shown. Only one channel formed region is provided in this example. FIGS. 3A, 3B, 3C to 7A and 7C are cross-sectional views for explaining the semiconductor device manufacturing steps. FIGS. 8A, 8B to FIG. 10 are corresponding top views. For the convenience of explanation, common reference symbols are used therein.

In FIG. 3A, a substrate made of an arbitrary material can be used as a substrate 101 as long as the substrate has an insulating film and resists treatment temperature in later steps. Typically, a glass substrate, a quartz substrate, a ceramic substrate or the like can be used. Alternatively, a substrate such as a silicon substrate, a metal substrate or a stainless substrate having an insulating film formed on the surface thereof may be used. It is also possible to use a plastic substrate having heat resistance against the treatment temperature in this example.

A first wiring 102 and first electrodes 103 to 106 are formed on the insulating surface of the substrate 101. Each of the first wiring 102 and the first electrodes 103 to 106 are formed out of a conductive material made of one or a plurality of types of elements selected from among Al, W, Mo, Ti and Ta. In this example, tungsten (W) is used as the material of the first wiring 102 and the first electrodes 103 to 106.

FIG. 8A is a top view of a pixel section shown in FIG. 3A. The first electrodes 105 and 106 form a part of a common wiring 180.

After forming the first wiring 102 and the first electrodes 103 to 106, a first insulating film 110 is formed. In this example, the first insulating film 110 is formed by layering two insulating films (a first insulating film A 110a and a first insulating film B 110b). The first insulating film A 110a is formed out of a silicon oxide nitride film to have a thickness of 10 to 50 nm. The first insulating film B 110b is formed out of a silicon oxide film or a silicon oxide nitride film to have a thickness of 0.5 to 1 μm.

The surface of the first insulating film 110 has often irregularities resulting from the first wiring 102 and the first electrodes 103 to 106 formed prior to the first insulating film 110. It is preferable to flatten these irregularities. As a planarization method, the CMP method is used. As an abrasive material (slurry) for the CMP applied to the first insulating film 110, a KOH-added aqueous solution into which foamed silica particles obtained by thermally decomposing silicon chloride gas are dispersed, for example, may be used. By the CMP, the first insulating film 110 is removed by a thickness of about 0.1 to 0.5 μm to thereby flatten the surface thereof.

As a result, as shown in FIG. 3B, the flattened first insulating film 112 is formed. A semiconductor layer is formed on the first insulating film 112. The semiconductor layer 113 is formed out of semiconductor of a crystal structure. The semiconductor layer 113 can be obtained by crystallizing an amorphous semiconductor layer formed on the first insulating film 112. After being deposited, the amorphous semiconductor layer is crystallized by a heat treatment or laser irradiation. Although the material of the amorphous semiconductor layer is not limited to a specific one, the amorphous semiconductor layer is preferably formed out of silicon, silicon germanium ($Si_xGe_{1-x}$, where $0<x<1$, typically x=0.001 to 0.05) alloy or the like.

Thereafter, the semiconductor layer 113 is etched to be divided into banded sections to thereby form semiconductor films 114 to 117 as shown in FIG. 3C.

Figure 8B:
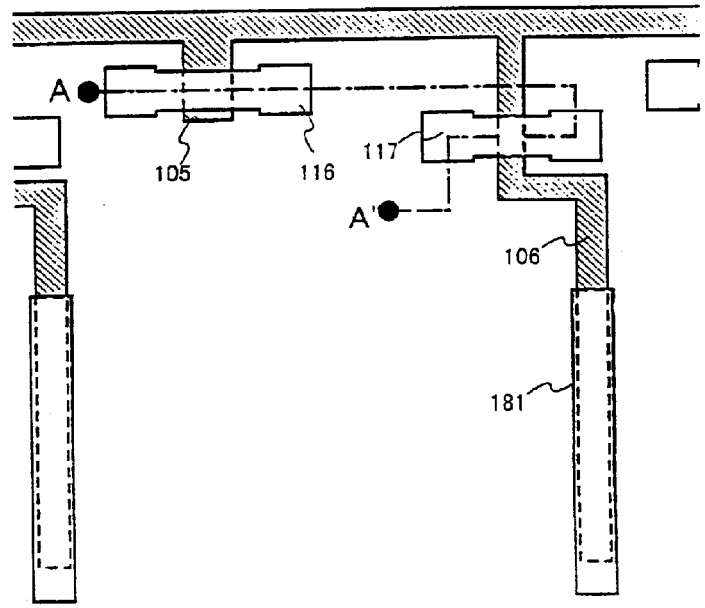

FIG. 8B is a top view of FIG. 3C. The first electrodes 105 is overlapped with the semiconductor film 116 with the first insulating film 112 interposed therebetween. In addition, the first electrode 106 is overlapped with the semiconductor film 117 with the first insulating film 112 interposed therebetween. A semiconductor film 181 is provided to form a capacitance and overlapped with the first electrode 106 with the first insulating film 112 interposed therebetween.

Next, as shown in FIG. 4A, a second insulating film 118 which covers the semiconductor films 114 to 117 and 118, is formed. The second insulating film 118 is formed out of silicon containing insulator by a plasma CVD method or a sputtering method. The thickness of the second insulating film 118 is 40 to 150 nm.

Conductive films for forming a second gate electrode and a second wiring, are formed on the second insulating film 118. According to the present invention, the second gate electrode is formed by layering two or more conductive films. A first conductive film 119 provided on the second insulating film 118 is formed out of a nitride of high melting point metal such as molybdenum or tungsten. A second conductive film 120 provided on the first conductive film 119 is formed out of high melting point metal, low resistance metal such as copper or aluminum or polysilicon. More specifically, as the first conductive film 119, a metal nitride of one or a plurality of elements selected from among W, Mo, Ta and Ti is used. As the second conductive film 120, alloy of one or a plurality of elements selected from W, Mo, Ta, Ti, Al and Cu or n-type polycrystalline silicon is used. For example, the first conductive film 119 may be formed out of TaN and the second conductive film 120 may be formed out of tungsten (W). If the second gate electrode or the second wiring is formed out of three layers of conductive films, the first layer may be an Mo film, the second layer may be an Al film and the third layer may be a TiN film. Alternatively, the first layer may be a W film, the second layer may be an Al film and the third layer may be a TiN film. By providing a multilayer wiring, the thickness of the wiring itself increases to make it possible to suppress wiring resistance. The first conductive film 119 and the second conductive film 120 are etched using a mask 121 to thereby form the second wiring and the second electrode.

As shown in FIG. 4B, first shape type electrodes 121 to 125 each having tapered end sections (which electrodes consist of the first conductive films 121a to 125a and the second conductive films 121b to 125b, respectively) are formed by the first etching treatment. The surface of the second insulating film 130 is etched and thinned by a thickness of about 20 to 50 nm in the sections in which the second insulating film 130 is not covered with the first shape type electrodes 121 to 125.

The first doping treatment is carried out by an ion injection method or an ion doping method for injecting ions without causing mass separation. In the doping, using the first shape type electrodes 121 to 125 as masks, first concentration, one conductive type impurity regions 126 to 129 are formed in the semiconductor films 114 to 117, respectively. Although not shown in the figure, an impurity region is formed on a part of the semiconductor film 181 by conducting an ion doping method. The first concentration is set at $1\times10^{20}$ to $1.5\times10^{21}/cm^3$. In addition, as for the impurity region 128 is divided into four impurity regions; 128a, 128b and 128c, to explain in detail about the structure subsequently.

Next, the second etching treatment is carried out as shown in FIG. 5A without removing a mask made of resist. In the second etching treatment, second shape type electrodes 131 to 135 (which consist of first conductive films 131a to 135a and second conductive films 131b to 135b, respectively) are formed by subjecting the second conductive film 120 to anisotropic etching. The second shape type electrodes 131 to 135 are formed so that the widths thereof are reduced by the second etching treatment and the end sections thereof are located inward of the first concentration, one conductive type impurity regions 126 to 129 (second impurity regions). As shown in the next step, the length of an LDD is determined according to each reduced width. The second shape type electrodes 131 to 135 function as second electrodes, respectively.

Figure 9A:
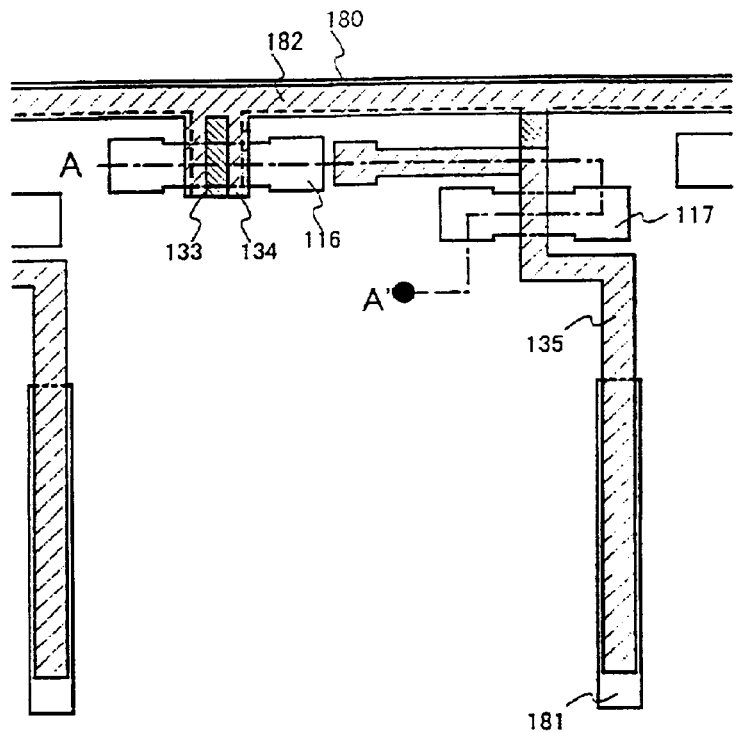
FIGS. 9A and 9B are top views for explaining the step of manufacturing the pixel section in the luminescent device.

FIG. 9A is a top view of FIG. 5A. The second shape type electrodes 133, 134, and 135 form a part of a gate wiring 182. The second shape type electrodes 133 and 134 are overlapped with the semiconductor film 116 with the second insulating film 130 interposed therebetween. The second shape type electrode 135 is overlapped with the semiconductor film 117 with the second insulating film 130 interposed therebetween. In addition, the second shape type electrodes 133 and 134 are overlapped with the first electrode 105, respectively, with the first insulating film 112, the semiconductor film 116 and the second insulating film 130 interposed therebetween. A part of the second shape type electrode 135 is overlapped with the first electrode 106 with the first insulating film 112, the second insulating film 130 and the semiconductor film 181 interposed therebetween.

Further, the second shape type electrodes 131 and 132 are overlapped with the first electrodes 103 and 104, with the semiconductor films 114, 115 and the second insulating film 130 interposed therebetween, respectively.

In this state, the second doping treatment is carried out to thereby inject one conductive type impurities into the semiconductor films 114 to 117. Second concentration, one conductive type impurity regions (first impurity regions) 195 to 198 formed by the second doping treatment are formed to be overlapped with the first conductive films 131a to 135a which constitute the second shape type electrodes 131 to 135 in a self-aligned fashion, respectively. Since the impurities doped by the ion doping method are passed through the first conductive films 131a to 135a and then added to the semiconductor films, the number of ions which reach the semiconductor films decreases and the ion concentration of each semiconductor film, quite naturally, becomes low. The concentration is $1\times10^{17}$ to $1\times10^{19}/cm^3$. In addition, the impurity region 197 is divided into four impurity regions; 197a, 197b, 197c and 197d, to explain in detail about the structure subsequently.

Next, as shown in FIG. 5B, masks 139 and 140 made of resist are formed. Using the masks 139 and 140, the third doping treatment is carried out. In this third doping treatment, third concentration type impurity regions 141 and 142 of a conductive type opposite to one conductive type are formed in the semiconductor films 115 and 117, respectively. The third concentration type impurity regions 141 and 142 of the conductive type opposite to one conductive type are formed in regions overlapped with the second shape type electrodes 132 and 134, respectively. Impurity elements are added to the semiconductor films in a concentration range of $1.5\times10^{20}$ to $1.5\times10^{21}/cm^3$.

As a result of the above steps, the impurity doped regions intended for valence electron control are formed in the respective semiconductor films. The first electrodes 103 to 106 and the second shape type electrodes 131 to 135 function as gate electrodes at positions at which the electrodes cross the semiconductor films, respectively.

Thereafter, a step of activating the impurity elements doped into the respective semiconductor films is executed. In this activation treatment, gas heating type instantaneous heat annealing is employed. The heat treatment is carried out at a temperature of 400 to 700° C. in a nitrogen atmosphere, typically at a temperature of 450 to 500° C. In addition to the heat annealing, laser annealing using the second higher harmonic wave (532 nm) of a YAG laser is available. If the impurities are activated by the irradiation of a laser beam, the laser beam is applied to the semiconductor films using the second higher harmonic wave (532 nm) of the YAG laser. Needless to say, the RTA method, which uses a lamp light source instead of laser light, is also applicable. In the RTA method, the lamp light source is radiated from the both sides or one side of a substrate to thereby heat the semiconductor films.

Thereafter, as shown in FIG. 6A, a passivation film 143 made of silicon nitride is formed to have a thickness of 50 to 100 nm by the plasma CVD method, a heat treatment is carried out at a temperature of 410° C. using a clean oven and the semiconductor films are hydrogenated with hydrogen emitted from the silicon nitride film.

Next, a third insulating film 144 made of an organic insulating material is formed on the passivation film 143. The reason for using the organic insulating material is to flatten the surface of the third insulating film 144. To obtain a more completely flattened surface, the surface of the third insulating film 144 is preferably subjected to a planarization treatment by the CMP method. If the CMP is used in combination with the planarization, a silicon oxide film formed by the plasma CVD method, an SOG (Spin on Glass) film or a PSG film formed by a coating method, or the like can be used as the third insulating film 144. The passivation film 143 may be regarded as a part of the third insulating film 144.

A transparent conductive film 145 that mainly contains indium tin oxide (ITO) having a thickness of 60 to 120 nm is formed on the surface of the third insulating film 144 thus flattened. Since the surface of the transparent conductive film 145 has microscopic irregularities, it is preferable that the surface thereof is polished and flattened by the CMP method with aluminum oxide used as an abrasive material.

Figure 9B:
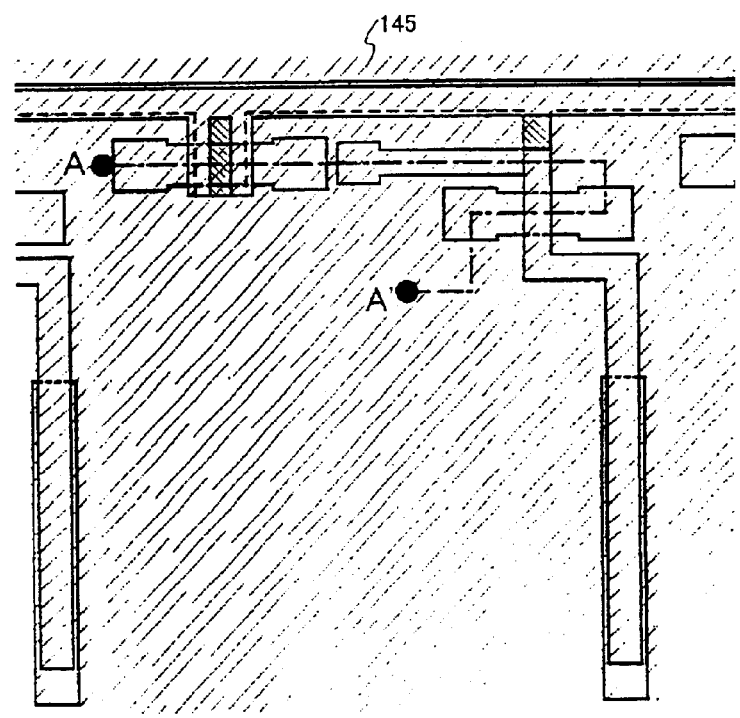

FIG. 9B is a top view of FIG. 6A.

Thereafter, the transparent conductive film 145 is etched to thereby form a pixel electrode (third electrode) 146. Contact holes are formed in the second insulating film 130, the passivation film 143 and the third insulating film 144, and wirings 147 to 153 are formed. The wirings are formed by layering a titanium film and an aluminum film.

The wiring 147 is connected to the first wiring 102 and the second shape type electrode 131. In addition, the first wiring 102 is electrically connected to the first electrode 103.

The wiring 148 is connected to the impurity regions 126 and 141. The wiring 149 is connected to the impurity region 141. The wiring 150 is connected to the impurity region 128a and functions as a source wiring. The wiring 151 is connected to the impurity region 128c and the second shape type electrode 135. The wiring 152 is connected to the impurity region 142. The wiring 153 is connected to the impurity region 142 and the pixel electrode 146 and functions as a power supply line.

In the steps described so far, if the one conductive type impurity region is an n-type region and the impurity region of the conductive type opposite to one conductive type is a p-type region, a driving circuit 200 which includes an n-channel type TFT 202, and a p-channel type TFT 203 and a pixel section 201 which includes an n-channel type TFT 204 and a p-channel type TFT 205 are formed.

As for the driving circuit 200, on the n-channel type TFT 202, a pair of gate electrodes 131 and 103 is overlapped with each other with the channel formation region 160 put therebetween. The second concentration, one conductive type impurity region 195 functions as an LDD region and the first concentration, one conductive type impurity region 126 functions as a source or a drain region. On the p-channel type TFT 203 of the driving circuit 200, a pair of gate electrodes 132 and 104 is overlapped with each other with the channel formation region 161 put therebetween. The third concentration type impurity region 141 of the opposite conductive type to one conductive type functions as a source or drain region. The LDD is formed to have a length of 0.5 to 2.5 μm, preferably 1.5 μm in a channel length direction. The configuration of such an LDD is intended to prevent the deterioration of the TFT mainly due to the hot carrier effect. A shift register circuit, a buffer circuit, a level shifter circuit, a latch circuit and the like can be formed out of these n-channel type TFT's and p-channel type TFT's. The first n-channel type TFT 202 is suited particularly for the buffer circuit requiring high driving voltage so as to prevent the deterioration of the TFT 202 due to the hot carrier effect.

The n-channel type TFT 204 of the pixel section 201 has the first structure of the present invention. Electrodes 133 and 105 are overlapped with each other with the channel formation region 162 put therebetween. Electrodes 134 and 105 are overlapped with each other with the channel formation region 163 put therebetween. The second concentration, one conductive type impurity region 197 functions as an LDD region and the first concentration, one conductive type impurity regions 128a and 128c functions as a source or drain region. The n-channel type TFT 204 is constituted so that two TFT's are connected in series with the first concentration, one conductive type impurity region put therebetween. The electrode 105 is overlapped with the channel formation region 162 and 163, the LDD regions 197b and 197c and the first concentration, one conductive type impurity region 128b.

A pair of electrodes 135 and 106 is overlapped with each other with the channel formation region 164 put therebetween. Third concentration type impurity region 142 of a conductive type opposite to one conductive type function as source region or drain region.

In this example, by always applying a constant voltage to the common wiring, the common voltage is applied to the first electrode. If this constant voltage is set near to a threshold voltage, the OFF current can be suppressed accordingly. By applying the common voltage to the first electrode, the threshold irregularity of the TFT can be suppressed compared with the TFT, which includes only one electrode. It is also possible to suppress OFF current. The decrease of OFF current rather than the increase of ON current influences the TFT, which is formed as a switching element in the pixel section of the semiconductor device. The above-stated configuration is, therefore, advantageous to this TFT.

Further, in this example, by forming a pair of gate electrodes electrically connected to each other through the semiconductor film on the TFT included in the driving circuit of the semiconductor device, the thickness of the semiconductor film is substantially halved, the formation of a depleted region is accelerated following the application of a voltage, making it possible to improve the field effect mobility and to lower the sub-threshold coefficient. As a result, by using the TFT of such a structure in the driving circuit, it is possible to decrease driving voltage. In addition, current driving capability is improved and the TFT can be thereby made smaller in size (channel width thereof can be particularly made smaller). It is thus possible to improve the integration density of the semiconductor device.

The pixel section 201 shows a structure, which can be applied to an active matrix driven type light emitting device. FIG. 7A shows a state in which a light emitting element is formed on the third insulating film 144. A partition layer 170 that covers the n-channel type TFT 204 and the p-channel TFT 205 is formed on the third insulating film 144. Since an organic compound layer or a cathode cannot be subjected to a wet treatment (such as etching with chemicals or washing), the partition layer 170 formed out of a photosensitive resin material is provided on a fourth insulating film for the pixel electrode 146. The partition layer 170 is formed out of an organic resin material such as polyimide, polyamide, polyimide amide or acryl. This partition layer 170 is formed to cover the end sections of the pixel electrode 146. In addition, each of the end sections of the partition layer 170 is formed to have a cone angle of 45 to 60 degrees.

Figure 10:
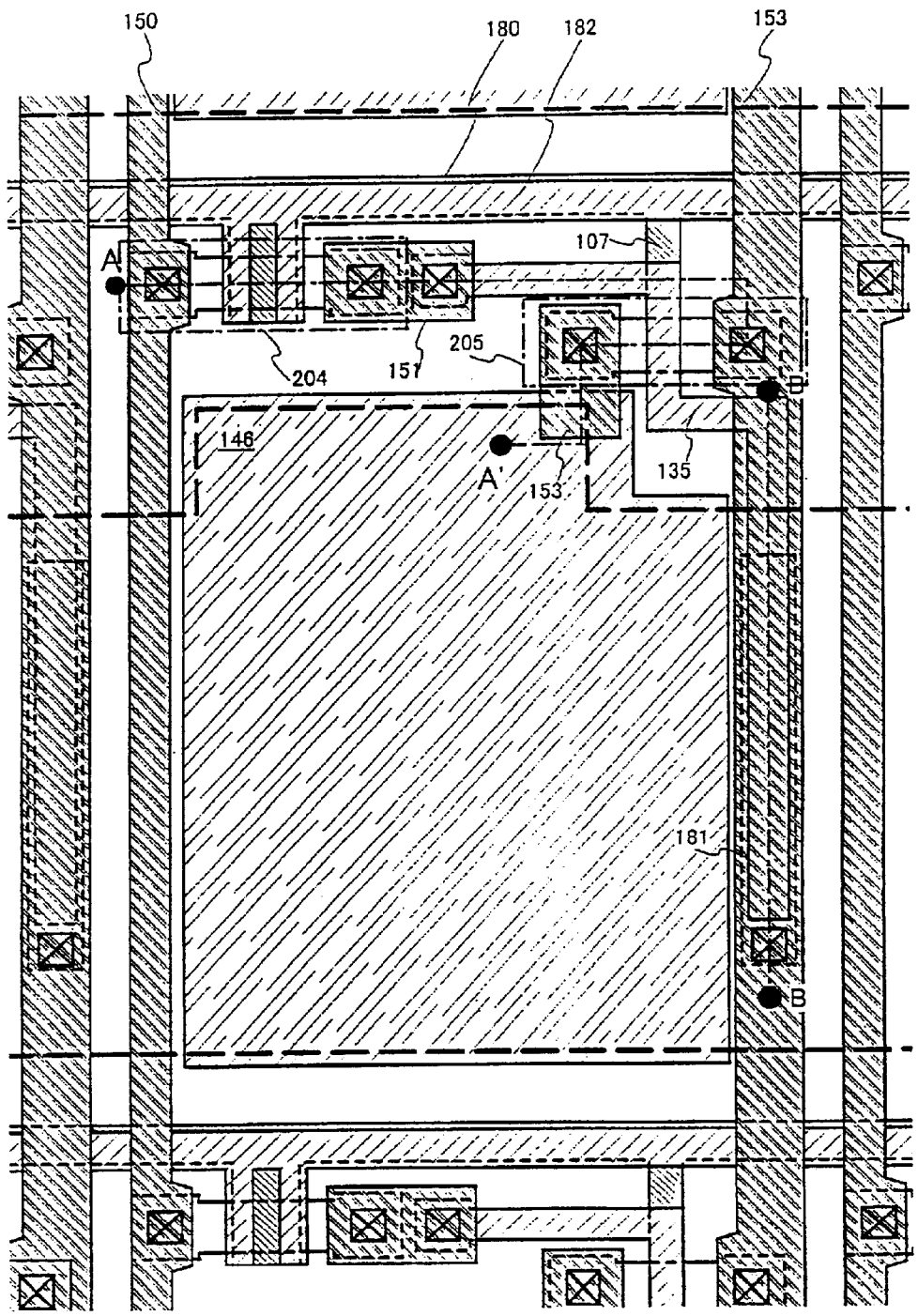
FIG. 10 is a top view for explaining the pixel section in the luminescent device.

FIG. 10 is a top view of the pixel section 201 in the above-stated state. In FIG. 10, the partition layer 170 is formed in a region surrounded by a dashed line.

An active matrix driven type light emitting device shown herein is constituted by arranging organic light emitting elements in a matrix. The organic light emitting element 174 consists of an anode, a cathode and an organic compound layer formed between the anode and the cathode. If the pixel electrode 146 is formed out of a transparent conductive film, the pixel electrode 146 serves as the anode of the light emitting element 174. The organic compound layer is formed out of a combination of a hole transport material having relatively high hole mobility, an electron transport material opposite to the hole transport material, a light emitting material and the like. These materials may be formed into respective layers or mixed with one another.

The organic compound material is formed as thin film layers having a total thickness of about 100 nm. To this end, the surface of the ITO conductive thin film formed as the anode should have improved flatness. If flatness is low, the anode or the ITO film is short-circuited with the cathode formed on the organic compound layer at the worst. As another method for preventing short-circuit, a method of forming an insulating film having a thickness of 1 to 5 nm may be adopted. As the insulating film, a film made of polyimide, polyamide amide, polyamide, acryl or the like can be used. If an opposed electrode (fourth electrode) 172 is formed out of alkali metal such as MgAg or LiF or alkaline-earth metal, the opposed electrode 172 can function as the cathode of the organic light emitting element 174.

The opposed electrode 172 is formed out of a material containing magnesium (Mg), lithium (Li) or calcium (Ca) having a low work function. Preferably, the opposed electrode 172 containing MgAg (a material of mixture of Ag and Mg with a mixture ratio of Mg:Ag=10:1) is used. In addition to the MgAg electrode, an MgAgAl electrode, an LiAl electrode or an LiFAl electrode is available. An insulating film 173 made of silicon nitride or a DLC film is formed on the opposed electrode 172 to have a thickness of 2 to 30 nm, preferably 5 to 10 nm. The DLC film can be formed by the plasma CVD method. Even at a temperature of not higher than 100° C., the DLC film can be formed to cover the end sections of the partition layer 622 with good covering property. The internal stress of the DLC film can be lessened by mixing argon in small quantities into the DLC film. The DLC film can be, therefore, used as a protection film. In addition, the DLC film has high gas barrier property against $CO$, $CO_2$, $H_2O$ and the like as well as oxygen, so that the DLC film is suited as the insulating film 173 which functions as a barrier film.

FIG. 7B is a cross-sectional view taken along line B–B' of FIG. 10. A capacitance is formed in the section in which the first electrode, the first insulating film 112 and the semiconductor film 181 are overlapped with one another. A capacitance is also formed in the section in which the second shape type electrode 135, the second insulating film 130 and the semiconductor film 181 are overlapped with one another.

In this example, the first electrode is connected to the second electrode by the wiring that is formed simultaneously with the source wiring. Alternatively, the first electrode and the second electrode may be directly connected to each other. It is noted, however, that if the first electrode is connected to the second electrode by the wiring that is formed simultaneously with the source wiring as described in the first example, it is unnecessary to increase the number of steps and it is possible to suppress the number of masks.

After air tightness is improved by a processing such as packaging, connectors (flexible print circuits: FPC's) are attached to connect terminals pulled out from the elements or circuits formed on the substrate to external signal terminals, whereby the semiconductor device is completed as a product.

EXAMPLE 2

In this example, the different configuration of the pixels of the light emitting device, which is one example of the semiconductor device according to the present invention from that described in the first example, will be described.

Figure 11:
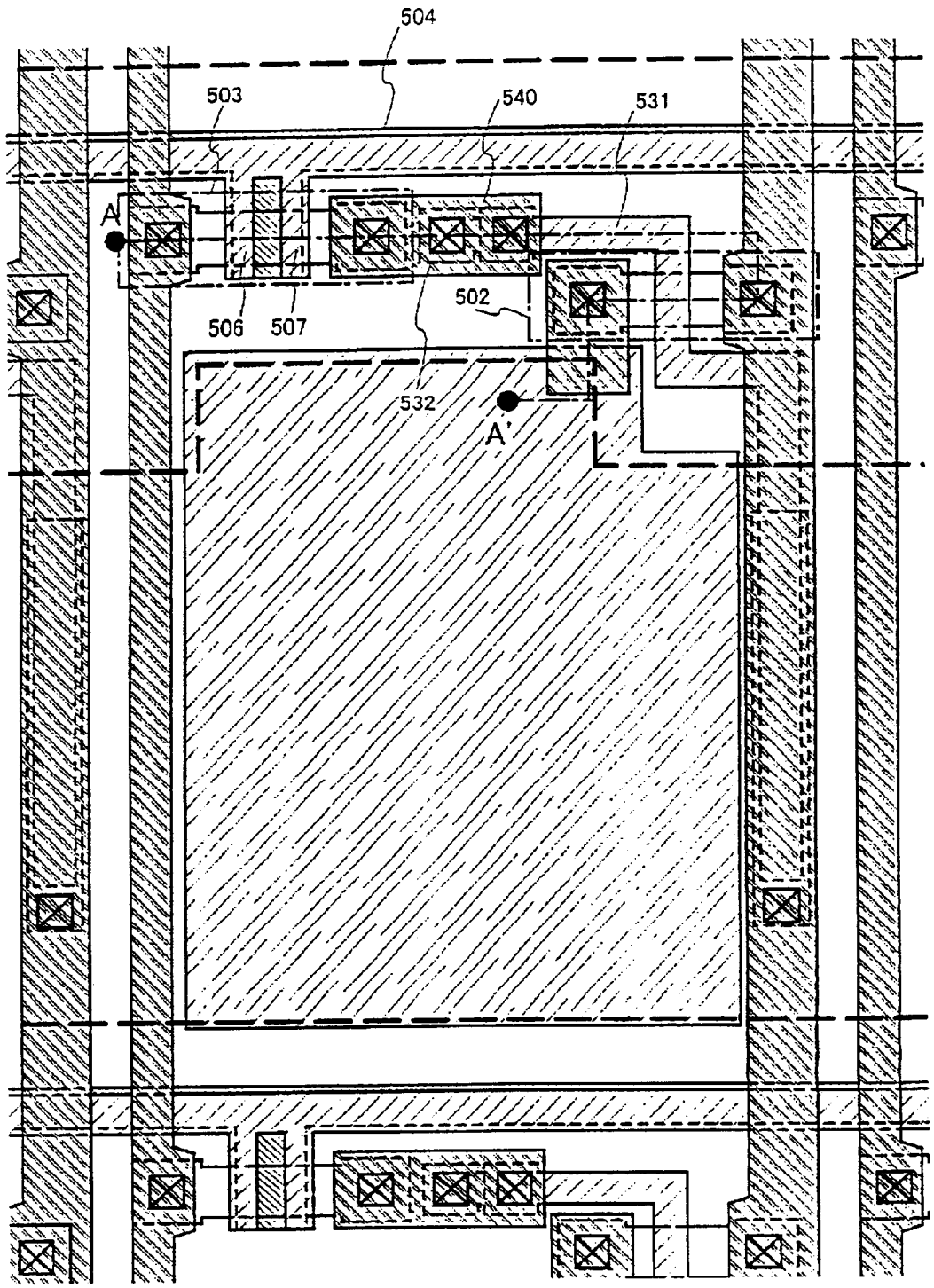
FIG. 11 is a top view for explaining a pixel section in a luminescent device.
Figure 12:
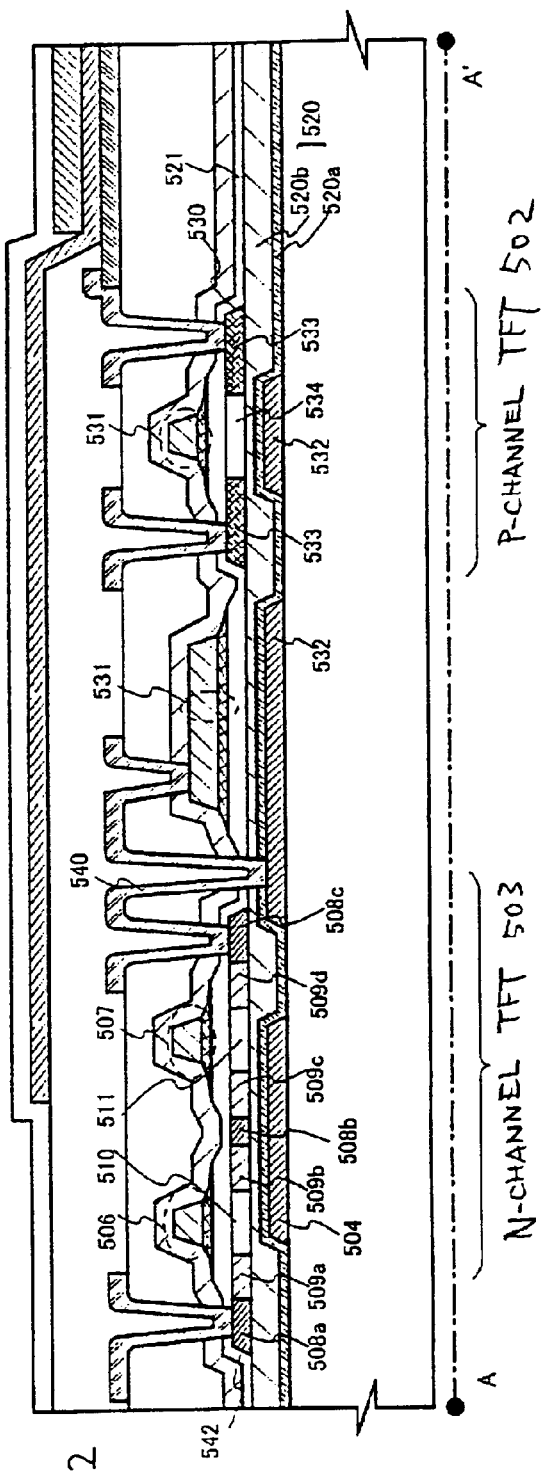
FIG. 12 is a top view for explaining the pixel section in the luminescent device.

FIG. 11 is a top view of the pixels of a light emitting device in this example. FIG. 12 is a cross-sectional view taken along line A–A' of FIG. 11.

Reference symbol 503 denotes an n-channel type TFT, and 502 denotes a p-channel type TFT. Then-channel type TFT 503 has the first structure of the present invention. The n-channel type TFT 503 includes a semiconductor film 542, a first insulating film 520 (520a and 520b), first electrode 504, a second insulating film 521, and second electrodes 506 and 507. The semiconductor film 542 includes a first concentration, one conductive type impurity regions 508a, 508b, 508c, a second concentration, one conductive type impurity regions 509a, 509b, 509c, 509d and channel formation regions 510 and 511.

The first electrodes 504 are overlapped with the channel formation regions 510 and 511, the first concentration, one conductive type impurity region 508b and the second concentration, one conductive type impurity regions 509b and 509c with the first insulating film 520 put therebetween, respectively. In addition, the second electrodes 506 and 507 are overlapped with the channel formation regions 510 and 511 with the second insulating film 521 put therebetween, respectively.

The p-channel type TFT 502 includes a semiconductor film 530, a first insulating film 520, a first electrode 532, a second insulating film 521, and a second electrode 531. The semiconductor film 530 includes a third concentration, one conductive type impurity region 533 and a channel formation region 534.

The first electrode 532 is overlapped with the channel formation region 534 with the first insulating film 520 put therebetween. The second electrode 531 is overlapped with the channel formation region 534 with the second insulating film 521 put therebetween.

The first electrode 532 is electrically connected to the second electrode 531 through a wiring 540.

In this example, a common voltage is applied to the first electrode of the TFT (which corresponds to the n-channel type TFT 501 in this example), which is used as a switching element in the TFT's in the same pixels. By applying the common voltage to the first electrode, it is possible to suppress threshold irregularity and to suppress OFF current compared with the TFT, which includes only one electrode.

Further, on the TFT (which corresponds to the p-channel type TFT 502 in this example) to which high current is carried than that of the TFT used as a switching element, the first electrode is electrically connected to the second electrode. By applying the same voltage to the first and second electrodes, the spread of a depletion layer is accelerated substantially as in the case of making the thickness of the semiconductor film thin. It is, therefore, possible to lower the sub-threshold coefficient and to improve the field effect mobility. It is thus possible to increase ON current compared with the TFT, which includes one electrode. As a result, by using the TFT having this structure in the driving circuit, it is possible to decrease driving voltage. In addition, since ON current can be increased, it is possible to make the TFT smaller in size (channel width thereof can be particularly made smaller). It is thus possible to improve the integration density of the semiconductor device.

EXAMPLE 3

Figure 15:
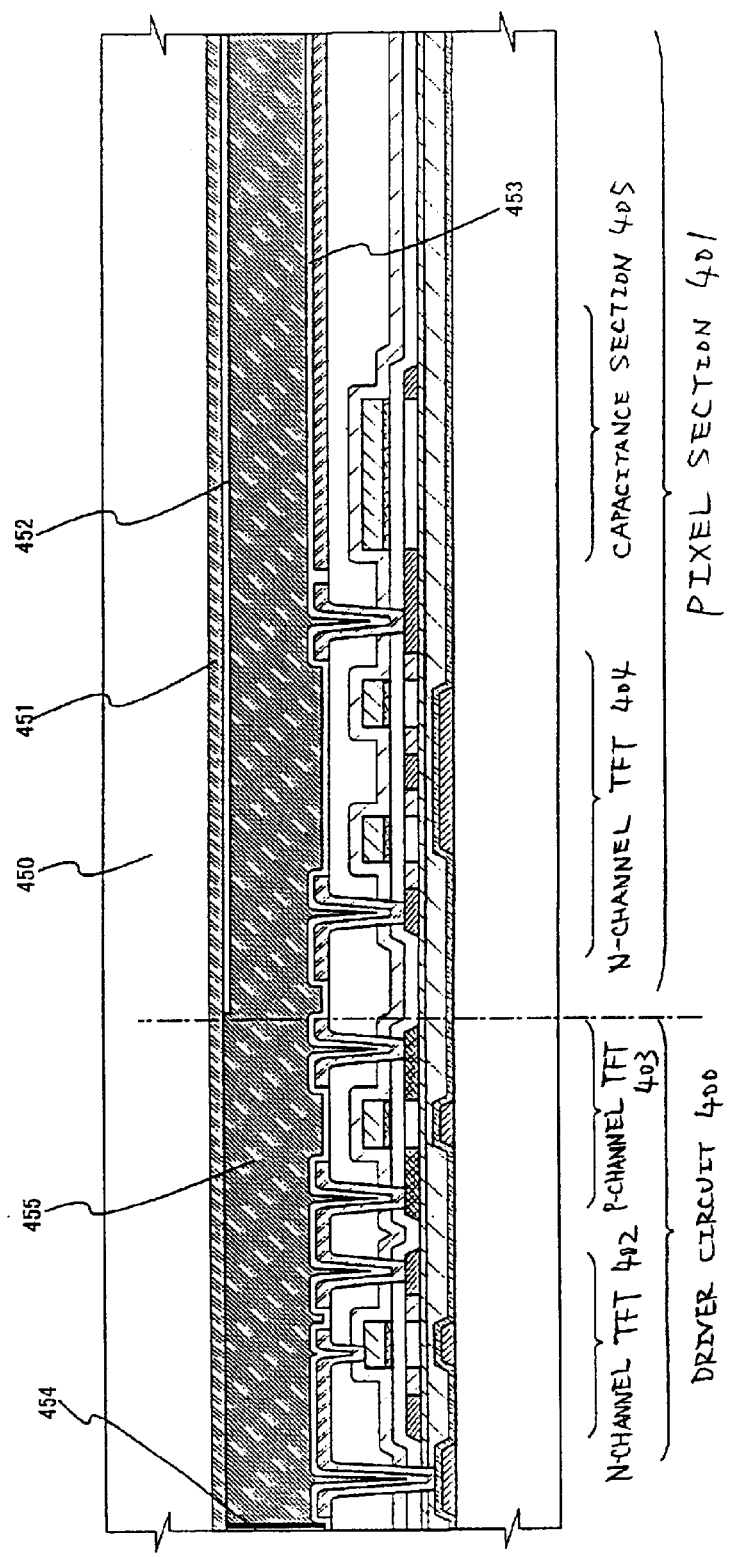
FIG. 15 is a sectional view for explaining the structure of the liquid crystal display device.

Another example of the present invention will be described, referring to drawings. One example of the structure of a pixel structure and a driving circuit suitable for a liquid crystal display device will be described. FIGS. 13, 14 and 15, which are referred to in this example, are sectional views for explaining the process of the manufacture thereof. FIGS. 16 and 17 are top views corresponding thereto. In the following description, common reference numbers are used for convenience.

Figure 16A:
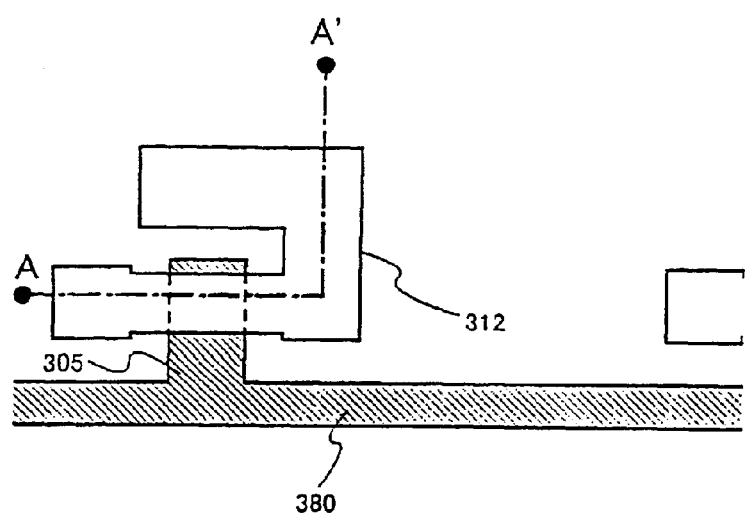
FIGS. 16A and 16B are top views for explaining the steps of manufacturing the pixel section in the liquid crystal display device.

In FIG. 13A, electrodes 303 to 305 and the first wiring 302 are formed on the substrate 301 in the same way as in Example 1. Then, the first insulating film 307 is formed. In this example, three layers insulating films (the first insulating film A 307a, the first insulating film B 307b and the first insulating film C 307c) are laminated to use as the first insulating film 307. First, a first insulating film A 307a of a silicon oxynitride film is formed to have a thickness of 50 nm. A silicon oxide film made by TEOS is used to form a second insulating film B 307b of 1 μm thickness. The surface is made flat by CMP, and subsequently a silicon oxynitride film is formed as a third insulating film C 307c, to produce a three-layer structure. Needless to say, the insulating film in FIG. 13 is not limited to this structure, the same structure as in Example 1 may be used. The semiconductor films 310 to 312 divided into island shapes are formed in the same way as in Example The top view of the state shown in FIG. 13A is illustrated in FIG. 16A. The cross-sectional view taken along the line A–A' in FIG. 16A correspond to the view in FIG. 13A. The first electrode 305 is included in a part of the common wiring 380.

Next, as illustrated in FIG. 13B, a second insulating film 312 covering semiconductor films 308 to 310 is formed. The second insulating film 312 is made of an insulator containing silicon by plasma CVD or sputtering. The thickness thereof is from 40 to 150 nm.

Second electrodes 313 to 317 are formed thereon. The material of the second wiring is not limited, and the electrodes are composed of a first layer made of a nitride of a high melting point metal such as molybdenum or tungsten, and a high melting point metal, a low-resistance metal such as aluminum or copper, polysilicon or the like, which is formed on the first layer. Specifically, for the first layer a nitride of one or more selected from W, Mo, Ta and Ti is selected, and for the second layer an alloy of one or more selected from W, Mo, Ta, Ti, Al and Cu, or an n-type polycrystalline silicon is used.

Figure 16B:
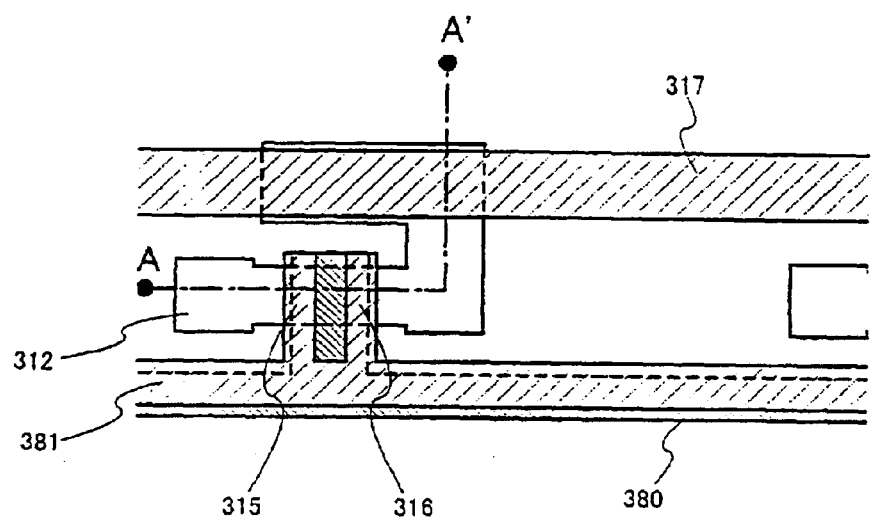

The top view in FIG. 13B is shown in FIG. 16B. The second electrode 315 and the second electrode 316 are included in a part of the gate wiring 381. The second electrode 315 and the second electrode 316 are overlapped with the first electrode 305 respectively via the first insulating film 307, the semiconductor film 310 and the second insulating film 312.

Therefore, the impurity regions are formed in the respective semiconductor films by ion doping in the same way as in Example 1. Furthermore, heat treatments for activation and hydrogenation are performed. In the heat treatments, it is advisable to use the RTA method in a gas-heating manner.

A passivation film 318 made of a silicon nitride film and a third insulating film 319 made of an organic resin material such as acrylic, polyimide, polyamide, and polyimide amide are formed. The passivation film 318 may be as a part of the third insulating film 319. The surface of the third insulating film is desirably made flat by CMP. Thereafter, openings are made and then wirings 320 to 323 and a pixel electrode 324 are formed.

In this way, a driving circuit section 400 having an n-channel type TFT 402 and a p-channel type TFT 403 and a pixel section 401 having an n-channel type TFT 404 and a capacitor portion 405 are formed.

In the n-channel type TFT 402 of the driving circuit section 400, a semiconductor film 308 has a channel formed region 330. The channel formed region 330 is overlapped with the first electrode 303 via the first insulating film 307. The channel formed region 330 is overlapped with the second electrode 313 via the second insulating film 312. Further, not shown in the figure, the first wiring 302 is connected to the first electrode 303, and the wiring 320 is connected to the first wiring 302 and the second electrode 313. A one-conductive type impurity region 334 having a second concentration functions as an LDD, and a one-conductive type impurity region 335 having a first concentration functions as a source or drain region. The length, in the channel length direction, of the LDD is from 0.5 to 2.5 µm, preferably 1.5 µm. A main purpose of such a structure of the LDD is to prevent deterioration of the TFTs based on hot carrier effect.

In the p-channel type TFT 403, the semiconductor film 308 has a channel formed region 331. The channel formed region 331 is overlapped with the first electrode 304 via the first insulating film 307. The channel formed region 331 is overlapped with the second electrode 314 via the second insulating film 350. An impurity region 336 of a conductive type reverses to the one-conductive type, which has a third concentration, functions as a source or drain region.

The n-channel type TFT 402 and the p-channel type TFT 403 can constitute a shift register circuit, a buffer circuit, a level shifter circuit, a latch circuit or the like. The structure of the first n-channel type TFT 402 is particularly suitable for a buffer circuit having a high driving voltage, in order to prevent the deterioration based on hot carrier effect.

The present invention can be applied to a circuit made basically of an NMOS or a PMOS, as well as a circuit made of the CMOS.

The n-channel type TFT 404 of the pixel section 401 has a first structure. In the n-channel TFT 404 of the pixel section 401, the semiconductor film 310 has the channel formed regions 332 and 340. The first electrode 305 is overlapped with the second electrode 315 via the channel formed region 332. The first electrode 305 is overlapped with the second electrode 316 via the channel formed region 340. A one-conductive type impurity region 337 (337a, 337b, 337c and 337d) having the second concentration functions as an LDD, and a one-conductive type impurity region 338 (338a, 338b and 338c) having the first concentration functions as a source or drain region. This n-channel type TFT 404 is in a form wherein two TFTs are connected to each other in series so as to sandwich the one-conductive type impurity region having the first concentration.

The first electrode 305 is overlapped with the channel formation regions 332 and 340, the one-conductive type impurity region 338b having the first concentration and the one-conductive type impurity region 337b and 337c of the second concentration.

In the pixel section 401, a capacitor section connected to the n-channel type TFT 404 is composed of the semiconductor film 310, the second insulating film 312, and a second electrode 317.

FIG. 17 illustrates a top view of the pixel section shown in FIG. 14A. Line A–A' corresponds to FIG. 14A. Line B–B' corresponds to FIG. 14B.

As described above, in the present invention, a pair of electrodes is formed to sandwich a semiconductor film, whereby the thickness of the semiconductor film is made substantially half and further depletion advances rapidly with the application of voltage to increase electric field effect mobility. The sub-threshold coefficient can be made low.

After the formation of the structure illustrated in FIG. 14A, an oriented film 453 is formed and subjected to rubbing treatment, as illustrated in FIG. 15. Before the formation of the oriented film 453, columnar spacers for keeping a substrate interval may be formed at desired positions by patterning an organic resin film such as an acrylic resin film, which is not illustrated. Spherical spacers may be scattered onto the entire surface of the substrate, instead of the columnar spacers.

Next, a counter electrode 451 is formed on a counter substrate 450. An oriented film 452 is formed thereon and subjected to rubbing treatment. The counter electrode 451 is made of ITO. A counter substrate 450 on which a seal pattern 454 is formed is adhered thereto. Thereafter, a liquid crystal material 455 is injected into the space between both of the substrates, and then the space is completely sealed with a sealant (not illustrated). As the liquid crystal material, any known liquid crystal material may be used. In this way, an active matrix driving type liquid crystal display device illustrated in FIG. 15 is completed.

This example can be implemented by being freely combined with the third example.

EXAMPLE 4

In the fourth example, a case of manufacturing a semiconductor film by a different method from that in the first example will be described.

In FIG. 18A, reference symbol 6000 denotes a substrate which includes an insulating surface. In FIG. 18A, a glass substrate, a quartz substrate, a ceramic substrate or the like can be used as the substrate 6000. Alternatively, a substrate such as a silicon substrate, a metal substrate or a stainless substrate having an insulating film formed on the surface thereof may be used. It is also possible to use a plastic substrate having heat resistance against the treatment temperature in the steps of this example.

As shown in FIG. 18A, first electrode 6002 are first formed on the substrate 6000. The first electrode 6002 may be formed out of a conductive substance. Typically, the first electrode 6002 can be formed out of alloy or a compound consisting of one or a plurality of elements selected from among aluminum (Al), tungsten (W), molybdenum (Mo), tantalum (Ta) and titanium (Ti). Alternatively, Layered conductive films may be used as the first electrodes.

A first insulating film 6001 is formed on the insulating surface of the substrate 6000 to cover the first electrode 6002. The first insulating film 6001 is formed out of a silicon oxide film, a silicon nitride film, a silicon oxide nitride film ($SiO_xN_y$) or the like. As a typical example, a film having a two-layer structure in which a first silicon oxide nitride film formed using $SiH_4$, $NH_3$ and $N_2O$ as reaction gas and having a thickness of 50 to 100 nm and a second silicon oxide nitride film formed using $SiH_4$ and $N_2O$ as reaction gas and having a thickness of 100 to 150 nm are layered, is used as the first insulating film 6001. It is also preferable that a silicon nitride film (SiN film) or the second silicon oxide nitride film ($SiN_xO_y$ film, where X>>Y) is used as one layer of the first insulating film. During gettering, nickel tends to move toward a region having a high oxygen concentration. It is, therefore, quite effective to use the silicon nitride film as the first insulating film which contacts with the semiconductor film. Alternatively, a film having a three-layer structure in which a first silicon oxide nitride film, a second silicon oxide nitride film and a silicon nitride film are sequentially layered may be used as the first insulating film 6001.

Next, a first semiconductor layer 6003 having an amorphous structure is formed on the first insulating film 6001. A semiconductor material mainly containing silicon is used to form the first semiconductor layer 6003. Typically, an amorphous silicon film or an amorphous silicon germanium film is used as the first semiconductor layer 6003. The first semiconductor layer 6003 is formed to have a thickness of 10 to 100 nm by the plasma CVD method, a low pressure CVD method or a sputtering method. It is preferable that the concentration of impurities such as oxygen and nitrogen contained in the film of the first semiconductor layer 103 having an amorphous structure, is decreased to not higher than $5 \times 10^{18}/cm^3$ (atom concentration measured by secondary ion mass spectroscopy). These impurities prevent later crystallization and, even after the crystallization, increase the density of a trapping center or recombination center. For these reasons, it is preferable to use not only high impurity material gas but also use an extreme high vacuum CVD system which includes a mirror treatment (field polishing) reaction chamber or an oil-free evacuation system.

Next, to crystallize the first semiconductor layer 6003 having an amorphous structure, a technique described in Japanese Patent Unexamined Application Publication No. 8-78329 is employed in this example. The technique described therein is for selectively adding a metal element, which accelerates crystallizing an amorphous silicon film, carrying out a heat treatment, and thereby forming a semiconductor layer having a crystal structure spreading from the metal element added regions. A nickel acetate solution which contains a metal element (nickel in this example) of 1 to 100 ppm in weight terms, which has a catalytic action for accelerating crystallization, is coated on the surface of the first semiconductor layer 6003 having an amorphous structure by a spinner to thereby form a nickel containing layer 6004 (FIG. 18B). Instead of the coating means, a means for forming a very thin film by sputtering, deposition or plasma treatment may be used to form the nickel containing layer 6004. While an example of coating the nickel acetate solution on the entire surface of the first semiconductor layer 6003 is shown in this example, it is also possible to form a mask and to selectively form a nickel containing layer using the mask.

Next, a heat treatment is carried out for crystallization. In this case, silicide is formed in the sections of the semiconductor layer contacted by the metal element, which accelerates the crystallization of the semiconductor and crystallization progresses while centering around the silicide. As a result, the first semiconductor layer 6005 having an amorphous structure shown in FIG. 18C is formed. It is preferable that the concentration of oxygen contained in the first semiconductor layer 6005 thus crystallized is set at not higher than $5 \times 10^{18}/cm^3$. In this example, after a heat treatment (at 450° C. for 1 hour) for dehydrogenation, the heat treatment (at 550 to 650° C. for 4 to 24 hours) for crystallization is carried out. If crystallization is conducted by the irradiation of strong light, one of infrared light, visible light and ultraviolet light or a combination thereof can be used. Typically, light radiated from a halogen lamp, a metal halide lamp, a xenon arc lamp, a carbon arc lamp, a high pressure sodium lamp or a high pressure mercury lamp is used. The lamp light source is turned on for 1 to 60 seconds, preferably 30 to 60 seconds one to ten times so as to instantaneously heat the semiconductor layer up to about 600 to 1000° C. If necessary, a heal treatment for discharging hydrogen contained in the first semiconductor layer 6005 of the amorphous structure before the strong light is applied to the first semiconductor layer 6005 may be carried out. Alternatively, the heat treatment and the strong light irradiation may be conducted simultaneously. In light of productivity, it is preferable to crystallize the semiconductor by the irradiation of strong light.

The metal element (nickel in this example) remains in the first semiconductor layer 6005 thus obtained. The metal element remains at a mean concentration higher than $1 \times 10^{19}/cm^3$ even if they are not uniformly distributed in the film. Although it is possible to form various semiconductor elements including TFT's even in such a state, the element is removed by the following method in this example.

To enhance a crystallization rate (the rate of crystal components in the entire product of the film) and to repair defects left in crystal grains, a laser beam (first laser beam) is applied to the first semiconductor layer 6005 having an amorphous structure in the atmosphere or in an oxygen atmosphere. If the laser beam (first laser beam) is applied to the first semiconductor layer 6005, irregularities are formed on the surface thereof and a thin oxide film 6006 is formed (FIG. 18D). This laser beam (first laser beam) may be an excimer laser beam having a wavelength of not less than 400 nm or the second and third higher harmonic waves of the YAG laser. Alternatively, a beam emitted from an ultraviolet lamp may be used in place of the excimer laser beam.

Furthermore, an oxide film (referred to as "chemical oxide") is formed using an ozone containing aqueous solution (typically ozone water) to thereby form a barrier layer 6007 which consists of the oxide film and has a total thickness of 1 to 10 nm. A second semiconductor layer 6008 containing a rare gas element is formed on this barrier layer 6007 (FIG. 18E). In this example, the oxide film 6006 formed as a result of the application of the laser beam to the first semiconductor layer 6005 having a crystal structure is regarded as a part of the barrier layer. This barrier layer 6007 functions as an etching stopper when only the second semiconductor layer 6008 is selectively removed in a later step. Even if an aqueous solution in which sulfuric acid, hydrochloric acid, nitric acid or the like is mixed with oxygenated water, in place of the ozone containing aqueous solution is used, the chemical oxide can be formed. Alternatively, as another method of forming the barrier layer 6007, ultraviolet rays may be irradiated to the first semiconductor layer 6005 having a crystal structure in an oxygen atmosphere to thereby generate ozone and to oxidize the surface of the first semiconductor layer 6005. As yet another formation method, the barrier layer 6007 may be formed by depositing an oxide film having a thickness of about 1 to 10 nm by the plasma CVD method, the sputtering method, the deposition method or the like. Further, as still another method, a thin oxide film may be formed as the barrier layer 6007 by heating the first semiconductor layer 6005 up to about 200 to 350° C. in a clean oven. Although the barrier layer 6007 is not limited to any specific layer as long as the barrier layer 6007 is formed by any one of the above-stated methods or a combination thereof, it is necessary that the barrier layer 6007 has a sufficient film property or thickness to enable nickel contained in the first semiconductor layer 6005 to move to the second semiconductor layer 6008 in a later gettering step.

In this example, the second semiconductor layer 6008 containing a rare gas element is formed by the sputtering method and a gettering site is formed (FIG. 18E). It is preferable that sputter conditions are appropriately adjusted so as not to add the rare gas element to the first semiconductor layer 6005. As the rare gas element, one or a plurality of elements selected from among helium (He), neon (Ne), argon (Ar), krypton (Kr) and xenon (Xe) are employed. Among them, argon (Ar) that is inexpensive gas, is preferable. In this example, a target which consists of silicon is used in a rare gas element containing atmosphere to form the second semiconductor layer 6008. There are two meanings to contain rare gas element ions as inert gas ions in the film. One is to form dangling bonds so as to distort the semiconductor layer. The other is to generate distortions between the lattices of the semiconductor layer. The distortions between the lattices of the semiconductor layer are generated conspicuously when an element, such as argon (Ar), krypton (Kr) or xenon (Xe), larger than silicon in atomic diameter is used. Further, by containing the rare gas element in the film, not only lattice distortions but also unpaired bonds are formed, contributing to the gettering action.

Furthermore, if the second semiconductor layer 6008 is formed using a target containing phosphorus which is a one conductive type impurity element, not only gettering by the rare gas element but also gettering using the Coulomb force of phosphorus can be conducted.

In addition, since nickel tends to move to a region having a high oxygen concentration during the gettering, it is preferable that the concentration of oxygen contained in the second semiconductor layer 6008 is set higher than that of oxygen contained in the first semiconductor layer 6005, e.g., not lower than $5 \times 10^{18}/cm^3$.

Thereafter, a heat treatment is carried out to conduct gettering for decreasing the concentration of the metal element (nickel) in the first semiconductor layer 6005 or removing the metal element (nickel) (FIG. 18F). As the heat treatment for the gettering, a treatment for applying strong light or an ordinary heat treatment may be conducted. As a result of this gettering, the metal element moves in an arrow direction shown in FIG. 18F (i.e., a direction from the substrate side to the surface of the second semiconductor layer 6008), thereby removing the metal element contained in the first semiconductor layer 6005 or decreasing the concentration of the metal element. The moving distance of the metal element during the gettering may be at least the same as the thickness of the first semiconductor layer 6005. With such a distance, it is possible to complete the gettering in relatively short time. In this example, nickel is entirely moved to the second semiconductor layer 6008 so as not to segregate nickel in the first semiconductor layer 6005. As a result, nickel is hardly contained in the first semiconductor layer 6005. Namely, gettering is sufficiently conducted so that the nickel concentration of the film becomes not higher than $1 \times 10^{18}/cm^3$, preferably not higher than $1 \times 10^{17}/cm^3$.

Furthermore, depending on the conditions of this gettering heat treatment, enhancing the crystallization rate of the first semiconductor layer 6005 and to repair the defects left in crystal grains is possible, i.e., to improve crystallinity simultaneously with the gettering.

In this specification, gettering means that a metal element in a gettering target region (corresponding to the first semiconductor layer 6005 in this example) is discharged by heat energy and diffused, thereby the metal element is moved to a gettering site. Accordingly, the gettering depends on treatment temperature, which follows that the gettering can be conducted in shorter time as the treatment temperature is higher.

In addition, if a strong light irradiation treatment is used as the heat treatment for this gettering, a lamp light source for heating is turned on for 1 to 60 seconds, preferably 30 to 60 seconds repeatedly one to ten times, preferably two to six times. The light emitting intensity of the lamp light source may be arbitrarily set. However, it is necessary to set the light emitting intensity thereof so that the semiconductor layer is instantaneously heated up to about 600 to 1000° C., preferably about 700 to 750° C.

Additionally, if the gettering is conducted by a heat treatment, the heat treatment may be carried out at a temperature of 450 to 800° C. for 1 to 24 hours, e.g., at 550° C. for 14 hours in a nitrogen atmosphere. Alternatively, strong light may be irradiated to the semiconductor layer in addition to the heat treatment.

Next, using the barrier layer 6007 as an etching stopper, only the second semiconductor layer denoted by the reference symbol 6006 is removed and then the barrier layer 6007 consisting of the oxide film is removed. As a method of selectively etching only the second semiconductor layer, dry etching using $ClF_3$ without using plasma or wet etching using an alkali solution such as an aqueous solution containing hydrazine or tetraethyl ammonium hydroxide (expressed by a chemical formula $(CH_3)_4NOH$) can be conducted. In addition, if the nickel concentration of the surface of the barrier layer is measured by TXRF after removing the second semiconductor layer, the nickel concentration is detected to be high. It is, therefore, preferable to remove the barrier layer using fluorine containing etchant.

Next, a laser beam (second laser beam) is applied to the first semiconductor layer 6005 having a crystal structure either in a nitrogen atmosphere or in vacuum. If the laser beam (second laser beam) is irradiated, the difference in level (P-V value: Peak to Valley value; difference in height between maximum and minimum) among the irregularities formed by the irradiation of the first laser beam is decreased, i.e., the surface is flattened (FIG. 18G). The P-V value of the irregularities may be observed with an AFM (atomic force microscope). Specifically, the P-V value of the irregularities formed by the irradiation of the first laser beam of about 10 nm to 30 nm can be decreased to not lower than 5 nm by the irradiation of the second laser beam. Depending on the conditions, the P-V value can be decreased to not lower than 1.5 nm. As this laser beam (second laser beam), an excimer laser beam having a wavelength of not more than 400 nm or the second and third higher harmonic waves of the YAG laser can be employed. Alternatively, a light beam emitted from a ultraviolet lamp may be used in place of the excimer laser beam.

The energy density of the second laser beam is set higher than that of the first laser beam, preferably higher than that of the first laser beam by 30 to 60 mJ/cm$^2$. It is noted, however, if the energy density of the second laser beam is higher than that of the first laser beam by 90 mJ/cm$^2$ or more, surface roughness tends to increase and crystallinity tends to deteriorates or crystal grains tend to be transformed to crystallites, thereby deteriorating the characteristics of the first semiconductor layer.

Although the energy density of the second laser beam is higher than that of the first laser beam, the crystallinity of the semiconductor layer hardly changes before and after the irradiation. In addition, crystal states such as grain diameters hardly change. In other words, it is considered that the irradiation of the second laser beam is intended only to flatten the surface of the semiconductor layer.

The flattening of the semiconductor layer having a crystal structure by the irradiation of the second laser beam possesses high merit. For example, by improving the flatness of the semiconductor layer, it is possible to make the second insulating film to be formed in a later step as a gate insulating film thinner and to thereby improve the mobility of the TFT. In addition, by improving the flatness, it is possible to decrease OFF current in the manufacturing of the TFT.

Furthermore, the irradiation of the second laser beam has an advantage in that if the rare gas element is inadvertently added to the first semiconductor layer when the gettering site is formed, the rare gas element in the semiconductor layer having a crystal structure can be removed or decreased.

Next, using a well-known patterning technique, the first semiconductor layer 6009 thus flattened is patterned to thereby form a semiconductor film having a desired shape.

This example can be carried out in free combination with the first to third examples.

EXAMPLE 5

In the fifth example, a case of forming a semiconductor film by a thermal crystallization method using a catalytic element.

If the catalytic element is used, it is preferable to use the technique disclosed in Japanese Patent Unexamined Application Publication No. 7-130652 or 8-78329.

Figure 19A:
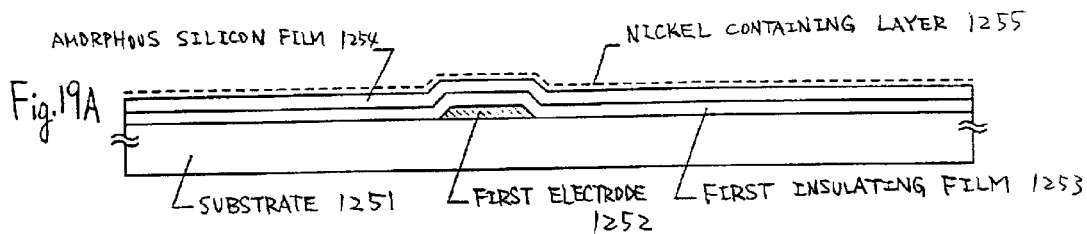
FIGS. 19A and 19B are views showing the steps of the crystallization of a semiconductor layer.
Figure 19B:
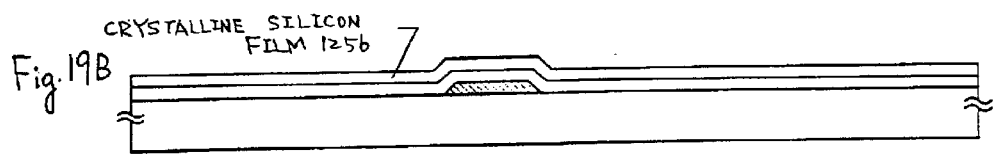

A case of applying the technique disclosed in Japanese Patent Unexamined Application Publication No. 7-130652 to the present invention will first be described with reference to FIGS. 19A and 19B. First, a first electrode 1252 is formed on a substrate 1251. A first insulating film 1253 is then formed on the substrate 1251 to cover the first electrode 1252, and an amorphous silicon film 1254 is formed on the first insulating film 1253. Further, a nickel acetate solution containing nickel of 10 ppm in weight terms is coated on the resultant substrate to thereby form a nickel containing layer 1255 (FIG. 19A).

Next, after a dehydrogenation step at a temperature of 500° C. for 1 hour, a heat treatment is conducted at a temperature of 500 to 650° C. for 4 to 12 hours, e.g., at 550° C. for 8 hours, thereby forming a crystalline silicon film 1256. The crystalline silicon film 1256 thus obtained exhibits excellent crystallinity (FIG. 19B).

Meanwhile, according to the technique disclosed in Japanese Patent Unexamined Application Publication No. 8-78329, an amorphous semiconductor film can be selectively crystallized by selectively adding a catalytic element thereto. A case of applying this technique to the present invention will be described with reference to FIGS. 20A and 20B.

First, a first electrode 1302 is formed on a glass substrate 1301. A first insulating film 1303 is formed on the substrate 1301 to cover the first electrode 1302, and an amorphous silicon film 1304 is formed on the first insulating film 1303. A silicon oxide film 1305 is continuously formed on the amorphous silicon film 1304. At this moment, the thickness of the silicon oxide film 1305 is 150 nm.

Figure 20A:
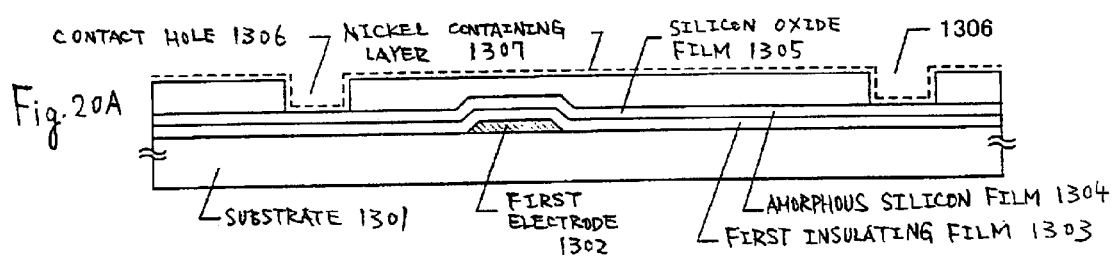
FIGS. 20A and 20B are views showing the steps of the crystallization of a semiconductor layer.

Next, the silicon oxide film 1305 is patterned to thereby selectively form contact holes 1306 and a nickel acetate solution containing nickel of 10 ppm in weight terms is coated on the resultant substrate. As a result, a nickel containing layer 1307 is formed. The nickel containing layer 1307 contacts with the amorphous silicon film 1304 only at the bottoms of the contact holes 1306 (FIG. 20A).

Figure 20B:
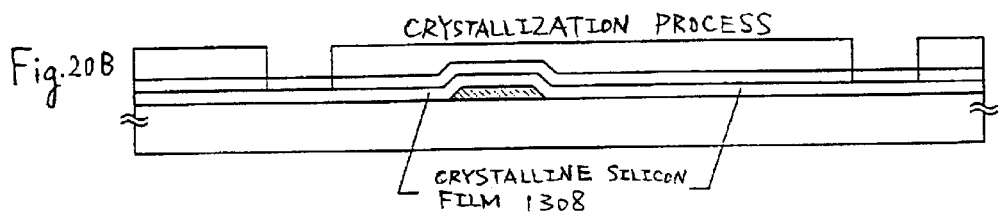

Thereafter, a heat treatment is carried out at a temperature of 500 to 650° C. for 4 to 24 hours, e.g., at 570° C. for 14 hours, thereby forming a crystalline silicon film 1308. In this crystallization process, parts of the amorphous silicon film 1304 which contact with nickel are first crystallized and the crystallization proceeds therefrom in lateral direction. The crystalline silicon film 1308 thus formed is constituted so that stick-like or needle-like crystals are collected together. Since each crystal grows with a certain directivity macroscopically, the crystalline silicon film 1308 is advantageous of having uniform crystallinity (FIG. 20B).

The catalytic element available in the above-stated two techniques may be germanium (Ge), iron (Fe), palladium (Pd), tin (Sn), lead (Pb), cobalt (Co), platinum (Pt), copper (Cu) or gold (Au) in place of nickel (Ni).

By forming the crystalline semiconductor film (including a crystalline silicon film and a crystalline silicon germanium film) using one of the above-stated techniques and patterning the crystalline semiconductor film, a semiconductor layer of a crystalline TFT can be formed. Although the TFT formed out of the crystalline semiconductor film by the technique described in this example exhibits excellent characteristics, it is required to ensure high reliability, accordingly. Nevertheless, by adopting the TFT structure of the present invention, it is possible to manufacture a TFT while making the most use of the technique in this example.

Next, a case of executing steps of forming a crystalline semiconductor film using an amorphous silicon film as an initial film and using the catalytic element stated above, and then removing the catalytic element from the crystalline semiconductor film, will be described with reference to FIGS. 21A and 21B. In this example, the steps are executing using the technique described in Japanese Patent Unexamined Application Publication No. 10-135468 or 10-135469.

The technique described therein is for removing a catalytic element used to crystallize an amorphous semiconductor film using the gettering action of phosphorus after the crystallization. By utilizing this technique, it is possible to decrease the concentration of the catalytic element in the crystalline semiconductor film to lower than $1 \times 10^{17}$ atms/cm$^3$, preferably $1 \times 10^{16}$ atms/cm$^3$.

In this example, a no-alkali glass substrate represented by a 1737 substrate manufactured by Corning Inc. is used as a substrate 1401. As shown in FIG. 21A, a first electrode 1402 is formed on the substrate 1401. A first insulating film 1403 is formed on the substrate 1401 to cover the first electrode 1402 and a crystalline silicon film 1404 is formed on the first insulating film 1403.

A silicon oxide film 1405 having a thickness of 150 nm is formed on the surface of the crystalline silicon film 1404 as a mask, contact holes are formed by patterning and regions in which part of the crystalline silicon film 1404 is exposed are provided. Thereafter, a step of adding phosphorus is executed to thereby provide a region (gettering region) 1406 in which phosphorus is added to the crystalline silicon film 1404.

In this state, if a heat treatment is carried out at a temperature of 550 to 800° C. for 5 to 24 hours, e.g., 600° C. for 12 hours in a nitrogen atmosphere, the region 1406 in which phosphorus is added to the crystalline silicon film 1404 acts as a gettering site, making it possible to segregate the catalytic element remaining in the crystalline silicon film 1404 to the gettering region 1406 in which phosphorus is added to the crystalline silicon film 1404.

The oxide silicon film 1405 serving as a mask and the phosphorus-added region 1406 are etched away, whereby the crystalline silicon film having the concentration of the catalytic element, used in the crystallization step, decreased to $1 \times 10^{17}$ atms/cm$^3$ can be obtained. This crystalline silicon film can be used as the semiconductor layer of the TFT according to the present invention as it is.

This example can be carried out in free combination with the first to fourth examples.

EXAMPLE 6

In the sixth example, the configuration of the semiconductor device according to the present invention will be described.

Figure 22:
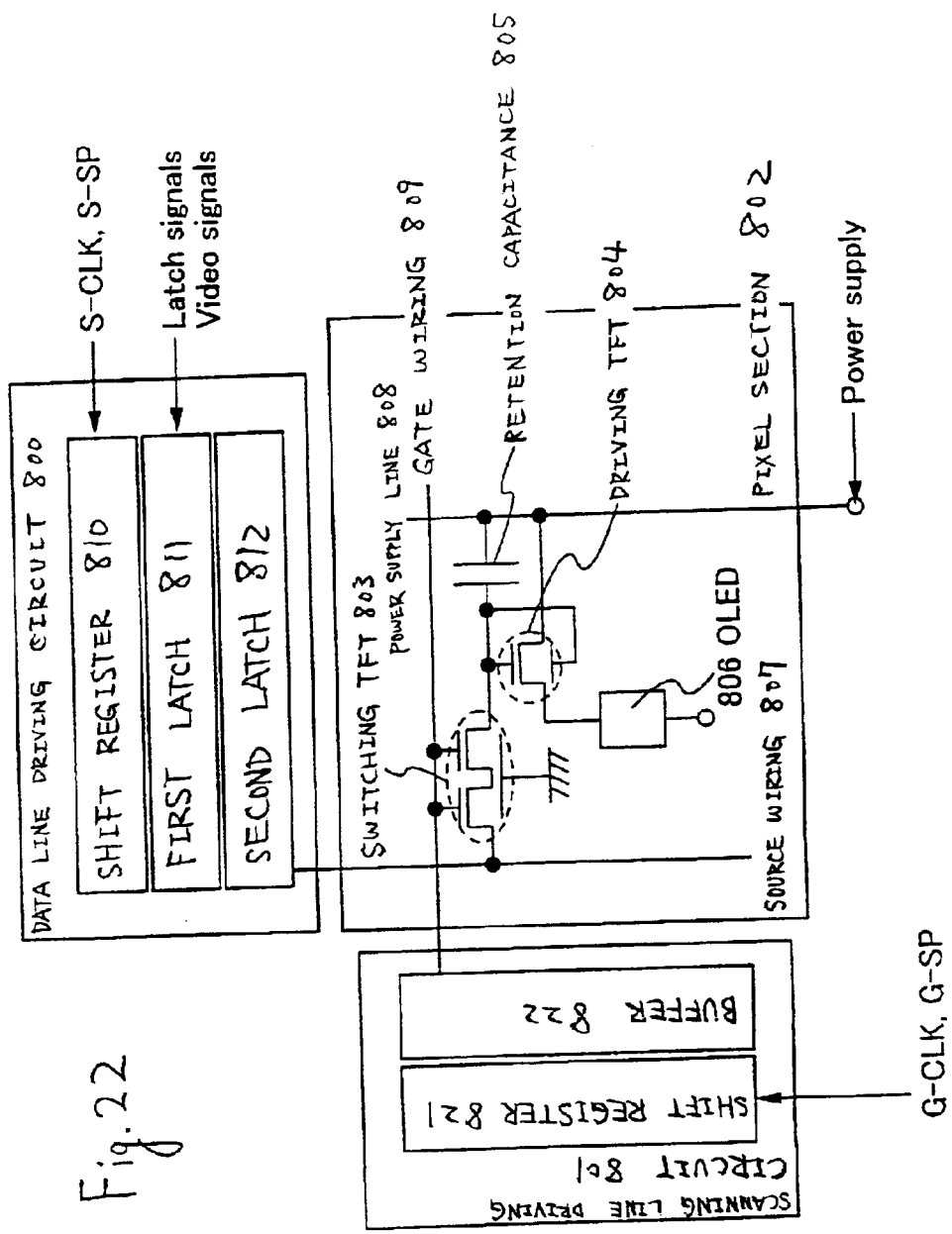
FIG. 22 is a block diagram of the structure of a luminescent device.

FIG. 22 is a block diagram of a light emitting device which is one example of the semiconductor device according to the present invention. The light emitting device corresponds to an OLED (organic light emitting device) panel having an OLED, which is formed on a substrate, sealed between the substrate and a cover material. An OLED module in which IC's and the like including a controller are mounted on the OLED panel is sometimes referred to as a light emitting device.

The OLED includes a layer containing an organic compound (organic light emitting material) which causes electro luminescence which occurs by applying an electric field to the organic compound, an anode layer and a cathode layer. As the luminescence of the organic compound, there are luminescence (fluorescence) which occurs when light is returned from a singlet excitation state to a ground state and luminescence (phosphorescence) which occurs when light is returned from a triplet state to a ground state. The light emitting device according to the present invention may use one of fluorescence and phosphorescence or both of them.

In this specification, all layers provided between the anode and cathode are defined as the organic light emitting layer as a whole. Specifically, the organic light emitting layer includes a light emitting layer, a hole injection layer, an electron injection layer, a hole transport layer, an electron transport layer and the like. Basically, the OLED has a structure in which an anode, a light emitting layer and a cathode are layered in this order. Beside this structure, the OLED sometimes has a structure in which an anode, a hole injection layer, a light emitting layer and a cathode are layered in this order or a structure in which an anode, a hole injection layer, a light emitting layer, an electron transport layer, a cathode and the like are layered in this order.

The configuration of the light emitting device will be described with reference to FIG. 22 while taking the driving circuit of a light emitting device which displays images using digital video signals as an example. The light emitting device shown in FIG. 22 includes a data line driving circuit 800, a scanning line driving circuit 801 and a pixel section 802.

In the pixel section 802, a plurality of source wirings, a plurality of gate wirings and a plurality of power supply lines are formed. A region surrounded by the source wirings, the gate wirings and the power supply lines corresponds to pixels. In FIG. 22, only the pixel which has one source wiring 807, one gate wiring 809 and one power supply wiring 808 is typically shown among a plurality of pixels. Each pixel includes a switching TFT 803 which serves as a switching element, a driving TFT 804, a retention capacitance 805 and an OLED 806.

In addition, the circuit structure of the switching TFT 803 indicate a TFT having a first structure of the present invention. The switching TFT 803 shown in FIG. 22 includes a first electrode and the plurality of second electrodes. The first electrode is applied the ground voltage.

Two second electrodes of the switching TFT 803 is connected to the gate wiring 809. The source and drain regions of the switching TFT 803 are connected to the source wiring 807 and the first and the second electrodes of the driving TFT 804, respectively.

The source and drain regions of the driving TFT 804 are connected to the power supply line 808 and the OLED 806, respectively. The first and the second electrode of the driving TFT 804 and the power supply line 808 form the retention capacitance 805. It is not always necessary to form the retention capacitance 805.

The data line driving circuit 800 includes a shift register 810, a first latch 811 and a second latch 802. A clock signal (S-CLK) and a start pulse signal (S-SP) for the data line driving circuit are applied to the shift register 810. Latch signals and video signals for determining latch timing are applied to the first latch 811.

When the clock signal (S-CLK) and the start pulse signal (S-SP) are inputted into the shift register 810, a sampling signal which determines video signal sampling timing is generated and inputted into the first latch 811.

Alternatively, the sampling signal from the shift register 810 may be buffered and amplified by a buffer or the like and then inputted into the first latch 811. Since many circuits or circuit elements are connected to the wiring into which the sampling signal is inputted, the wiring has a high load capacitance (parasitic capacitance). This buffer is effective to prevent the "delay" of the rise or fall of the timing signal caused by the high load capacity.

The first latch 811 includes a plurality of stages of latches. The first latch 811 samples the inputted video signal synchronously with the sampling signal inputted thereinto and the sampled video signal is sequentially stored in the respective stages of latches.

A period required until the video signal is written to all the stages of latches in the first latch 811 is referred to as "line period". Actually, however, this line period to which a horizontal retrace line period is added, is often referred to as "line period".

When one line period is finished, a latch signal is inputted into the second latch 812. During this time, the video signals written and held in the first latch 811 are all outputted to the second latch 812, and written to and held in all stages of latches in the second latch 812.

The first latch 811 which is completed with outputting the video signals to the second latch 812 sequentially writes another video signal based on the sampling signal from the shift register 810.

In the second line period, the video signals written to and held in the second latch 812 are inputted into the source wiring 809.

Meanwhile, the scanning line driving circuit 801 includes a shift register 821 and a buffer 822. A clock signal (G-CLK) and a start pulse signal (G-SP) for the scanning line driving circuit are applied to the shift register 821.

When the clock signal (G-CLK) and the start pulse signal (G-SP) are inputted into the shift register 821, a select signal which determines gate wiring select timing is generated in the shift register 821 and inputted into the buffer 822. The select signal inputted into the buffer 822 is buffered, amplified, and then inputted into the gate wiring 809.

When the gate wiring 809 is selected, the switching TFT 803 having a gate electrode connected to the selected gate wiring 809 is turned on. The video signals inputted into the source wiring are inputted into the first and the second electrode of the driving TFT 804 through the switching TFT 803 which is turned on.

The switching of the driving TFT 804 is controlled based on information of 1 or 0 held by the video signals inputted into the plurality of the second electrodes thereof. When the driving TFT 804 is turned on, the potential of the power supply line 808 is applied to the pixel electrode of the OLED 806 and the OLED 805 thereby emits light. When the driving TFT 804 is turned off, the potential of the power supply line 808 is not applied to the pixel electrode of the OLED 806 and the OLED 806 does not emit light.

In the circuits of the data line driving circuit 800 and those of the scanning line driving circuit 801 provided in the light emitting device shown in FIG. 22, the first and second electrodes of each TFT are electrically connected to each other. By applying the same voltage to the first and second electrodes, the formation of a depleted layer is accelerated substantially as in the case of making the semiconductor film of the TFT thin. It is, therefore, possible to lower the sub-threshold coefficient and also improve the field effect mobility of the TFT. Accordingly, compared with a TFT which includes only one electrode, the TFT can increase ON current. It is thereby possible to decrease driving voltage. In addition, since ON current can be increased, the TFT can be made small in size (the channel width thereof can be particularly made small). It is thereby possible to improve the integration density of the TFT.

Furthermore, in the pixel section 802, a common voltage is applied to one of the first and second electrodes of the switching TFT 803 used as a switching element. By doing so, it is possible to suppress threshold irregularity and to suppress OFF current compared with the TFT which includes only one electrode.

On the driving TFT 804 for supplying a current to the OLED 806, the first electrode is electrically connected to the second electrode. As a result, it is possible to increase ON current compared with the TFT which includes only one electrode. The configuration of the driving TFT is not limited to this configuration. It is also possible that a common voltage is applied to one of the first and second electrodes without electrically connecting the first electrode to the second electrode. Alternatively, a thin film transistor of an ordinary configuration, in which only one electrode is provided, may be included in the driving TFT.

Figure 23:
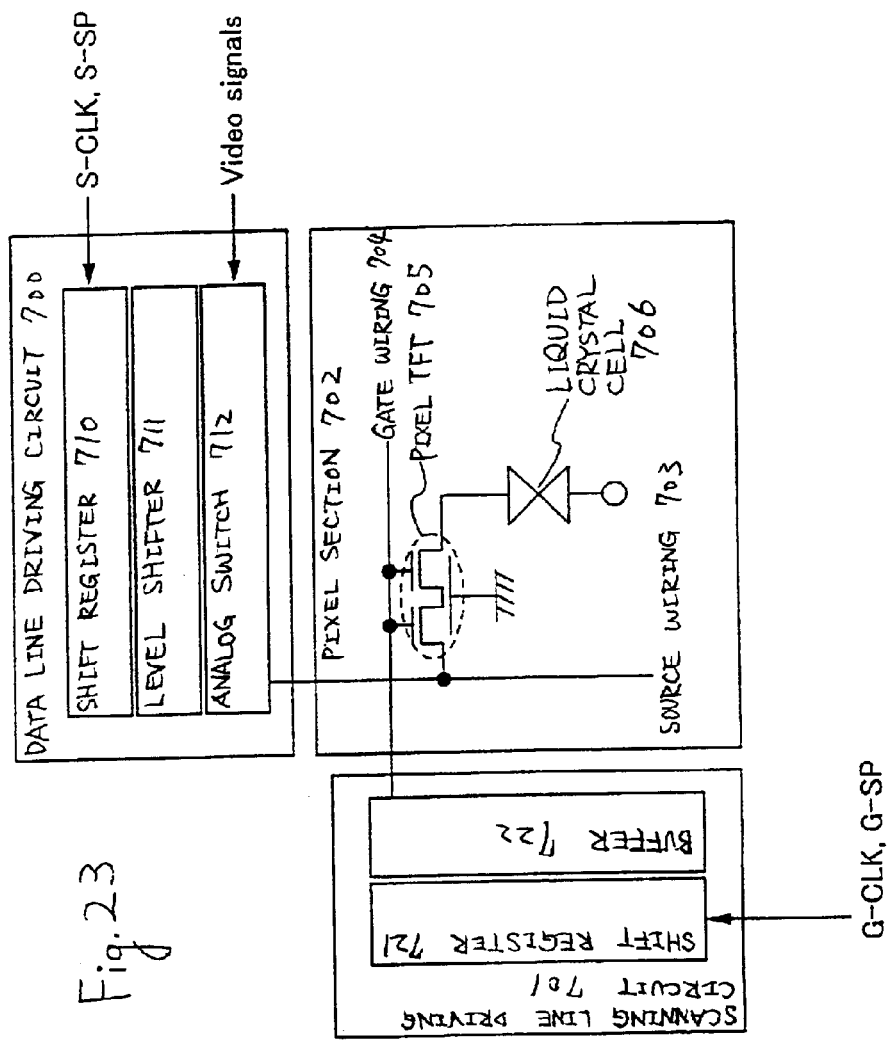
FIG. 23 is a block diagram of the structure of a liquid crystal display device.

Next, FIG. 23 shows the configuration of an ordinary liquid crystal display device. An element substrate shown in FIG. 23 includes a data line driving circuit 700, a scanning line driving circuit 701 and a pixel section 702.

In the pixel section 702, a plurality of source wirings and a plurality of gate wirings are formed. A region surrounded by the source wirings and the gate wirings corresponds to pixels. In FIG. 23, only the pixel which includes one source wiring 703 and one gate electrode 704 is typically shown among a plurality of pixels. Each pixel includes a pixel TFT 705 which serves as a switching element and a liquid crystal cell 706.

In addition, the circuit structure of the pixel TFT 705 shown in FIG. 23 indicate a TFT having a first structure of the present invention. The pixel TFT 705 shown in FIG. 23 includes a first electrode and the plurality of second electrodes. The first electrode is applied the ground voltage.

The liquid crystal cell 706 includes a pixel electrode, an opposed electrode and a liquid crystal provided between the pixel electrode and the opposed electrode.

The gate electrode of the pixel TFT 705 is connected to the gate wiring 704. The source and drain regions of the pixel TFT 705 are connected to the source wiring 703 and the pixel electrode included in the liquid crystal cell 706, respectively.

The data line driving circuit 700 includes a shift register 710, a level shifter 711 and an analog switch 712. A clock signal (S-CLK) and a start pulse signal (S-SP) for the data line driving circuit are applied to the shift register 710. Video signals are applied to the analog switch 712.

When the clock signal (S-CLK) and the start pulse signal (S-SP) are inputted into the shift register 710, a sampling signal which determines video signal sampling timing is generated in the shift register 710 and inputted into the level shifter 711. The voltage of the sampling signal is amplified in the level shifter 711 and the resultant sampling signal inputted into the analog switch 712. The analog switch 712 samples the inputted video signals synchronously with the inputted sampling signal and inputs the sampled video signals into the source wiring 703.

Meanwhile, the scanning line driving circuit 701 includes a shift register 721 and a buffer 722. A clock signal (G-CLK) and a start pulse signal (G-SP) for the scanning line driving circuit are applied to the shift register 721.

When the clock signal (G-CLK) and the start pulse signal (G-SP) are inputted into the shift register 721, a select signal which determines gate wiring select timing is generated in the shift register 721 and inputted into the buffer 722. The select signal inputted into the buffer 722 is buffered, amplified, and then inputted into the gate wiring 704.

When the gate wiring 704 is selected, the pixel TFT 705 having a gate electrode connected to the selected gate wiring 704 is turned on. The sampled video signals inputted into the source wiring 703 are inputted into the pixel electrode of the liquid crystal cell 706 through the pixel TFT 705 which is turned on. The liquid crystal drives according to the potential of the video signal to display an image.

In the circuits of the data line driving circuit 700 and those of the scanning line driving circuit 701 provided in the liquid crystal display device shown in FIG. 23, the first and second electrodes of each TFT are electrically connected to each other. By applying the same voltage to the first and second electrodes, the formation of a depleted layer is accelerated substantially as in the case of making the semiconductor film of the TFT thin. It is, therefore, possible to lower the sub-threshold coefficient and also improve the field effect mobility of the TFT. Accordingly, compared with a TFT which includes only one electrode, the TFT can increase ON current. It is thereby possible to decrease driving voltage. In addition, since ON current can be increased, the TFT can be made small in size (the channel width thereof can be particularly made small). It is thereby possible to improve the integration density of the TFT.

Furthermore, in the pixel section 702, a common voltage is applied to one of the first and second electrodes of the pixel TFT 705 used as a switching element. By doing so, it is possible to suppress threshold irregularity and to suppress OFF current compared with the TFT which includes only one electrode.

This example can be carried out in free combination with the first to sixth examples.

EXAMPLE 7

In this example, an appearance view of the light emitting device is described by using the present invention.

Figure 24A:
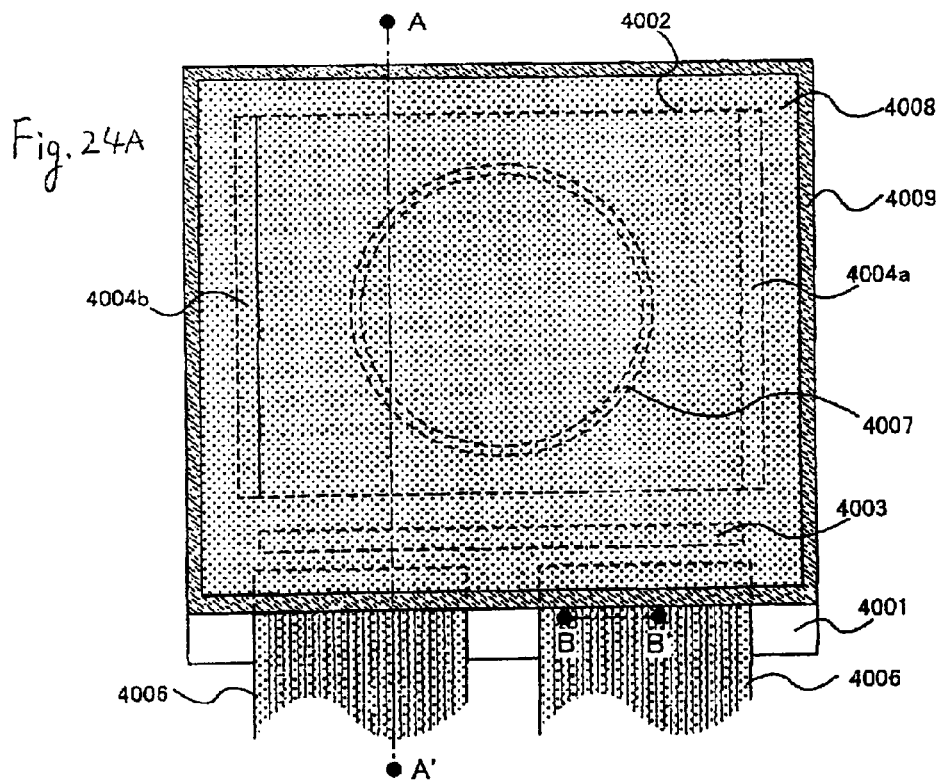
FIGS. 24A to 24C are views showing the external appearance and a cross section of a luminescent device.
Figure 24B:
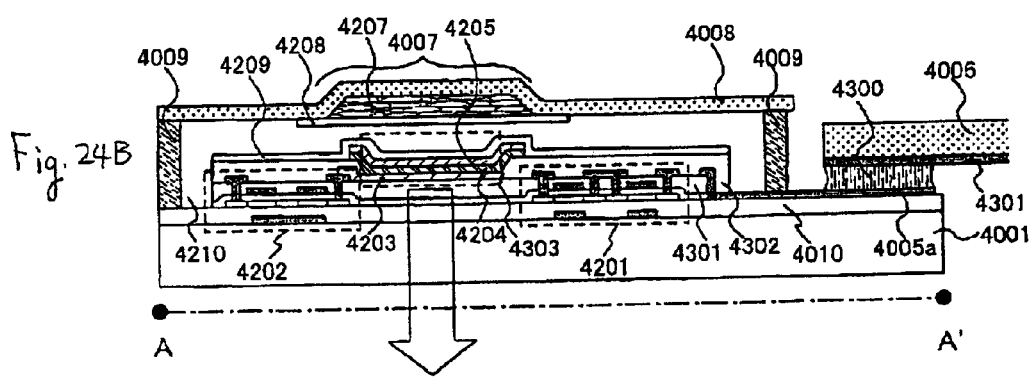
Figure 24C:
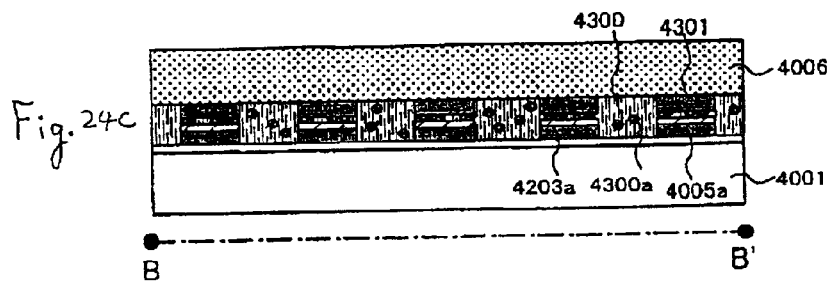

FIG. 24A is a top view of the light emitting device,

FIG. 24B is a cross sectional view taken along with a line A–A' of FIG. 24A, and FIG. 24C is a cross sectional view taken along with a line B–B' of FIG. 24A.

A seal member 4009 is provided so as to surround a pixel portion 4002, a data line driver circuit 4003, and the first, second scanning line driver circuits 4004a, 4004b, which are provided on a substrate 4001. Further, a sealing material 4008 is provided on the pixel section 4002, the signal line driver circuit 4003, and the first, the second scanning line driver circuits 4004a, 4004b. Thus, the pixel section 4002, the data line driver circuit 4003, and the first, the second scanning line driver circuits 4004a, 4004b are sealed by the substrate 4001, the seal member 4009 and the sealing material 4008 together with a filler 4210.

Further, the pixel section 4002, the data line driver circuit 4003, and the first, the second scanning line driver circuits 4004a, 4004b, which are provided on the substrate 4001, have a plurality of TFTs. In FIG. 24B, CMOS 4201 included in the data line driver circuit 4003 and a driving TFT (TFT controlling current which flows to the OLED) 4202 included in the pixel section 4002, which are formed on a base film 4010, are typically shown.

In this example, the p-channel TFT or the n-channel TFT connected electrically to each other is used as CMOS 4201, and the p-channel TFT of the present invention, which has a first electrode and a plurality of second electrodes connected electrically to each other, is used as the driving TFT 4202. Further, the display pixel section 4002 is provided with a storage capacitor (not shown) connected to a gate electrode of the driving TET 4202.

The third insulating film 4301 is formed on the CMOS 4201 and the driving TFT 4202, and a pixel electrode (anode) 4203 electrically connected to a drain of the driving TFT 4202 is formed thereon. A transparent conductive film having a large work function is used for the pixel electrode 4203. A compound of indium oxide and tin oxide, a compound of indium oxide and zinc oxide, zinc oxide, tin oxide or indium oxide can be used for the transparent conductive film. The above transparent conductive film added with gallium may also be used.

Then, the fourth insulating film 4302 is formed on the pixel electrode 4203, and the fourth insulating film 4302 is formed with an opening portion on the pixel electrode 4203. In this opening portion, an organic light emitting layer 4204 is formed on the pixel electrode 4203. A known organic light emitting material or inorganic light emitting material may be used for the organic light emitting layer 4204. Further, there exist a low molecular weight (monomer) material and a high molecular weight (polymer) material as the organic light emitting materials, and both the materials may be used.

A known evaporation technique or application technique may be used as a method of forming the organic light emitting layer 4204. Further, the structure of the organic light emitting layer may take a lamination structure or a single layer structure by freely combining a hole injecting layer, a hole transporting layer, a light emitting layer, an electron transporting layer and an electron injecting layer.

A cathode 4205 made of a conductive film having light shielding property (typically, conductive film containing aluminum, copper or silver as its main constituent or lamination film of the above conductive film and another conductive film) is formed on the organic light emitting layer 4204. Further, it is desirable that moisture and oxygen that exist on an interface of the cathode 4205 and the organic light emitting layer 4204 are removed as much as possible. Therefore, such a device is necessary that the organic light emitting layer 4204 is formed in a nitrogen or rare gas atmosphere, and then, the cathode 4205 is formed without exposure to oxygen and moisture. In this example, the above-described film deposition is enabled by using a multi-chamber type (cluster tool type) film forming device. In addition, a predetermined voltage is given to the cathode 4205.

As described above, an OLED 4303 constituted of the pixel electrode (anode) 4203, the organic light emitting layer 4204 and the cathode 4205 is formed. Further, a protective film 4209 is formed on the insulating film 4302 so as to cover the OLED 4303. The protective film 4209 is effective in preventing oxygen, moisture and the like from permeating the OLED 4303.

Reference numeral 4005a denotes a wiring drawn to be connected to the power supply line, and the wiring 4005a is electrically connected to a source region of the driving TFT 4202. The drawn wiring 4005a passes between the seal member 4009 and the substrate 4001, and is electrically connected to an FPC wiring 4301 of an FPC 4006 through an anisotropic conductive film 4300.

A glass material, a metal material (typically, stainless material), a ceramics material or a plastic material (including a plastic film) can be used for the sealing material 4008. As the plastic material, an FRP (fiberglass-reinforced plastics) plate, a PVF (polyvinyl fluoride) film, a Mylar film, a polyester film or an acrylic resin film may be used. Further, a sheet with a structure in which an aluminum foil is sandwiched with the PVF film or the Mylar film can also be used.

However, in the case where the light from the OLED is emitted toward the cover member side, the cover member needs to be transparent. In this case, a transparent substance such as a glass plate, a plastic plate, a polyester film or an acrylic film is used.

Further, in addition to an inert gas such as nitrogen or argon, an ultraviolet curable resin or a thermosetting resin may be used as the filler 4210, so that PVC—(polyvinyl chloride), acrylic, polyimide, epoxy resin, silicone resin, PVB (polyvinyl butyral) or EVA (ethylene vinyl acetate) can be used. In this example, nitrogen is used for the filler.

Moreover, a concave portion 4007 is provided on the surface of the sealing material 4008 on the substrate 4001 side, and a hygroscopic substance or a substance that can absorb oxygen 4207 is arranged therein in order that the filler 4210 is made to be exposed to the hygroscopic substance (preferably, barium oxide) or the substance that can absorb oxygen. Then, the hygroscopic substance or the substance that can absorb oxygen 4207 is held in the concave portion 4007 by a concave portion cover member 4208 such that the hygroscopic substance or the substance that can absorb oxygen 4207 is not scattered. Note that the concave portion cover member 4208 has a fine mesh form, and has a structure in which air and moisture are penetrated while the hygroscopic substance or the substance that can absorb oxygen 4207 is not penetrated. The deterioration of the OLED 4303 can be suppressed by providing the hygroscopic substance or the substance that can absorb oxygen 4207.

As shown in FIG. 24C, the pixel electrode 4203 is formed, and at the same time, a conductive film 4203a is formed so as to contact the drawn wiring 4005a.

Further, the anisotropic conductive film 4300 has conductive filler 4300a. The conductive film 4203a on the substrate 4001 and the FPC wiring 4301 on the FPC 4006 are electrically connected to each other by the conductive filler 4300a by heat-pressing the substrate 4001 and the FPC 4006.

Note that this example can be implemented by being freely combined with the first, second and fourth to sixth examples.

EXAMPLE 8

The semiconductor device of the present invention can be used to various electronic devices.

Such electronic devices include a video camera, a digital camera, a goggles-type display (head mount display), a car navigation system, a sound reproduction device (a car audio equipment, an audio equipment, or the like), a lap-top computer, a game machine, a portable information terminal (a mobile computer, a portable telephone, a portable game machine, an electronic book, or the like), an image reproduction apparatus including a recording medium (more specifically, an apparatus which can reproduce a recording medium such as a digital video disc (DVD), and includes a display for displaying the reproduced image), or the like. FIGS. 25A to 25F respectively show various specific examples of such electronic devices.

Figure 25A:
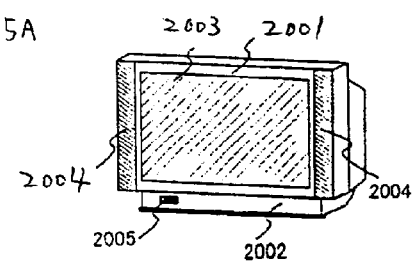
FIGS. 25A to 25H are views of electronic apparatuses using the semiconductor device of the present invention.

FIG. 25A illustrates a display device which includes a frame 2001, a support table 2002, a display portion 2003, a speaker portion 2004, a video input terminal 2005, or the like. The display device of the present invention is completed by using the present invention to the display portion 2003 and other circuits. The display device includes all information display devices such as devices for a personal computer, a TV broadcast reception, an advertising display, or the like.

Figure 25B:
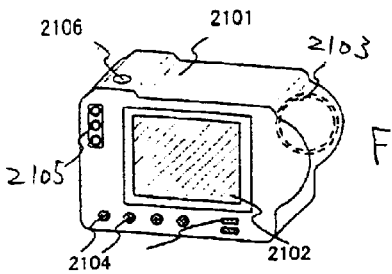

FIG. 25B illustrates a digital still camera which includes a main body 2101, a display portion 2102, an image receiving portion 2103, operation switches 2104, an external connecting portion 2105, a shutter 2106, or the like. The present invention can be used to the display portion 2102 and other circuits.

Figure 25C:
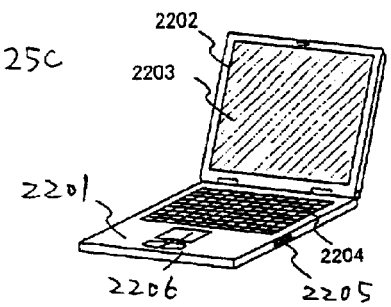

FIG. 25C illustrates a lap-top computer which includes a main body 2201, a casing 2202, a display portion 2203, a key board 2204, an external connecting port 2205, a pointing mouse 2206, or the like. The present invention can be used to the display portion 2203 and other circuits.

Figure 25D:
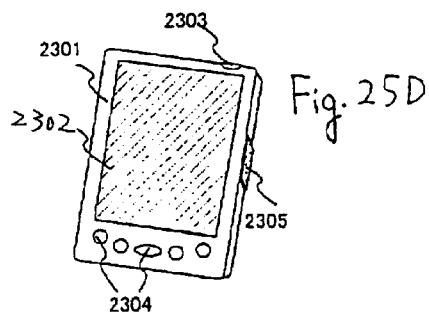

FIG. 25D illustrates a mobile computer which includes a main body 2301, a display portion 2302, switches 2303, an operation key 2304, an infrared port 2305, or the like. The present invention can be used to the display portion 2302 and other circuits.

Figure 25E:
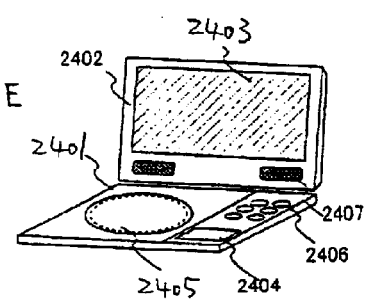

FIG. 25E illustrates a portable type image reproduction apparatus including a recording medium (more specifically, a DVD reproduction apparatus),which includes a main body 2401, a casing 2402, a display portion A 2403, a display portion B 2404, a reading portion of a recording medium (a DVD or the like) 2405, operation switches 2406, a speaker portion 2407, or the like. The display portion A 2403 is used mainly for displaying image information, while the display portion B 2404 is used mainly for displaying character information. The image reproduction apparatus can be obtained by utilizing the present invention to the display portion A 2403, the display portion B 2404 and other circuits. The image reproduction apparatus including a recording medium further includes a CD reproduction apparatus, a game machine or the like.

Figure 25F:
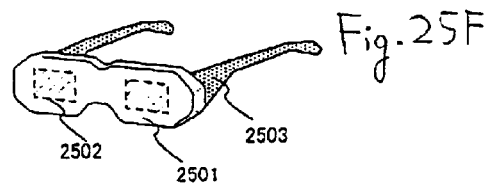

FIG. 25F illustrates a goggle type display (head mounted display) which includes a main body 2501, a display portion 2502 and an arm portion 2503. The present invention can be used to the display portion 2502 and other circuits.

Figure 25G:
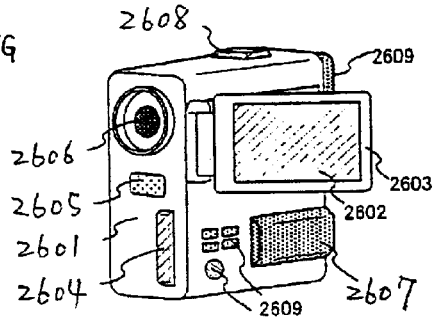

FIG. 25G illustrates a video camera which includes a main body 2601, a display portion 2602, a casing 2603, an external connecting port 2604, a remote control receiving portion 2605, an image receiving portion 2606, a battery 2607, an audio input portion 2608, an operation key 2609, or the like. The present invention can be used to the display portion 2602 and other circuits.

Figure 25H:
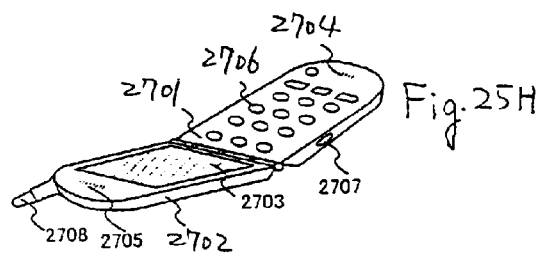

With now reference to FIG. 25H, a portable telephone is illustrated, which includes a main body 2701, a casing 2702, a display portion 2703, an audio input portion 2704, an audio output portion 2705, operation keys 2706, an external connecting port 2707, an antenna 2708, or the like. The present invention can be used to the display portion 2703 and other circuits.

The front type projector and rear type projector using a liquid crystal display device, which is one liquid crystal display device, are included in the electric equipment of the present invention. If the luminance of light emitted from organic materials is raised in future, the light emitting device can be used in front or rear projectors by enlarging outputted light that contains image information through a lens or the like and projecting the light.

As set forth above, the present invention can be applied variously to a wide range of electronic devices in all fields. The present invention can be implemented by freely combining with first to eighth examples.

EXAMPLE 9

In the ninth example, the characteristics of the TFT according to the present invention if the first electrode and the second electrode of the TFT are electrically connected to each other, will be described.

FIG. 26A shows the cross-section of the TFT according to the present invention wherein the first and second electrodes electrically connected to each other. FIG. 26B shows the cross section of a TFT which includes only one electrodes for comparison purposes. FIG. 27 shows the relationships between the second gate voltage (Vg) and drain current obtained by simulations with respect to the TFT's shown in FIGS. 26A and 26B, respectively.

The TFT shown in FIG. 26A includes a first electrode 2801, a first insulating film 2802 which contacts with the first electrode 2801, a semiconductor film 2808 which contacts with the first insulating film 2802, a second insulating film 2806 which contacts with the semiconductor film 2808, and a second electrode 2807 which contacts with the second insulating film 2806. The semiconductor film 2808 includes a channel formation region 2803, a first impurity region 2804 which contacts with the channel formation region 2803, and a second impurity region 2805 which contacts with the first impurity region 2804.

The first electrode 2801 is overlapped with the second electrode 2807 with the channel formation region 2803 put therebetween. The same voltage is applied to the first electrode 2801 and the second electrode 2807.

The first insulating film 2802 and the second insulating film 2806 are made of silicon oxide. The first electrode 2801 and the second electrode 2807 are made of aluminum (Al). A channel length is 7 $\mu$m, a channel width is 4 $\mu$m, the thickness of the first insulating film 2802 in the section in which the first gate electrode is overlapped with the channel formation region 2803 is 110 $\mu$m, and the thickness of the second insulating film 2806 in the section in which the second gate electrode is overlapped with the channel formation region 2803 is 110 $\mu$m. In addition, the thickness of the channel formation region 2803 is 50 nm and the length of the first impurity region 2804 in a channel length direction is 1.5 $\mu$m.

The channel formation region 2803 is doped with p-type allocation impurities of $1\times10^{17}/cm^3$, the first impurity region 2804 is doped with n-type allocation impurities of $3\times10^{17}/cm^3$ and the second impurity region 2805 is doped with n-type allocation impurities of $5\times10^{19}/cm^3$.

The TFT shown in FIG. 26B includes a first insulating film 2902, a second insulating film 2906 which contacts with the first insulating film 2902, and a second electrode 2907 which contacts with the second insulating film 2906. A semiconductor film 2908 includes a channel formation region 2903, a first impurity region 2904 which contacts with the channel formation region 2903, and a second impurity region 2905 which contacts with the first impurity region 2904.

The second electrode 2907 is overlapped with the channel formation region 2903.

The first insulating film 2902 and the second insulating film 2906 are made of silicon oxide. The second electrode 2907 is made of aluminum (Al). A channel length is 7 $\mu$m, a channel width is 4 $\mu$m, and the thickness of the second insulating film 2906 in the section in which the second gate electrode is overlapped with the channel formation region 2903 is 110 $\mu$m. In addition, the thickness of the channel formation region 2903 is 50 nm and the length of the first impurity region 2904 in a channel length direction is 1.5 $\mu$m.

The channel formation region 2903 is doped with p-type allocation impurities of $1\times10^{17}/cm^3$, the first impurity region 2904 is doped with n-type allocation impurities of $3\times10^{17}/cm^3$ and the second impurity region 2905 is doped with n-type allocation impurities of $5\times10^{19}/cm^3$.

In FIG. 27, the horizontal axis indicates gate voltage and the vertical axis indicates drain current. The value of drain current relative to gate voltage with respect to the TFT shown in FIG. 26A is denoted by a solid line and the value of drain current relative to gate voltage with respect to the TFT shown in FIG. 26B is denoted by a broken line.

From FIG. 27, the mobility of the TFT shown in FIG. 26A of 139 $cm^2/V\cdot s$ and the S value of 0.118 V/dec are obtained. In addition, the mobility of the TFT shown in FIG. 26B of 86.3 $cm^2/V\cdot s$ and the S value of 0.160 V/dec are obtained. Judging from these, if the first and second electrodes are provided in a TFT and the two electrodes are electrically connected to each other, the mobility of the TFT is higher and the S value thereof is lower than those of a TFT which includes only one electrode.

EXAMPLE 10

In the tenth example, a case of manufacturing a semiconductor film by a different method from that of the first example will be described.

Figure 28A:
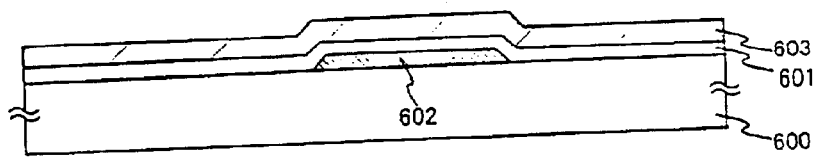
FIGS. 28A to 28C are views showing the steps of the crystallization of a semiconductor layer.

In FIG. 28A, reference symbol 600 denotes a substrate which includes an insulating surface. In FIG. 28A, a glass substrate, a quartz substrate, a ceramic substrate or the like can be used as the substrate 600. Alternatively, a substrate such as a silicon substrate, a metal substrate or a stainless substrate having an insulating film formed on the surface thereof may be used. It is also possible to use a plastic substrate having heat resistance against the treatment temperature in the steps of this example.

As shown in FIG. 28A, first electrode 602 is first formed on the substrate 600. The first electrode 602 may be formed out of a conductive substance. Typically, the first electrode 602 can be formed out of alloy or a compound consisting of one or a plurality of elements selected from among aluminum (Al), tungsten (W), molybdenum (Mo), tantalum (Ta) and titanium (Ti). Alternatively, layered conductive films may be used as the first electrode.

A first insulating film 601 is formed on the insulating surface of the substrate 600 to cover the first electrode 602. The first insulating film 601 is formed out of a silicon oxide film, a silicon nitride film, a silicon oxide nitride film ($SiO_xN_y$) or the like. As a typical example, a film having a two-layer structure in which a first silicon oxide nitride film formed using $SiH_4$, $NH_3$ and $N_2O$ as reaction gas and having a thickness of 50 to 100 nm and a second silicon oxide nitride film formed using $SiH_4$ and $N_2O$ as reaction gas and having a thickness of 100 to 150 nm are layered, is used as the first insulating film 601. It is also preferable that a silicon nitride film (SiN film) or the second silicon oxide nitride film ($SiN_xO_y$ film, where X>>Y) is used as one layer of the first insulating film. During gettering, nickel tends to move toward a region having a high oxygen concentration. It is, therefore, quite effective to use the silicon nitride film as the first insulating film which contacts with the semiconductor film. Alternatively, a film having a three-layer structure in which a first silicon oxide nitride film, a second silicon oxide nitride film and a silicon nitride film are sequentially layered may be used as the first insulating film 601.

Next, a first semiconductor layer 603 having an amorphous structure is formed on the first insulating film 601. A semiconductor material mainly containing silicon is used to form the first semiconductor layer 603. Typically, an amorphous silicon film or an amorphous silicon germanium film is used as the first semiconductor layer 603. The first semiconductor layer 603 is formed to have a thickness of 10 to 100 nm by the plasma CVD method, the low pressure CVD method or the sputtering method. It is preferable that the concentration of impurities such as oxygen and nitrogen contained in the film of the first semiconductor layer 603 having an amorphous structure, is decreased to not higher than $5\times10^{18}/cm^3$ (atom concentration measured by secondary ion mass spectroscopy) to obtain a good quality crystalline structure in later crystallization. These impurities prevent later crystallization and, even after the crystallization, increase the density of a trapping center or recombination center. For these reasons, it is preferable to use not only high impurity material gas but also use an extreme high vacuum CVD system which includes a mirror treatment (field polishing) reaction chamber or an oil-free evacuation system.

Figure 28B:
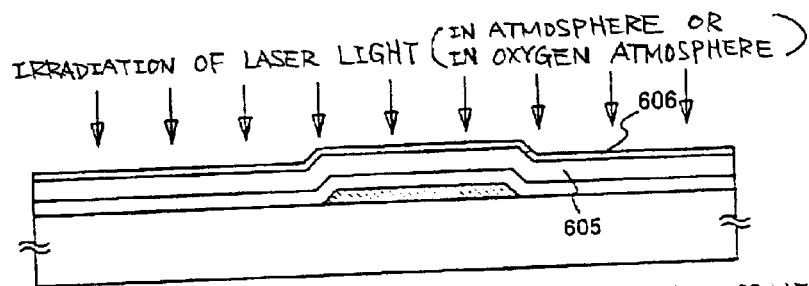

Next, the first semiconductor layer 603 is crystallized by a laser crystallization method to thereby form a second semiconductor layer 605 as shown in FIG. 28B. After a heat treatment (at 450° C. for 1 hour) for dehydrogenation, the semiconductor layer 603 is crystallized by the laser crystallization method. The irradiation of a laser beam is conducted in the atmosphere or in an oxygen atmosphere. An excimer laser or YAG laser of a pulse oscillation type or a continuous light emission type having a wavelength of not more than 400 nm can be used. If such a laser is used, it is preferable to adopt a method of linearly converging a laser beam emitted from a laser generator by an optical system, and applying the converged laser beam onto the semiconductor layer. Crystallization conditions may be appropriately selected by a person who executes the laser crystallization method. If the excimer laser is used, pulse oscillation frequency may be set at 300 Hz and laser energy density may be set at 100 to 400 mJ/cm$^2$ (typically 200 to 300 mJ/cm$^2$). If the YAG laser is used, pulse oscillation frequency may be set at 30 to 300 kHz and laser energy density may be set at 300 to 600 mJ/cm$^2$ (typically 350 to 500 mJ/cm$^2$). The laser beam which has been linearly converged to have a width of 100 to 1000 μm, e.g., 400 μm is applied to the entire surface of the substrate. The overlap rate of the linear laser beam at this time may be set at 50 to 90%.

If the laser beam (first laser beam) is applied, irregularities are formed on the surface of the second semiconductor layer and a thin oxide film 606 is formed thereon (FIG. 28B).

The oxide film 606 is removed using fluorine containing etchant.

Figure 28C:
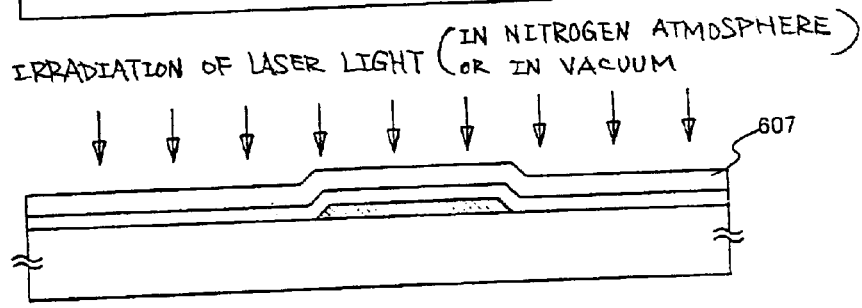

Next, a laser beam (second laser beam) is applied to the second semiconductor layer 605 having a crystal structure either in a nitrogen atmosphere or in vacuum. If the laser beam (second laser beam) is irradiated, the difference in level (P-V value: Peak to Valley value; difference in height between maximum and minimum) among the irregularities formed by the irradiation of the first laser beam is decreased, i.e., the surface is flattened (FIG. 28C). The P-V value of the irregularities may be observed with an AFM (atomic force microscope). Specifically, the P-V value of the irregularities formed by the irradiation of the first laser beam of about 10 nm to 30 nm can be decreased to not lower than 5 nm by the irradiation of the second laser beam. As this laser beam (second laser beam), an excimer laser beam having a wavelength of not more than 400 nm or the second and third higher harmonic waves of the YAG laser can be employed. Alternatively, a light beam emitted from an ultraviolet lamp may be used in place of the excimer laser beam.

The energy density of the second laser beam is set higher than that of the first laser beam, preferably higher than that of the first laser beam by 30 to 60 mJ/cm$^2$. It is noted, however, if the energy density of the second laser beam is higher than that of the first laser beam by 90 mJ/cm$^2$ or more, surface roughness tends to increase and crystallinity tends to deteriorate or crystal grains tend to be transformed to crystallites, thereby deteriorating the characteristics of the semiconductor layer.

Although the energy density of the second laser beam is higher than that of the first laser beam, the crystallinity of the semiconductor layer hardly changes before and after the irradiation. In addition, crystal states such as grain diameters hardly change. In other words, it is considered that the irradiation of the second laser beam is intended only to flatten the surface of the semiconductor layer.

The flattening of the semiconductor layer having a crystal structure by the irradiation of the second laser beam possesses high merit. For example, by improving the flatness of the semiconductor layer, it is possible to make thinner the second insulating film to be formed in a later step as a gate insulating film thinner and to thereby improve the mobility of the TFT. In addition, by improving the flatness, it is possible to decrease OFF current in the manufacturing of the TFT.

Next, using a well-known patterning technique, a third semiconductor layer 607 is patterned to thereby form a semiconductor film having a desired shape.

This example can be carried out in free combination with the first to ninth examples.

EXAMPLE 11

In the eleventh example, the different configuration of the pixels of the light emitting device which is one example of the semiconductor device according to the present invention from that described in the first example will be described.

Figure 29:
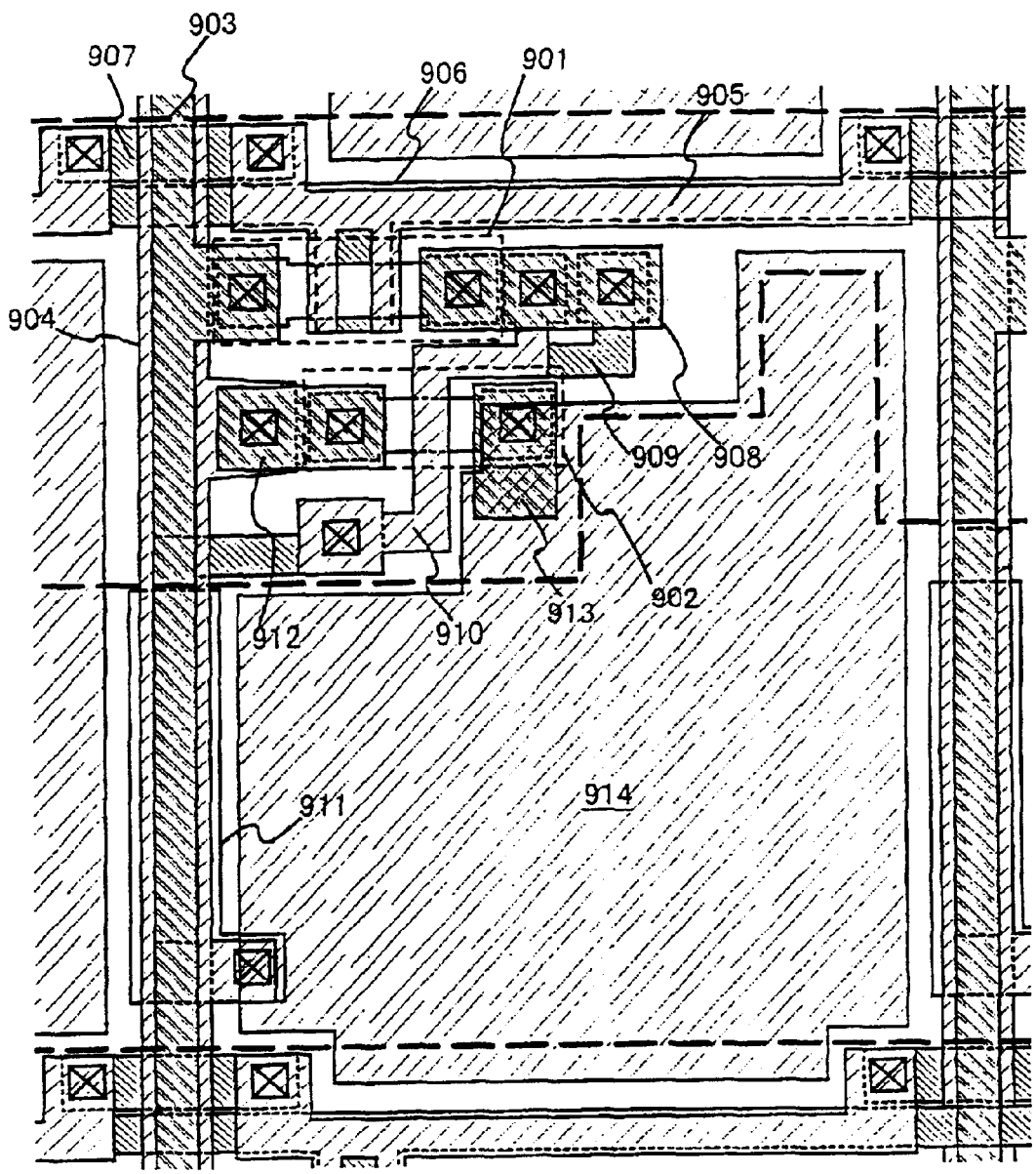
FIG. 29 is a top view for explaining the structure of a pixel section in a luminescent device.

FIG. 29 is a top view of the pixels of a light emitting device in this example.

Reference symbol 901 denotes an n-channel type TFT and 902 denote a p-channel type TFT. Reference symbol 903 denotes a source wiring, 904 denotes a power supply wiring, 905 denotes a gate wiring, 906 denotes a common wiring and 911 denotes a semiconductor film for capacitance.

In this example, the power supply wiring 904 and the gate wiring 905 are simultaneously formed out of the same conductive film. In other words, the power supply wiring 904 and the gate wiring 905 are formed on the same layer. The gate wirings 905 of adjacent pixels are connected to each other through a connection wiring 907 which is formed on the same layer as that of the common wiring 906.

A part of the gate wiring 905 functions as the second electrode of the n-channel type TFT 901. A part of the common wiring 906 functions as the first electrode of then-channel type TFT 901. The source and drain regions of the n-channel type TFT 901 are connected to the source wiring 903 and to the first electrode 909 and the second electrode 910 of the p-channel type TFT 902 through a connection wiring 908 which is formed on the same layer as that of the source wiring 903, respectively.

The source and drain regions of the p-channel type TFT 902 are connected to the power supply wiring 904 and to a pixel electrode 914 through a connection wirings 912 and 913 which are formed on the same layer as that of the source wiring 903, respectively.

The first electrode 909 is overlapped with the capacitance wiring 911 with a first insulating film (not shown) put therebetween. The capacitance wiring 911 is connected to the power supply wiring 904.

In this example, by forming the source wiring and the power supply wiring on different layers, respectively, it is possible to overlap them with each other and, therefore, to increase an opening rate. The present invention is not limited to the configuration of this example and the power supply wiring may be formed on a layer above the source wiring.

Alternatively, one of the source and power supply wirings may be formed on the same layer as that of the common wiring.

In this example, a common voltage is applied to the first electrode of the TFT (which corresponds to the n-channel type TFT 901 in this example) which is used as a switching element among the TFT's in the same pixel. By applying the common voltage to the first electrode, it is possible to suppress threshold irregularity and to suppress OFF current compared with the TFT which includes only one electrode.

Further, on the TFT (which corresponds to the p-channel type TFT 902 in this example) to which high current is carried than that of the TFT used as a switching element, the first electrode is electrically connected to the second electrode. By applying the same voltage to the first and second electrodes, the spread of a depletion layer is accelerated substantially as in the case of making the thickness of the semiconductor film thin. It is, therefore, possible to lower the sub-threshold coefficient and to improve the field effect mobility. It is thus possible to increase ON current compared with the TFT which includes one electrode. As a result, by using the TFT having this structure in the driving circuit, it is possible to decrease driving voltage. In addition, since ON current can be increased, it is possible to make the TFT smaller in size (channel width thereof can be particularly made smaller). It is thus possible to improve the integration density of the semiconductor device.

This example can be carried out in free combination with the first, second and fourth to ninth examples.

EXAMPLE 12

Referring to FIG. 30, an example where a first electrode is formed by a manufacturing process different from that of Example 1 will be described in the present example.

Figure 30A:
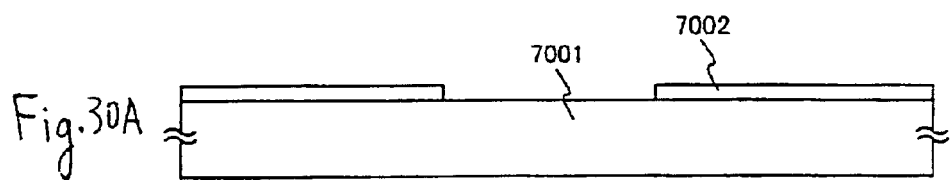
FIGS. 30A to 30D are sectional views for explaining the steps of manufacturing an electrode, using chemical-mechanical polishing.

As illustrated in FIG. 30A, first, an interlayer 7002 having an opening is formed on a substrate 7001. The substrate 7001 is made of a material which can resist against temperature given in subsequent steps.

Figure 30B:
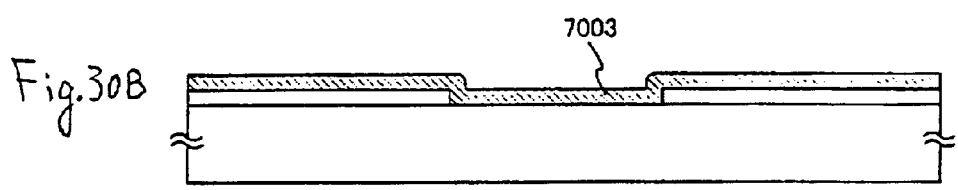
Figure 30C:
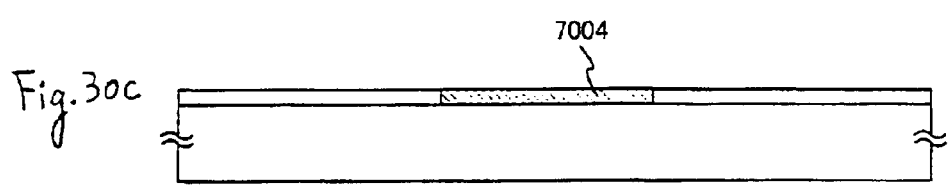

As illustrated in FIG. 30B, next, a conductive film 7003 is formed on the substrate 7001 to cover the interlayer 7002. The conductive film 7003 can be typically made of an alloy or a compound containing one or more selected from aluminum (Al), tungsten (W), molybdenum (Mo), tantalum (Ta) and titanium (Ti). A lamination wherein plural conductive films are deposited may be used. In the present example, Al is used.

Next, CMP is used to polish the conductive film 7003 in such a manner that the conductive film remains only in the opening made in the interlayer 7002. In this way, a first electrode 7004 is formed. A polishing agent (slurry) for the CMP of the conductive film 7003 may be, for example, a slurry wherein fumed silica particles obtained by decomposing silicon chloride gas thermally are dispersed in a solution of KOH in water.

By the CMP, a first insulating film, which will be subsequently formed and used as a gate insulating film, is made flat. Therefore, the first insulating film can be made thin and the mobility of a TFT to be manufactured can be improved. By the flattening of the first insulating film, a semiconductor film formed on the first insulating film can also be flattened. By the improvement in the flatness of the semiconductor film, the off-state current of the TFT to be manufactured can also be reduced.

The first insulating film 7005 is formed on the interlayer 7002 to cover the first electrode 7004 and the insulating film The first insulating film 7005 is made of a silicon oxide film, a silicon nitride film, a silicon oxynitride ($SiO_xN_y$) film, or the like. As the first insulating film 7005, two or more insulating films may be used.

Figure 30D:
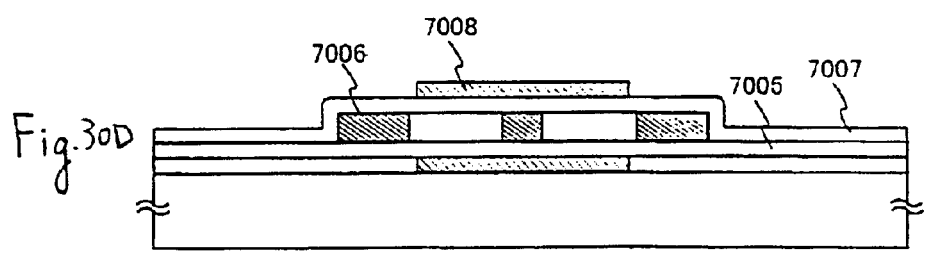

Next, a semiconductor film 7006, a second insulating film 7007 and a second electrode 7008 are formed on the first insulating film 7005 to complete a TFT having the second structure of the present invention (FIG. 30D). By setting up two or more second electrodes, a TFT having the first structure may be manufactured.

The present example may freely be combined with Examples 1 to 11.

EXAMPLE 13

An example wherein TFTs of the present invention are stacked will be described in the present example. In the present example, an n-channel type TFT and a p-channel type TFT have the first structure, but may have the second structure.

FIG. 31 illustrate a state that the p-channel type TFT is stacked and formed on the n-channel type TFT.

The n-channel type TFT has a first electrode 61, a first insulating film 62 contacting the first electrode 61, a semiconductor film 63 contacting the first insulating film 62, a second insulating film 66 contacting the semiconductor film 63, and second electrodes 67a and 67b contacting the second insulating film 66. The semiconductor film 63 has channel-formed regions 64a and 64b, and n-type impurity regions 65a, 65b and 65c contacting the channel-formed regions 64 and 64b.

The p-channel type TFT has a third electrode 72, a third insulating film 73 contacting the third electrode 72, a semiconductor film 74 contacting the third insulating film 73, a fourth insulating film 77 contacting the semiconductor film 74, and fourth electrodes 78a and 78b contacting the fourth insulating film 77. The semiconductor film 74 has channel-formed regions 75a and 75b, and p-type impurity regions 76a, 76b and 76c contacting the channel-formed regions 75a and 75b.

The first electrode 61 and the first insulating film 62 are formed on a substrate 60. A first interlayer dielectric 68 is formed on the second insulating film 66 to cover the second electrodes 67a and 67b. Interconnections 69 and 70 are formed on the first interlayer dielectric 68 to contact the impurity regions 65a and 65c, respectively, through contact holes made in the first interlayer dielectric 68 and the second insulating film 66. A second interlayer dielectric 71 is formed on the first interlayer dielectric 68 to cover the interconnections 69 and 70.

The third electrode 72 and the third insulating film 73 are formed on the second interlayer dielectric 71. A third interlayer dielectric 79 is formed on the fourth insulating film 77 to cover the third electrodes 78a and 78b. Interconnections 80 and 81 are formed on the third interlayer dielectric 79 to contact the impurity regions 76a and 76c, respectively, through contact holes made in the third interlayer dielectric 79 and the fourth insulating film 77.

Figure 31A:
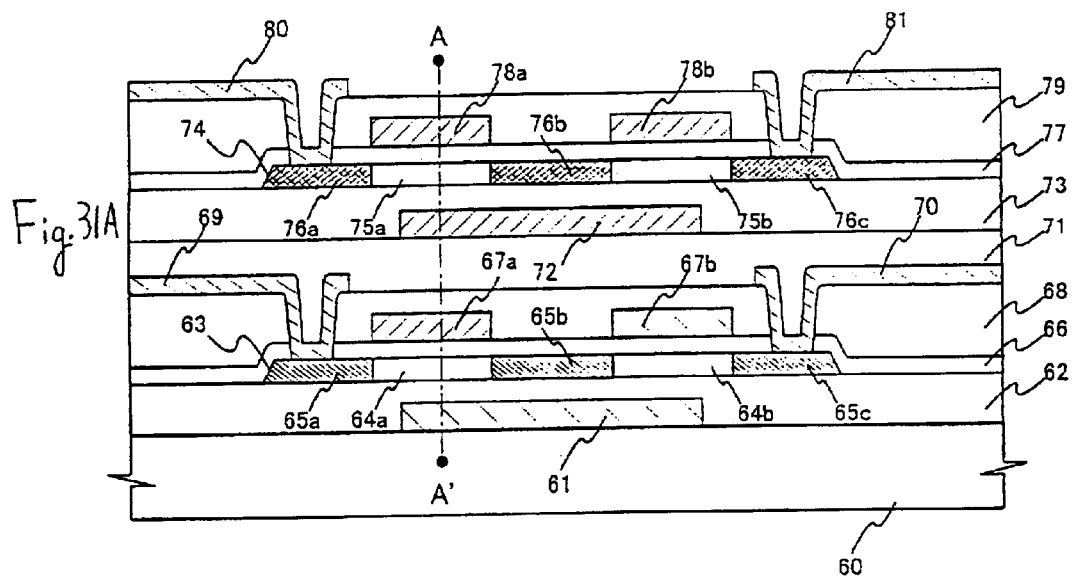
FIGS. 31A and 31B are sectional views for explaining the structure of TFTs of the present invention.
Figure 31B:
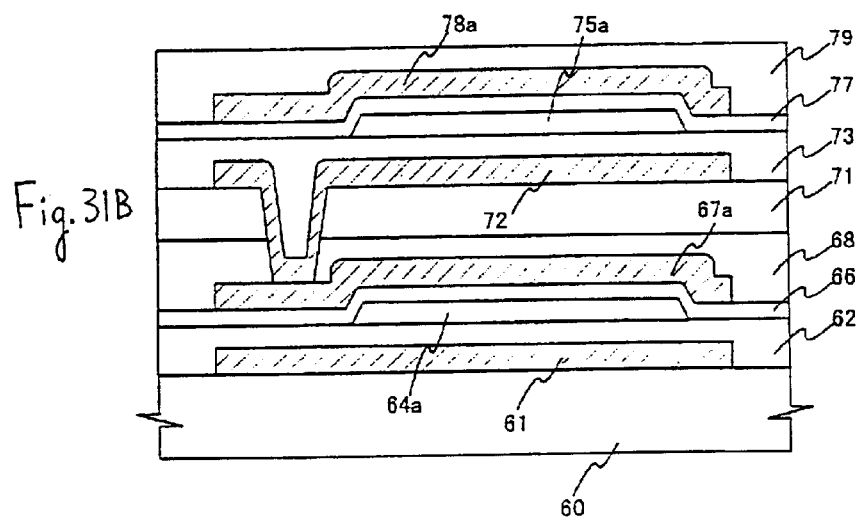

FIG. 31B illustrates a cross section taken on line A–A' of FIG. 31A. As illustrated in FIG. 31B, the second electrode 67a and the third electrode 72 are connected to each other through contact holes made in the first interlayer dielectric 68 and the second interlayer dielectric 71.

The integration degree of TFTs can be made higher by the above-mentioned structure. Therefore, by using the TFTs of the present example in a semiconductor integrated circuit (microprocessor, signal processing circuit, high-frequency circuit, or the like), the area of the semiconductor integrated circuit on the substrate can be made small.

Figure 32:
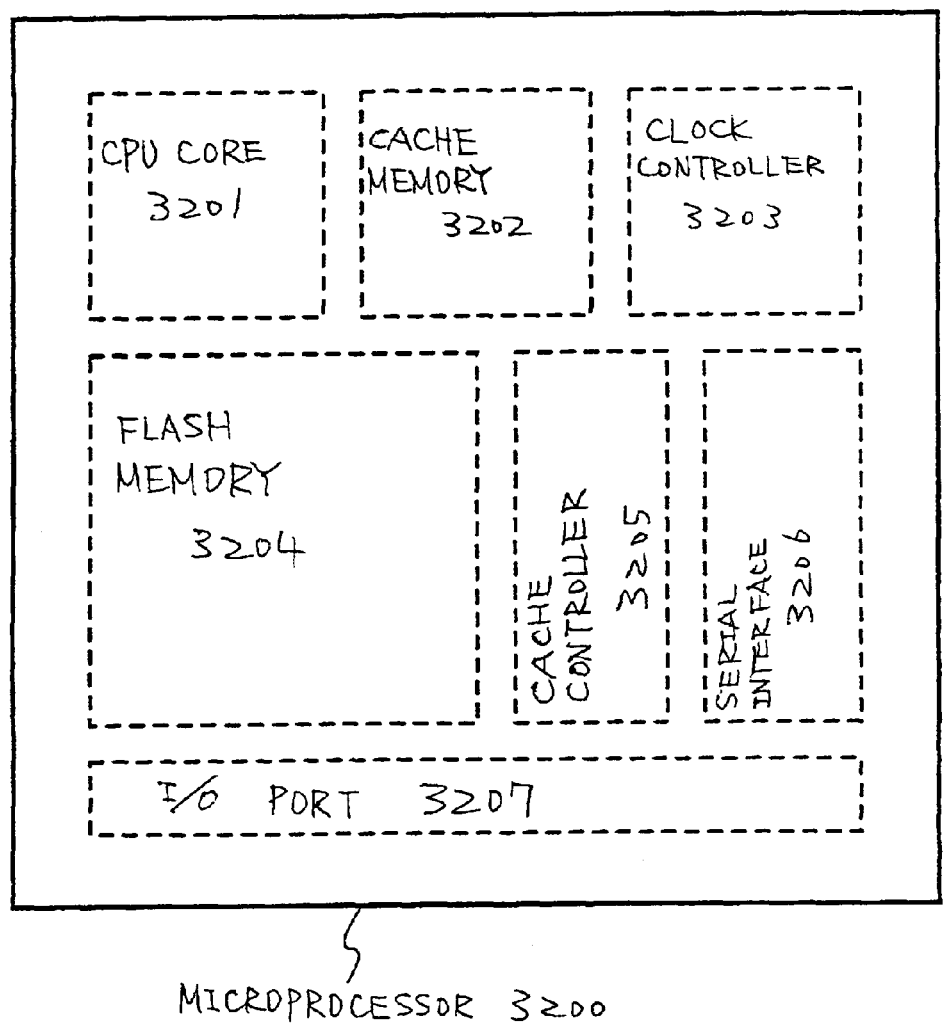
FIG. 32 is a block diagram of a microprocessor using a TFT of the present invention.

FIG. 32 illustrates, as an example, a block diagram of a microprocessor formed using the TFTs of the present example.

This microprocessor 3200 is typically composed of a CPU core 3201, a flash memory (or RAM) 3204, a clock controller 3203, a cache memory 3202, a cache controller 3205, a serial interface 3206, an I/O port 3207 and so on. Of course, the microprocessor illustrated in FIG. 32 is a simplified microprocessor example. Actual microprocessors are designed into various circuit-forms.

The present example may freely be combined with Examples 1 to 12.

As described above, in the present invention, its first electrode does not overlap with impurity regions functioning as source and drain regions, whereby the off-state current of the TFT can be suppressed. The first electrode overlaps with all impurity regions except the impurity regions functioning as the source and drain regions, whereby the off-state current can be suppressed.

Instead of the first electrode, the second electrode may be overlapped with all the impurities except the impurity regions functioning as the source and drain regions. The first electrode and the second electrode may be overlapped with all the impurities except the impurity regions functioning as the source and drain regions, whereby the off-state can be suppressed.

In the present invention, its semiconductor film has plural channel-formed regions, whereby the off-state current can be more suppressed.

What is claimed is:

1. A semiconductor device comprising:

a first interconnection;

a second interconnection; and a thin film transistor comprising a first electrode, a first insulating film in contact with the first electrode, a semiconductor film in contact with the first insulating film, a second insulating film in contact with the semiconductor film, and plural second electrodes in contact with the second insulating film, wherein the semiconductor film comprises plural channel-formed regions and at least first, second, and third impurity regions, the first impurity region is connected to the first interconnection, the second impurity region is connected to the second interconnection, and the third impurity region is placed between two of the channel-formed regions, the first electrode overlaps with all the third impurity region and all the channel-formed regions and does not overlap with the first and second impurity regions, the second electrodes are electrically connected to each other; and each of the second electrodes overlaps with each of the channel-formed regions.

2. A device according to claim 1, wherein the dielectric constant of the first insulating film is substantially equal to that of the second insulating film, and the film thickness of the first insulating film in an area where it overlaps with the first electrode is substantially equal to that of the second insulating film in an area where it overlaps with the second electrodes.

3. A device according to claim 1, wherein the first insulating film is flattened by chemical-mechanical polishing.

4. A device according to claim 1, wherein irregularities on a surface of the first insulating film has an elevation difference of 5 nm or less.

5. A device according to claim 1, wherein irregularities on a surface of the first insulating film has an elevation difference of 1 nm or less.

6. A device according to claim 1, wherein when the film thickness of the first insulating film in an area where the channel-formed regions overlap with the first electrode is represented by d1 and the film thickness of the second insulating film in an area where the channel-formed regions overlap with the second electrodes is represented by d2, the film thicknesses d1 and d2 satisfy the following:

$$|d1-d2|/d1 \leq 0.1 \text{ and } |d1-d2|/d2 \leq 0.1$$

7. A device according to claim 1, wherein when the film thickness of the first insulating film in an area where the channel-formed regions overlap with the first electrode is represented by d1 and the film thickness of the second insulating film in an area where the channel-formed regions overlap with the second electrodes is represented by d2, the film thicknesses d1 and d2 satisfy the following:

$$|d1-d2|/d1 \leq 0.05 \text{ and } |d1-d2|/d2 \leq 0.05.$$

8. A device according to claim 1, wherein the semiconductor device is a microprocessor.

9. A device according to claim 1, wherein the semiconductor device is incorporated into an electronic apparatus.

10. A device according to claim 1, wherein the semiconductor device is incorporated into one selected from the group consisting of a display device, a digital still camera, a notebook-type personal computer, a mobile computer, an image reproducing device, a goggle-type display, a video camera and a portable telephone.

11. A semiconductor device comprising:

a first interconnection;

a second interconnection;

a thin film transistor comprising a first electrode, a first insulating film in contact with the first electrode, a semiconductor film in contact with the first insulating film, a second insulating film in contact with the semiconductor film, and plural second electrodes in contact with the second insulating film, wherein the semiconductor film comprises plural channel-formed regions, plural first impurity regions each in contact with a corresponding one of the channel-formed regions, and plural second impurity regions each in contact with a corresponding one of the first impurity regions;

one of two second impurity regions out of the second impurity regions is connected to the first interconnection and the other is connected to the second interconnection;

the first electrode overlaps with all the second impurity regions except the two second impurity regions, with all the channel-formed regions, and with all the first impurity regions except two first impurity regions which are in contact with the two second impurity regions, respectively;

the second electrodes are electrically connected to each other; and each of the second electrodes overlaps with a corresponding one of the channel-formed regions.

12. A device according to claim 11, wherein the first impurity regions have a lower impurity concentration than the second impurity regions.

13. A device according to claim 11, wherein the dielectric constant of the first insulating film is substantially equal to that of the second insulating film, and the film thickness of the first insulating film in an area where it overlaps with the first electrode is substantially equal to that of the second insulating film in an area where it overlaps with the second electrodes.

14. A device according to claim 11,
wherein the first insulating film is flattened by chemical-mechanical polishing.

15. A device according to claim 11, wherein irregularities on a surface of the first insulating film has an elevation difference of 5 nm or less.

16. A device according to claim 11, wherein irregularities on a surface of the first insulating film has an elevation difference of 1 nm or less.

17. A device according to claim 11, wherein when the film thickness of the first insulating film in an area where the channel-formed regions overlap with the first electrode is represented by d1 and the film thickness of the second insulating film in an area where the channel-formed regions overlap with the second electrodes is represented by d2, the film thicknesses d1 and d2 satisfy the following:

$|d1-d2|/d1 \leq 0.1$ and $|d1-d2|/d2 \leq 0.1$

18. A device according to claim 11, wherein when the film thickness of the first insulating film in an area where the channel-formed regions overlap with the first electrode is represented by d1 and the film thickness of the second insulating film in an area where the channel-formed regions overlap with the second electrodes is represented by d2, the film thicknesses d1 and d2 satisfy the following:

$|d1-d2|/d1 \leq 0.05$ and $|d1-d2|/d2 \leq 0.05$.

19. A device according to claim 11, wherein the semiconductor device is a microprocessor.

20. A device according to claim 11, wherein the semiconductor device is incorporated into an electronic apparatus.

21. A device according to claim 11, wherein the semiconductor device is incorporated into one selected from the group consisting of a display device, a digital still camera, a notebook-type personal computer, a mobile computer, an image reproducing device, a goggle-type display, a video camera and a portable telephone.

22. A semiconductor device comprising:
a first interconnection;
a second interconnection; and
a thin film transistor comprising a first electrode, a first insulating film in contact with the first electrode, a semiconductor film in contact with the first insulating film, a second insulating film in contact with the semiconductor film, and second electrodes in contact with the second insulating film,
wherein the semiconductor film comprises plural channel-formed regions and at least first, second, and third impurity regions;
the first impurity region is connected to the first interconnection, the second impurity region is connected to the second interconnection, and the third impurity region is placed between two of the channel-formed regions;
the first electrode overlaps with all the third impurity region and all the channel-formed regions and does not overlay with the first and second impurity regions;
the second electrodes are electrically connected to each other;
each of the second electrodes overlaps with a corresponding one of the channel-formed regions; and
the first electrode is electrically connected to the second electrodes.

23. A device according to claim 22,
wherein the dielectric constant of the first insulating film is substantially equal to that of the second insulating film, and the film thickness of the first insulating film in an area where it overlaps with the first electrode is substantially equal to that of the second insulating film in an area where it overlaps with the second electrodes.

24. A device according to claim 22,
wherein the first insulating film is flattened by chemical-mechanical polishing.

25. A device according to claim 22, wherein irregularities on a surface of the first insulating film has an elevation difference of 5 nm or less.

26. A device according to claim 22, wherein irregularities on a surface of the first insulating film has an elevation difference of 1 nm or less.

27. A device according to claim 22, wherein when the film thickness of the first insulating film in an area where the channel-formed regions overlap with the first electrode is represented by d1 and the film thickness of the second insulating film in an area where the channel-formed regions overlap with the second electrodes is represented by d2, the film thicknesses d1 and d2 satisfy the following:

$|d1-d2|/d1 \leq 0.1$ and $|d1-d2|/d2 \leq 0.1$

28. A device according to claim 22, wherein when the film thickness of the first insulating film in an area where the channel-formed regions overlap with the first electrode is represented by d1 and the film thickness of the second insulating film in an area where the channel-formed regions overlap with the second electrodes is represented by d2, the film thicknesses d1 and d2 satisfy the following:

$|d1-d2|/d1 \leq 0.05$ and $|d1-d2|/d2 \leq 0.05$.

29. A device according to claim 22, wherein the semiconductor device is a microprocessor.

30. A device according to claim 22, wherein the semiconductor device is incorporated into an electronic apparatus.

31. A device according to claim 22, wherein the semiconductor device is incorporated into one selected from the group consisting of a display device, a digital still camera, a notebook-type personal computer, a mobile computer, an image reproducing device, a goggle-type display, a video camera and a portable telephone.

32. A semiconductor device comprising:
a first interconnection;
a second interconnection; and
a thin film transistor comprising a first electrode, a first insulating film in contact with the first electrode, a semiconductor film in contact with the first insulating film, a second insulating film in contact with the semiconductor film, and plural second electrodes in contact with the second insulating film; and
wherein the semiconductor film comprises plural channel-formed regions, plural first impurity regions each in contact with a corresponding one of the channel-formed regions, and plural second impurity regions each in contact with a corresponding one of the first impurity regions;
one of two second impurity regions out of the plural second impurity regions is connected to the first interconnection and the other is connected to the second interconnection;
the first electrode overlaps with all the second impurity regions except the two second impurity regions, with all the channel-formed regions, and with all the first impurity regions except two first impurity regions which are in contact with the two second impurity regions;
the second electrodes are electrically connected to each other;

each of the second electrodes overlaps with a corresponding one of the channel-formed regions; and the first electrode is electrically connected to the second electrodes.

33. A device according to claim 32, wherein the first impurity regions have a lower impurity concentration than the second impurity regions.

34. A device according to claim 32, wherein the dielectric constant of the first insulating film is substantially equal to that of the second insulating film, and the film thickness of the first insulating film in an area where it overlaps with the first electrode is substantially equal to that of the second insulating film in an area where it overlaps with the second electrodes.

35. A device according to claim 32, wherein the first insulating film is flattened by chemical-mechanical polishing.

36. A device according to claim 32, wherein irregularities on a surface of the first insulating film has an elevation difference of 5 nm or less.

37. A device according to claim 32, wherein irregularities on a surface of the first insulating film has an elevation difference of 1 nm or less.

38. A device according to claim 32, wherein when the film thickness of the first insulating film in an area where the channel-formed regions overlap with the first electrode is represented by d1 and the film thickness of the second insulating film in an area where the channel-formed regions overlap with the second electrodes is represented by d2, the film thicknesses d1 and d2 satisfy the following:

$|d1-d2|/d1 \leq 0.1$ and $|d1-d2|/d2 \leq 0.1$

39. A device according to claim 32, wherein when the film thickness of the first insulating film in an area where the channel-formed regions overlap with the first electrode is represented by d1 and the film thickness of the second insulating film in an area where the channel-formed regions overlap with the second electrodes is represented by d2, the film thicknesses d1 and d2 satisfy the following:

$|d1-d2|/d1 \leq 0.05$ and $|d1-d2|/d2 \leq 0.05$.

40. A device according to claim 32, wherein the semiconductor device is a microprocessor.

41. A device according to claim 32, wherein the semiconductor device is incorporated into an electronic apparatus.

42. A device according to claim 32, wherein the semiconductor device is incorporated into one selected from the group consisting of a display device, a digital still camera, a notebook-type personal computer, a mobile computer, an image reproducing device, a goggle-type display, a video camera and a portable telephone.

43. A semiconductor device comprising:

plural pixels;

a first interconnection;

a second interconnection; and a thin film transistor comprising a first electrode, a first insulating film in contact with the first electrode, a semiconductor film in contact with the first insulating film, a second insulating film in contact with the semiconductor film, and plural second electrodes in contact with the second insulating film, wherein each of said pixels contains said first interconnection and said second interconnection and said thin film transistor, the semiconductor film comprises plural channel-formed regions and at least first, second, and third impurity regions;

the first impurity region is connected to the first interconnection, the second impurity region is connected to the second interconnection, and the third impurity region is placed between two of the channel-formed regions;

the first electrode overlaps with all the third impurity region and all the channel-formed regions and does not overlap with the first and second impurity regions;

the second electrodes are electrically connected to each other, and each of the second electrodes overlaps with a corresponding one of the channel-formed regions.

44. A device according to claim 43, wherein the dielectric constant of the first insulating film is substantially equal to that of the second insulating film, and the film thickness of the first insulating film in an area where it overlaps with the first electrode is substantially equal to that of the second insulating film in an area where it overlaps with the second electrodes.

45. A device according to claim 43, wherein the first insulating film is flattened by chemical-mechanical polishing.

46. A device according to claim 43, wherein irregularities on a surface of the first insulating film has an elevation difference of 5 nm or less.

47. A device according to claim 43, wherein irregularities on a surface of the first insulating film has an elevation difference of 1 nm or less.

48. A device according to claim 43, wherein when the film thickness of the first insulating film in an area where the channel-formed regions overlap with the first electrode is represented by d1 and the film thickness of the second insulating film in an area where the channel-formed regions overlap with the second electrodes is represented by d2, the film thicknesses d1 and d2 satisfy the following:

$|d1-d2|/d1 \leq 0.1$ and $|d1-d2|/d2 \leq 0.1$

49. A device according to claim 43, wherein when the film thickness of the first insulating film in an area where the channel-formed regions overlap with the first electrode is represented by d1 and the film thickness of the second insulating film in an area where the channel-formed regions overlap with the second electrodes is represented by d2, the film thicknesses d1 and d2 satisfy the following:

$|d1-d2|/d1 \leq 0.05$ and $|d1-d2|/d2 \leq 0.05$.

50. A device according to claim 43, wherein the semiconductor device is a microprocessor.

51. A device according to claim 43, wherein the semiconductor device is incorporated into an electronic apparatus.

52. A device according to claim 43, wherein the semiconductor device is incorporated into one selected from the group consisting of a display device, a digital still camera, a notebook-type personal computer, a mobile computer, an image reproducing device, a goggle-type display, a video camera and a portable telephone.

* * * * *